(12) United States Patent
Ohuchi et al.

(10) Patent No.: US 10,700,292 B2
(45) Date of Patent: Jun. 30, 2020

(54) METAL COMPLEX AND LIGHT EMITTING DEVICE USING THE SAME

(71) Applicant: Sumitomo Chemical Company, Limited, Tokyo (JP)

(72) Inventors: Kazuei Ohuchi, Tsukuba (JP); Kohei Asada, Tsukuba (JP); Shigeya Kobayashi, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 208 days.

(21) Appl. No.: 15/125,247

(22) PCT Filed: Mar. 9, 2015

(86) PCT No.: PCT/JP2015/057603
§ 371 (c)(1),
(2) Date: Sep. 12, 2016

(87) PCT Pub. No.: WO2015/141603
PCT Pub. Date: Sep. 24, 2015

(65) Prior Publication Data
US 2017/0077424 A1 Mar. 16, 2017

(30) Foreign Application Priority Data

Mar. 17, 2014 (JP) ................................. 2014-053075

(51) Int. Cl.
*H01L 51/00* (2006.01)
*C09K 11/06* (2006.01)
(Continued)

(52) U.S. Cl.
CPC ...... *H01L 51/0085* (2013.01); *C07F 15/0033* (2013.01); *C09K 11/025* (2013.01);
(Continued)

(58) Field of Classification Search
None
See application file for complete search history.

(56) References Cited

U.S. PATENT DOCUMENTS

| 2008/0100199 A1 | 5/2008 | Sekine et al. |
| 2009/0243479 A1 | 10/2009 | Tanaka et al. |

(Continued)

FOREIGN PATENT DOCUMENTS

| CN | 101111531 A | 1/2008 |
| JP | 2006188673 A | 7/2006 |

(Continued)

OTHER PUBLICATIONS

Office Action dated Jan. 19, 2018 in CN Application No. 201580013797.1.
(Continued)

*Primary Examiner* — Jay Yang
(74) *Attorney, Agent, or Firm* — Panitch Schwarze Belisario & Nadel LLP

(57) ABSTRACT

A metal complex is represented by the formula (1):

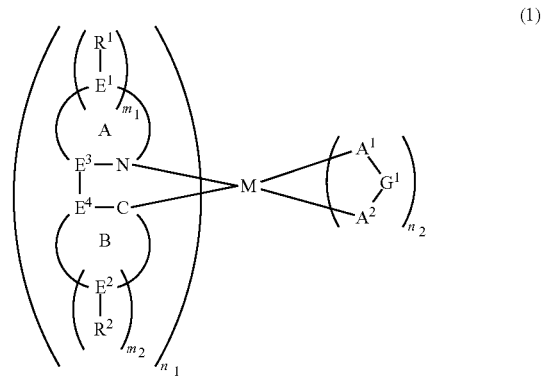

In formula (1), M represents Ir or Pt, $n_1$ represents 1 to 3, $n_2$ represents 0 to 2, $A^1$-$G^1$-$A^2$ represents an anionic bidentate ligand, $m_1$ and $m_2$ represent 3 or 4, $E^1$ to $E^4$ represent a nitrogen atom or a carbon atom, $R^1$ and $R^2$ represent a substituent, $R^1$ and/or $R^2$ is represented by formula (2-1) or formula (2-2), Ring A represents an aromatic heterocyclic ring, Ring B represents an aromatic hydrocarbon ring or an aromatic heterocyclic ring, and $R^3$, $R^{3a}$, $R^{4a}$, $R^5$ and $R^6$ represent a substituent:

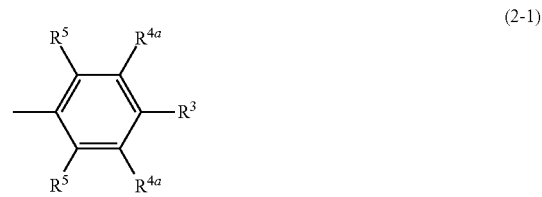

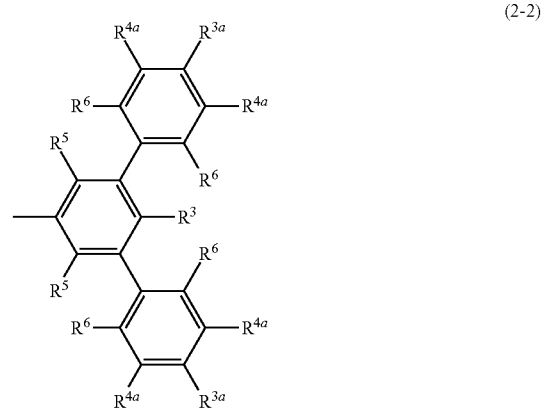

6 Claims, No Drawings

(51) Int. Cl.
  *C07F 15/00* (2006.01)
  *C09K 11/02* (2006.01)
  *H01L 51/50* (2006.01)
  *H01L 51/56* (2006.01)

(52) U.S. Cl.
  CPC .......... *C09K 11/06* (2013.01); *H01L 51/0039* (2013.01); *H01L 51/0043* (2013.01); *C09K 2211/1007* (2013.01); *C09K 2211/1029* (2013.01); *C09K 2211/1044* (2013.01); *C09K 2211/1059* (2013.01); *C09K 2211/185* (2013.01); *H01L 51/006* (2013.01); *H01L 51/0052* (2013.01); *H01L 51/0058* (2013.01); *H01L 51/0067* (2013.01); *H01L 51/5016* (2013.01); *H01L 51/5056* (2013.01); *H01L 51/56* (2013.01)

(56) References Cited

U.S. PATENT DOCUMENTS

| | | | |
|---|---|---|---|
| 2011/0057559 A1 | 3/2011 | Xia et al. | |
| 2012/0205585 A1 | 8/2012 | Okamura et al. | |
| 2013/0193840 A1* | 8/2013 | Soga et al. ............. | C09K 11/06 313/504 |
| 2014/0175415 A1 | 6/2014 | Steudel et al. | |
| 2014/0374727 A1 | 12/2014 | Akino et al. | |
| 2015/0014669 A1 | 1/2015 | Akino et al. | |
| 2015/0053949 A1 | 2/2015 | Inoue et al. | |

FOREIGN PATENT DOCUMENTS

| | | | |
|---|---|---|---|
| JP | 2011105701 A | 6/2011 | |
| JP | 2012036388 A | 2/2012 | |
| JP | 2013048147 A | 3/2013 | |
| JP | 2013147449 A | 8/2013 | |
| JP | 2013147450 A | 8/2013 | |
| JP | 2013147551 A | 8/2013 | |
| JP | 2013235994 A | 11/2013 | |
| JP | 2014-148663 A | 8/2014 | |
| JP | 2014224101 A | 12/2014 | |
| WO | 02066552 A1 | 8/2002 | |
| WO | 2008090795 A1 | 7/2008 | |
| WO | 2013129183 A1 | 9/2013 | |

OTHER PUBLICATIONS

Int'l Extended European Search Report dated Sep. 25, 2017 in EP Application No. 15765141.5.
Int'l Search Report dated Jun. 2, 2015 in Int'l Application No. PCT/JP2015/057603.
Int'l Preliminary Report on Patentability dated Sep. 20, 2016 in Int'l Application No. PCT/JP2015/057603.
Office Action dated Jun. 1, 2018 in CN Application No. 201580013797.1.
Notification of Reasons for Refusal dated Feb. 4, 2019 in JP Application No. 2016-508706 (Machine Translation).
Lo et al, "High-Triplet-Energy Dendrons: Enhancing the Luminescence of Deep Blue Phosphorescent Iridium (III) Complexes," Journal of American Chemical Society, vol. 131, pp. 16681-16688, 2009.
Feng et al, "Cu(II)-Promoted Palladium-Catalyzed C—H Ortho-Arylation of N,N-Dimethylbenzylamines," The Journal of Organic Chemistry, vol. 78, pp. 3688-3696, 2013.
Lazareva et al, "Direct Palladium-Catalyzed Ortho-Arylation of Benzylamines," Organic Letters, vol. 8 No. 23, pp. 5211-5213, 2006.

* cited by examiner

METAL COMPLEX AND LIGHT EMITTING DEVICE USING THE SAME

CROSS-REFERENCE TO RELATED APPLICATION

This application is a Section 371 of International Application No. PCT/JP2015/057603, filed Mar. 9, 2015, which was published in the Japanese language on Sep. 24, 2015, under International Publication No. WO 2015/141603 A1, and the disclosure of which is incorporated herein by reference.

TECHNICAL FIELD

The present invention relates to a metal complex, a composition comprising the metal complex and a light emitting device comprising the metal complex. Further, the present invention relates to production of the metal complex.

BACKGROUND ART

As the light emitting material used in a light emitting layer of a light emitting device, phosphorescent compounds showing light emission from the triplet excited state are variously investigated. As the phosphorescent compound, a lot of metal complexes in which the central metal is a transition metal belonging to Group 5 or Group 6 are under investigation. For example, Patent document 1 discloses a metal complex represented by the following formula.

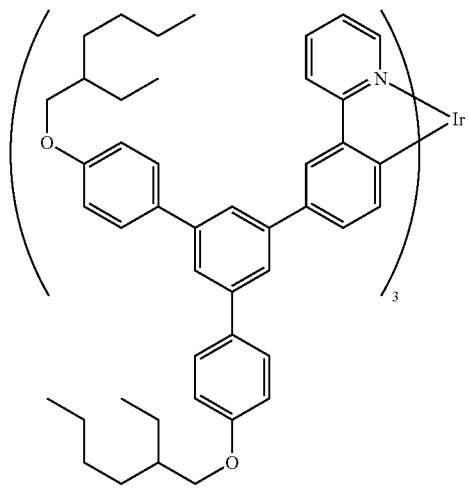

PRIOR ART DOCUMENT

Patent Document

Patent document 1: International Publication WO2002/066552

SUMMARY OF THE INVENTION

Problems to be Solved by the Invention

However, A light emitting device produced by using the above-described metal complex had a problem of high driving voltage.

Then, the present invention has an object of providing a metal complex which is useful for production of a light emitting device excellent in driving voltage. Further, the present invention has an object of providing a composition comprising the metal complex and a light emitting device produced by using the metal complex.

Means for Solving the Problems

In a first aspect, the present invention provides a metal complex represented by the following formula (1):

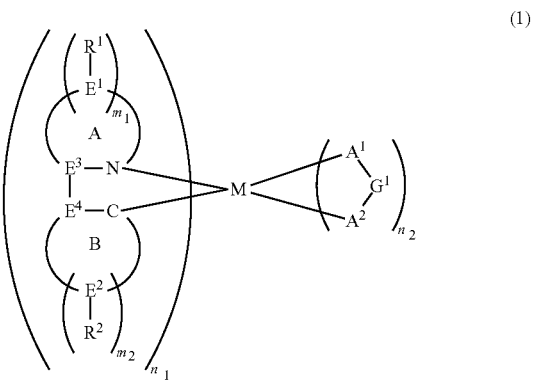

(1)

[in the formula (1),

M represents an iridium atom or a platinum atom.

$n_1$ represents 1, 2 or 3. $n_2$ represents 0, 1 or 2. $n_1+n_2=3$ when M is an iridium atom, while $n_1+n_2=2$ when M is a platinum atom.

$A^1$-$G^1$-$A^1$ represents an anionic bidentate ligand, and $G^1$ represents an atomic group constituting a bidentate ligand together with $A^1$ and $A^2$. $A^1$ and $A^2$ each independently represent a carbon atom, an oxygen atom or a nitrogen atom, and these atoms each may be an atom constituting a ring. When a plurality of $A^1$-$G^1$-$A^2$ are present, they may be the same or different.

$m_1$ and $m_2$ each independently represent 3 or 4.

$E^1$, $E^2$, $E^3$ and $E^4$ each independently represent a nitrogen atom or a carbon atom. The plurality of $E^1$ and $E^2$ each may be the same or different, and when a plurality of $E^3$ and $E^4$ are present, they may be the same or different at each occurrence. $R^1$ may be either present or not present when $E^1$ is a nitrogen atom. $R^2$ may be either present or not present when $E^2$ is a nitrogen atom. At least one of $E^3$ and $E^4$ is a carbon atom.

$R^1$ and $R^2$ each independently represent a hydrogen atom, an alkyl group, a cycloalkyl group, an alkoxyl group, a cycloalkoxy group, an aryl group, an aryloxy group, a monovalent heterocyclic group or a halogen atom, and these groups each optionally have a substituent. The plurality of $R^1$ and $R^2$ each may be the same or different. Adjacent $R^1$s may be combined together to form a ring together with $E^1$'s to which they are attached. Adjacent $R^2$s may be combined together to form a ring together with $E^2$s to which they are attached. $R^1$ attached to $E^1$ adjacent to $E^3$ and $R^2$ attached to $E^2$ adjacent to $E^4$ may be combined to form a ring together with $E^1$ to which $R^1$ is attached and $E^2$ to which $R^2$ is attached.

At least one of the plurality of $R^1$ and $R^2$ is a group represented by the following formula (2-1) or a group represented by the following formula (2-2).

Ring A represents a 5-membered or 6-membered aromatic heterocyclic ring constituted of a nitrogen atom, $E^1$ and $m_1$ atoms $E^1$. $E^3$ is a carbon atom when Ring A is a 6-membered aromatic heterocyclic ring.

Ring B represents a 5-membered or 6-membered aromatic hydrocarbon ring or a 5-membered or 6-membered aromatic heterocyclic ring constituted of a carbon atom, $E^4$ and $m_2$ atoms $E^2$. $E^4$ is a carbon atom when Ring B is a 6-membered aromatic heterocyclic ring.)

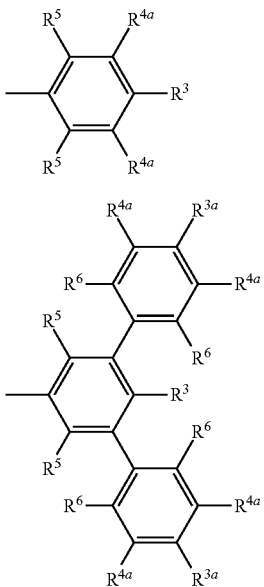

(2-1)

(2-2)

[in the formulae (2-1) and (2-2), $R^3$ represents an alkyl group, and this group optionally has a substituent.

$R^5$ represents a hydrogen atom, an alkyl group, a cycloalkyl group, an aryl group or a monovalent heterocyclic group, and these groups each optionally have a substituent. The plurality of $R^5$ may be the same or different.

$R^{3a}$ represents a hydrogen atom, an alkyl group or a cycloalkyl group, and these groups each optionally have a substituent. The plurality of $R^{3a}$ may be the same or different.

$R^{4a}$ represents an aryl group having no substituent or an aryl group having an alkyl group or a cycloalkyl group as a substituent, and the alkyl group and the cycloalkyl group each optionally further have a substituent. The plurality of $R^{4a}$ may be the same or different.

$R^6$ represents a hydrogen atom, an alkyl group or a cycloalkyl group, and these groups each optionally have a substituent. The plurality of $R^6$ may be the same or different.].

In a second aspect, the present invention provides a composition comprising the above-described metal complex.

In a third aspect, the present invention provides a light emitting device produced by using the above-described metal complex.

In production of the above-described metal complex, for example, a compound represented by the following formula (3) is used.

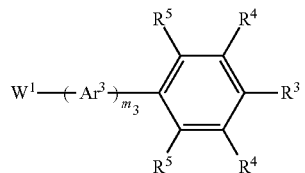

(3)

[in the formula (3), $R^3$ and $R^1$ represent the same meaning as described above.

$m^3$ represents an integer of 0 to 5.

$Ar^3$ represents an arylene group or a divalent heterocyclic ring group, and these groups each optionally have a substituent. When a plurality of $Ar^3$ are present, they may be the same or different.

$R^4$ represents a hydrogen atom, an alkyl group, a cycloalkyl group, an aryl group or a monovalent heterocyclic group, and these groups each optionally have a substituent. The plurality of $R^4$ may be the same or different, and at least one $R^4$ represents an aryl group having no substituent, an aryl group having an alkyl group or a cycloalkyl group as a substituent, or a monovalent heterocyclic group, and the alkyl group and the cycloalkyl group each optionally further have a substituent.

$W^1$ represents a group represented by $-B(OR^{W1})_2$ ($R^{W1}$ represents a hydrogen atom, an alkyl group, a cycloalkyl group, an aryl group or an amino group, and these groups each optionally have a substituent. The plurality of $R^{W1}$ may be the same or different and may be combined together to form a cyclic structure together with the oxygen atoms to which they are attached.), an alkylsulfonyloxy group, an arylsulfonyloxy group, a chlorine atom, a bromine atom or an iodine atom, and these groups each optionally have a substituent.].

The compound represented by the formula (3) is preferably a compound represented by the following formula (8-1) or a compound represented by the following formula (8-2), because the metal complex of the present invention produced by using the compound is excellent in solubility in a solvent and film formability.

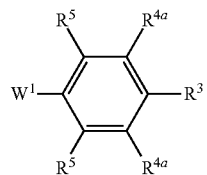

(8-1)

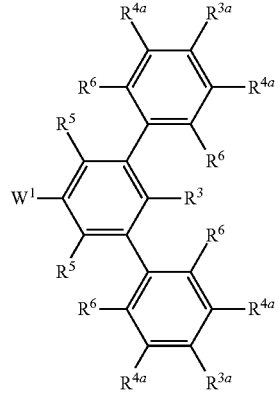

(8-2)

[in the formulae (8-1) and (8-2), $R^3$, $R^{3a}$, $R^{4a}$, $R^5$, $R^6$ and $W^1$ represent the same meaning as described above.].

Effect of the Invention

The present invention can provide a metal complex which is useful for production of a light emitting device excellent in driving voltage. Further, the present invention can provide a composition comprising the metal complex and a light emitting device produced by using the metal complex.

MODES FOR CARRYING OUT THE INVENTION

Suitable embodiments of the present invention will be illustrated in detail below.

EXPLANATION OF COMMON TERM

Terms commonly used in the present specification described below have the following meanings unless otherwise stated.

Me represents a methyl group, Et represents an ethyl group, Bu represents a butyl group, i-Pr represents an isopropyl group, and t-Bu represents a tert-butyl group.

In the present specification, the hydrogen atom may be a light hydrogen atom or a heavy hydrogen atom.

In the present specification, a solid line representing a bond to a central metal in a structural formula representing a metal complex denotes a coordinate bond or a covalent bond.

"Polymer compound" denotes a polymer having molecular weight distribution and having a polystyrene-equivalent number average molecular weight of $1 \times 10^3$ to $1 \times 10^8$. The total amount of constitutional units contained in the polymer compound is 100 mol %.

A polymer compound may be any of a block copolymer, a random copolymer, an alternating copolymer and a graft copolymer, and may also be another embodiment.

An end group of a polymer compound is preferably a stable group because if a polymerization active group remains intact at the end, when the polymer compound is used for fabrication of a light emitting device, the light emitting property or luminance life possibly becomes lower. This end group is preferably a group having a conjugated bond to the main chain, and includes groups bonding to an aryl group or a monovalent heterocyclic group via a carbon-carbon bond.

"Low molecular weight compound" denotes a compound having no molecular weight distribution and having a molecular weight of $1 \times 10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The number of carbon atoms of a cycloalkyl group is, not including the number of carbon atoms of a substituent, usually 3 to 50, preferably 3 to 30, more preferably 4 to 20.

The alkyl group and cycloalkyl group each optionally have a substituent, and examples thereof include a methyl group, an ethyl group, a propyl group, an isopropyl group, a butyl group, an isobutyl group, a tert-butyl group, a pentyl group, an isoamyl group, 2-ethylbutyl group, a hexyl group, a heptyl group, a octyl group, a 2-ethylhexyl group, a 3-propylheptyl group, a decyl group, a 3,7-dimethyloctyl group, a 2-ethyloctyl group, a 2-hexyldecyl group, a dodecyl group and a cyclohexyl group, and groups obtained by substituting a hydrogen atom in these groups with an alkyl group, a cycloalkyl group, an alkoxy group, a cycloalkoxy group, an aryl group, a fluorine atom or the like, and the alkyl group and cycloalkyl group having a substituent include a trifluoromethyl group, a pentafluoroethyl group, a perfluorobutyl group, a perfluorohexyl group, a perfluorooctyl group, a 3-phenylpropyl group, a 3-(4-methylphenyl) propyl group, a 3-(3,5-di-n-hexylphenyl) propyl group, a 6-ethyloxyhexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The number of carbon atoms of a cycloalkoxy group is, not including the number of carbon atoms of a substituent, usually 3 to 40, preferably 4 to 10.

The alkoxy group and cycloalkoxy group each optionally have a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a cyclohexyloxy group, a heptyloxy group, a octyloxy group, a 2-ethylhexyloxy group, a nonyloxy group, a decyloxy group, a 3,7-dimethyloctyloxy group and a lauryloxy group.

The number of carbon atoms of "Aryloxy group" is, not including the number of carbon atoms of a substituent, usually 6 to 60, preferably 7 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidyl group, a quinolyl group, an isoquinolyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of a cycloalkenyl group, not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of a cycloalkynyl group, not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexenyl group, a 5-hexenyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.

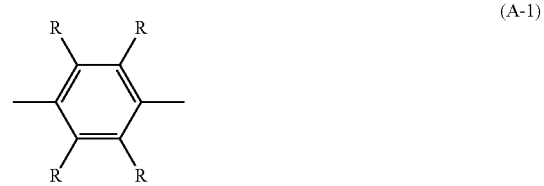

(A-1)

(A-2)

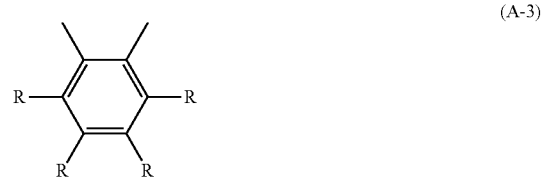

(A-3)

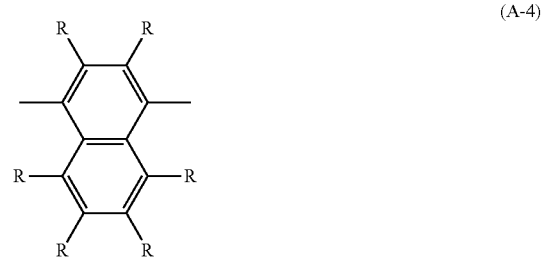

(A-4)

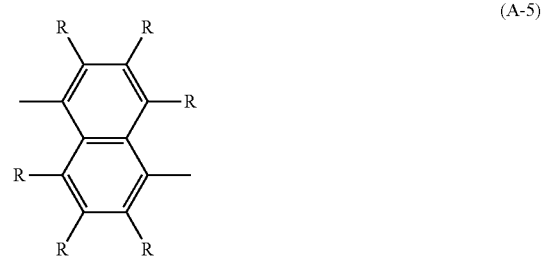

(A-5)

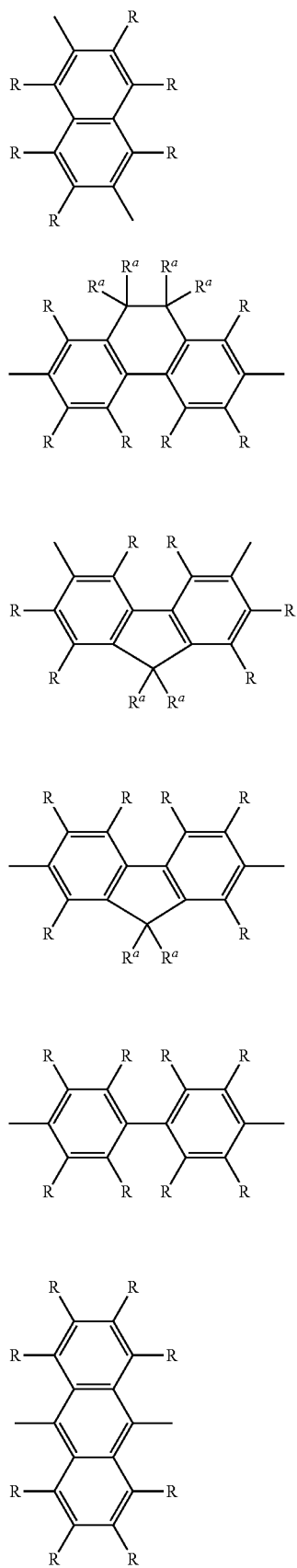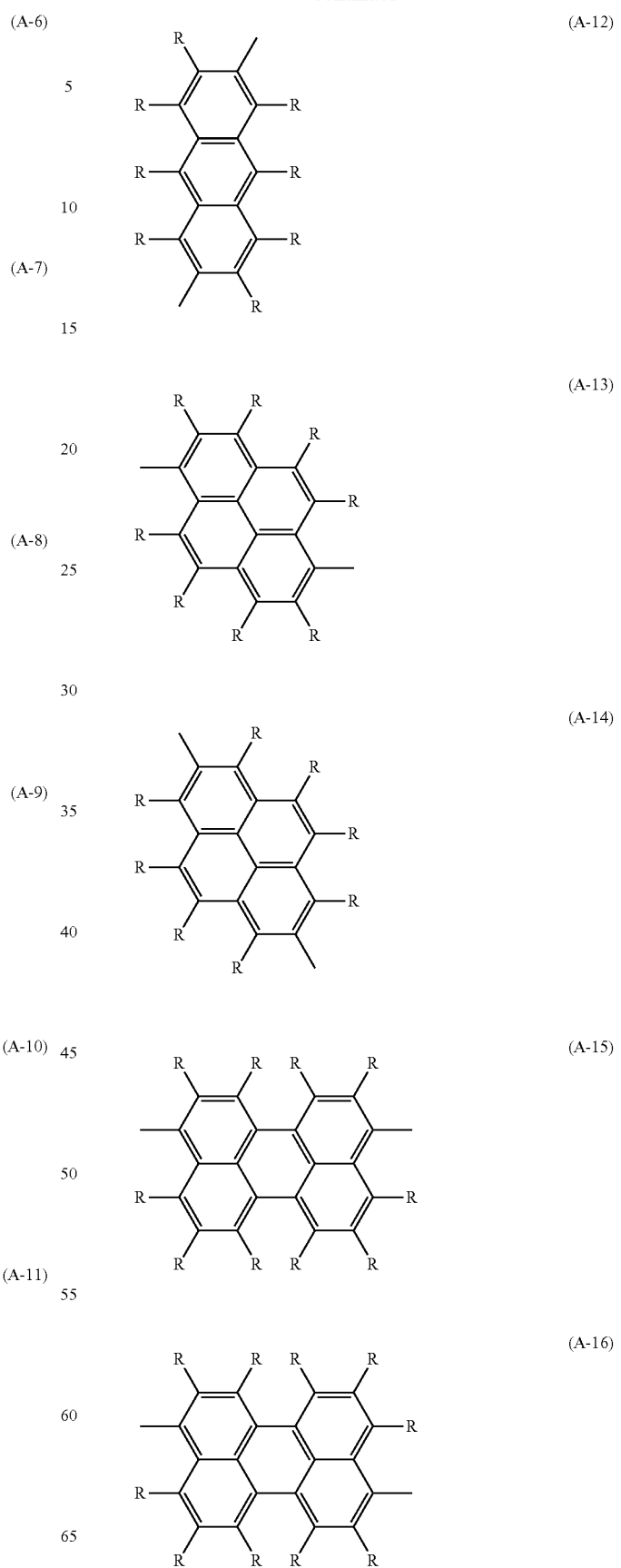

-continued

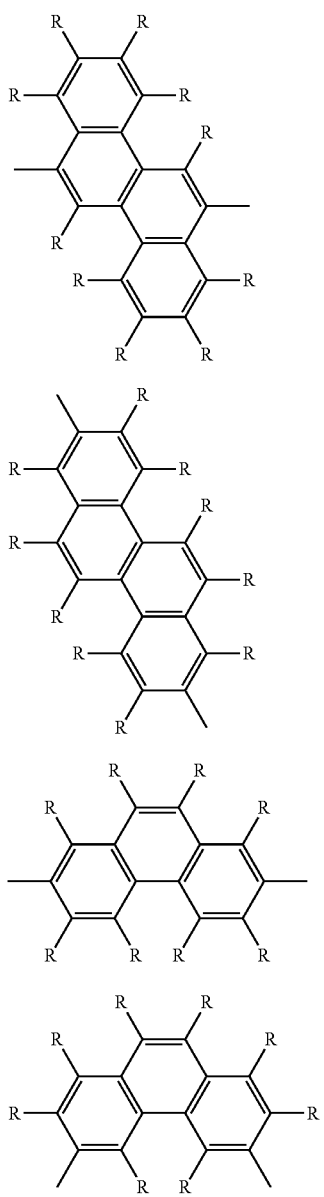

(A-17)

(A-18)

(A-19)

(A-20)

[wherein, R and $R^a$ each independently represent a hydrogen atom, an alkyl group, a cycloalkyl group, an aryl group or a monovalent heterocyclic group. The plurality of R and $R^a$ each may be the same or different, and adjacent $R^a$s may be combined together to form a ring together with the atoms to which they are attached.]

The number of carbon atoms of the divalent heterocyclic group is, not including the number of carbon atoms of a substituent, usually 2 to 60, preferably 3 to 30, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (AA-1) to (AA-34). The divalent heterocyclic group includes groups obtained by linking a plurality of these groups.

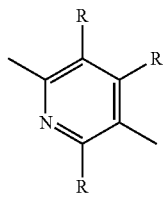

(AA-1)

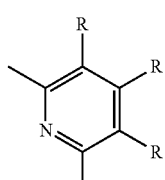

(AA-2)

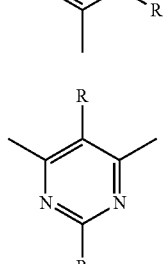

(AA-3)

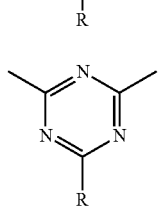

(AA-4)

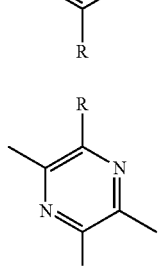

(AA-5)

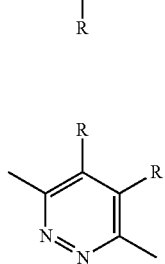

(AA-6)

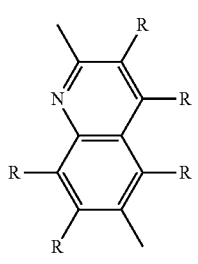

(AA-7)

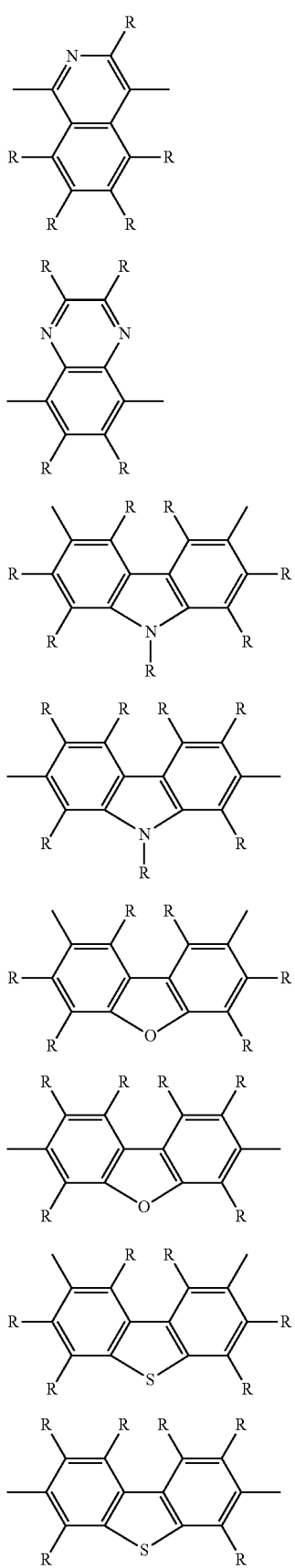
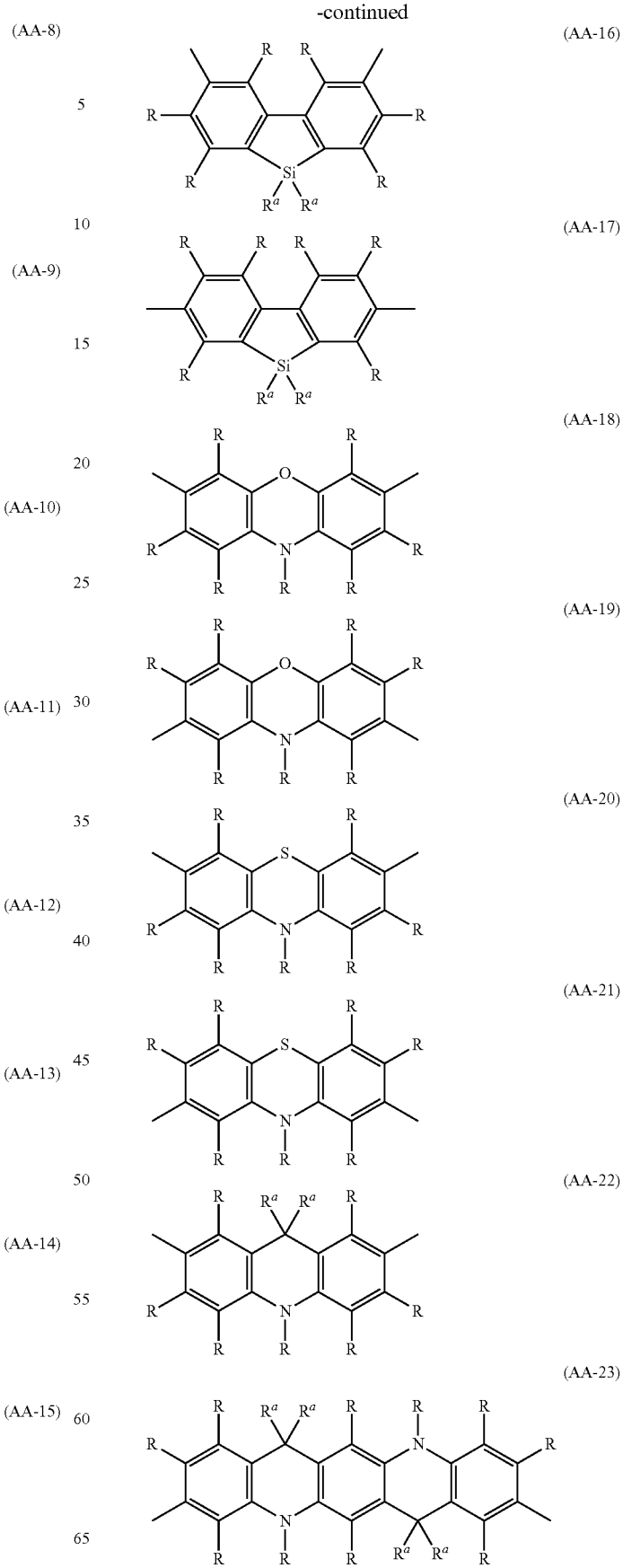

(AA-24)
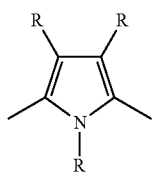
(AA-25)
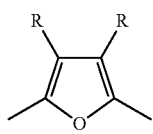
(AA-26)
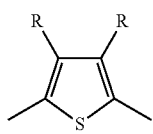
(AA-27)
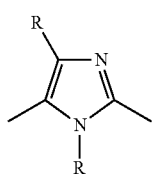
(AA-28)
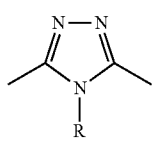
(AA-29)
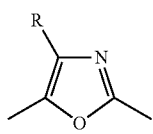
(AA-30)
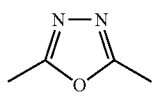
(AA-31)
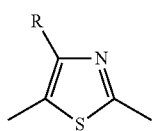
(AA-32)
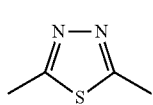
(AA-33)
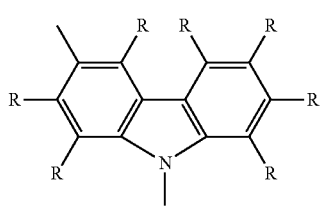
(AA-34)
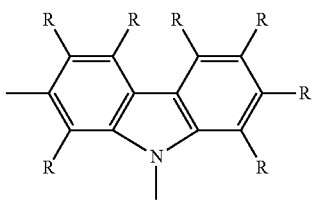
[wherein, R and $R^a$ represent the same meaning as described above.]
"Cross-linkable group" is a group capable of forming a new bond by being subjected to a heating treatment, an ultraviolet irradiation treatment, a radical reaction and the like, and is preferably a group represented by the formula (B-1), (B-2), (B-3), (B-4), (B-5), (B-6), (B-7), (8-8), (B-9), (B-10), (B-11), (B-12), (8-13), (B-14), (B-15), (B-16) or (B-17).
(B-1)
(B-2)
(B-3)
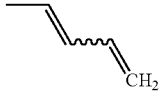
(B-4)
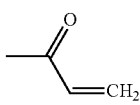
(B-5)
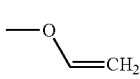
(B-6)
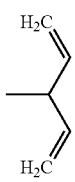
(B-7)
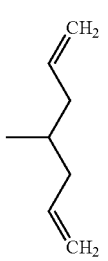

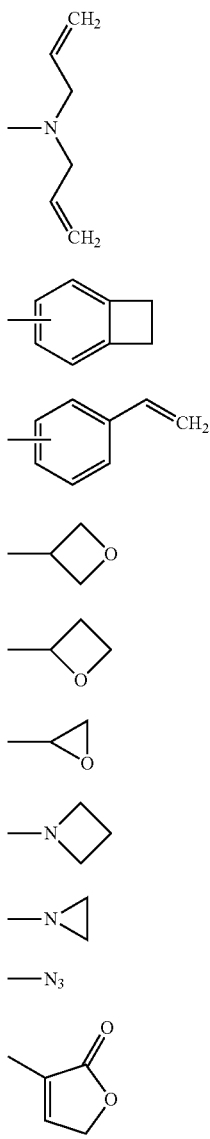

(B-8)
(B-9)
(B-10)
(B-11)
(B-12)
(B-13)
(B-14)
(B-15)
(B-16)
(B-17)

[wherein, these groups each optionally have a substituent.]

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

"Dendron" is a group having a regular dendritic branched structure having a branching point at an atom or ring (a dendrimer structure). A compound having a dendron as a partial structure (called a dendrimer in some cases) includes, for example, structures described in literatures such as International Publication WO 02/067343, JP-A No. 2003-231692, International Publication WO 2003/079736, and International Publication WO 2006/097717. The group represented by the formula (2-1) or (2-2) is a dendron.

The dendron is preferably a group represented by the formula (D-A) or (D-B).

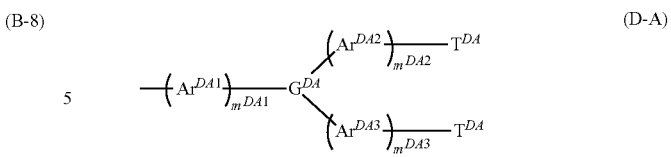

(D-A)

[Wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and these groups each optionally have a substituent.

$Ar^{DA1}$, $Ar^{DA2}$ and $Ar^{DA3}$ each independently represent an arylene group or a divalent heterocyclic group, and these groups each optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and these groups each optionally have a substituent. The plurality of $T^{DA}$ may be the same or different.]

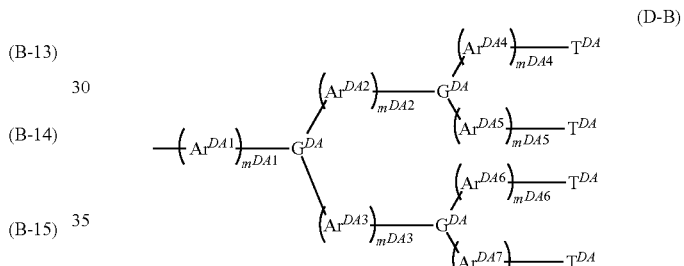

(D-B)

[Wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a heterocyclic group, and these groups each optionally have a substituent. The plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and these groups each optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ represents an aryl group or a monovalent heterocyclic group, and these groups each optionally have a substituent. The plurality of $T^{DA}$ may be the same or different.]

$m^{DA1}$, $m^{DA2}$, $m^{DA3}$, $m^{DA4}$, $m^{DA5}$, $m^{DA6}$ and $m^{DA7}$ are usually an integer of 10 or less, preferably an integer of 5 or less, more preferably 0 or 1, particularly preferably 0. It is preferable that $m^{DA1}$, $m^{DA2}$, $m^{DA3}$, $m^{DA4}$, $m^{DA5}$, $m^{DA6}$ and $m^{DA7}$ are the same integer.

$G^{DA}$ is preferably a group represented by the formula (GDA-11) to (GDA-15), and these groups each optionally have a substituent.

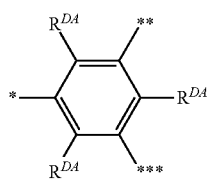
(GDA-11)

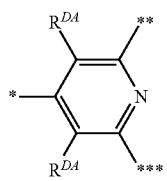
(GDA-12)

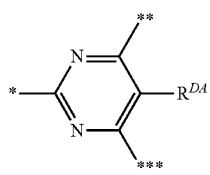
(GDA-13)

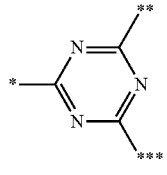
(GDA-14)

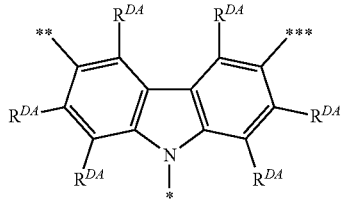
(GDA-15)

[wherein,

* represents a linkage to $Ar^{DA1}$ in the formula (D-A), $Ar^{DA1}$ in the formula (D-B), $Ar^{DA2}$ in the formula (D-B) or $Ar^{DA3}$ in the formula (D-B).

** represents a linkage to $Ar^{DA2}$ in the formula (D-A), $Ar^{DA2}$ in the formula (D-B), $Ar^{DA4}$ in the formula (D-B) or $Ar^{DA6}$ in the formula (D-B).

*** represents a linkage to $Ar^{DA3}$ in the formula (D-A), $Ar^{DA3}$ in the formula (D-B), $Ar^{DA5}$ in the formula (D-B) or $Ar^{DA7}$ in the formula (D-B).

$R^{DA}$ represents a hydrogen atom, an alkyl group, a cycloalkyl group, an alkoxy group, a cycloalkoxy group, an aryl group or a monovalent heterocyclic group, and these groups each optionally have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or cycloalkyl group, and these groups each optionally have a substituent.

It is preferable that $Ar^{DA1}$, $Ar^{DA2}$, $Ar^{DA3}$, $Ar^{DA4}$, $Ar^{DA5}$, $Ar^{DA6}$ and $Ar^{DA7}$ are groups represented by the formulae (ArDA-1) to (ArDA-3).

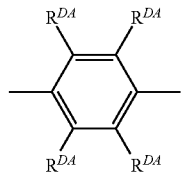
(ArDA-1)

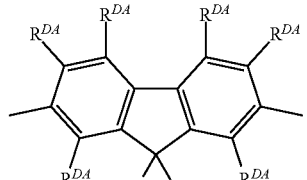
(ArDA-2)

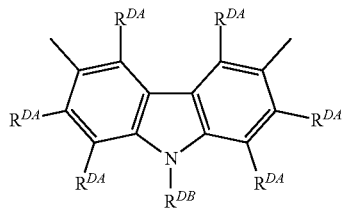
(ArDA-3)

(wherein, $R^{DA}$ represents the same meaning as described above.

$R^{DB}$ represents a hydrogen atom, an alkyl group, a cycloalkyl group, an aryl group or a monovalent heterocyclic group, and these groups each optionally have a substituent. When a plurality of $R^{DB}$ are present, they may be the same or different at each occurrence.]

$R^{DB}$ is preferably an alkyl group, a cycloalkyl group, an aryl group or a monovalent heterocyclic group, more preferably an aryl group or a monovalent heterocyclic group, further preferably an aryl group.

$T^{DA}$ is preferably groups represented by the formulae (TDA-1) to (TDA-3).

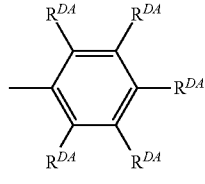
(TDA-1)

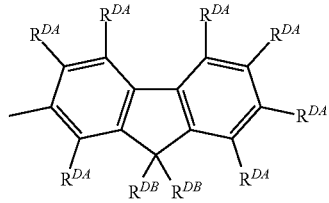
(TDA-2)

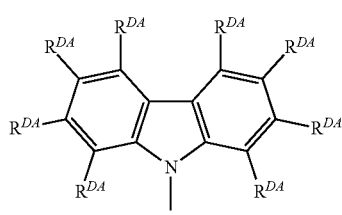
(TDA-3)

[wherein, $R^{DA}$ and $R^{DB}$ represent the same meaning described above.]

The group represented by the formula (D-A) is preferably a group represented by the formula (D-A1) to (D-A3).

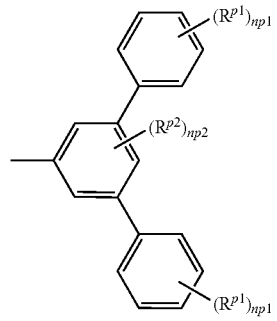
(D-A1)

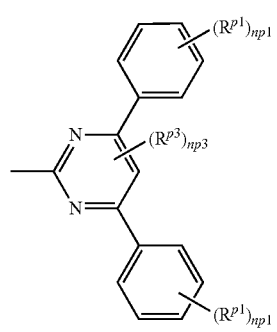
(D-A2)

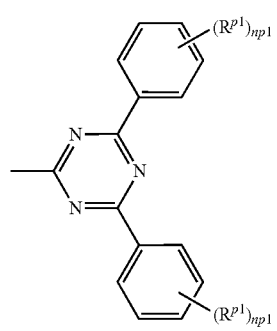
(D-A3)

(wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. The plurality of np1 may be the same or different.)

The group represented by the formula (D-B) is preferably a group represented by the formula (D-B1) to (D-B3).

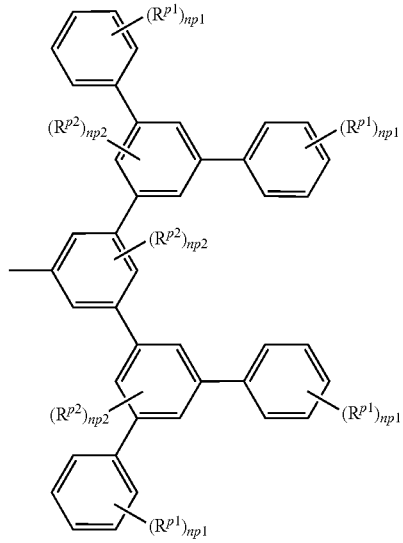
(D-B1)

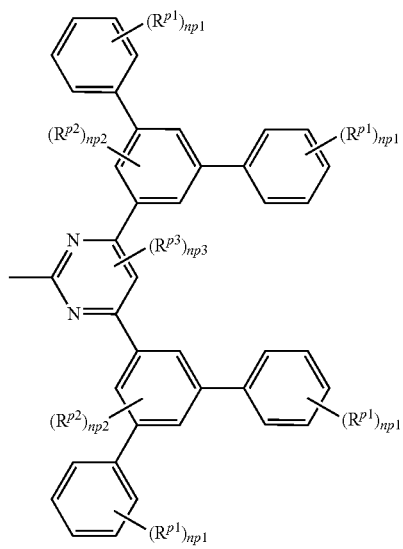
(D-B2)

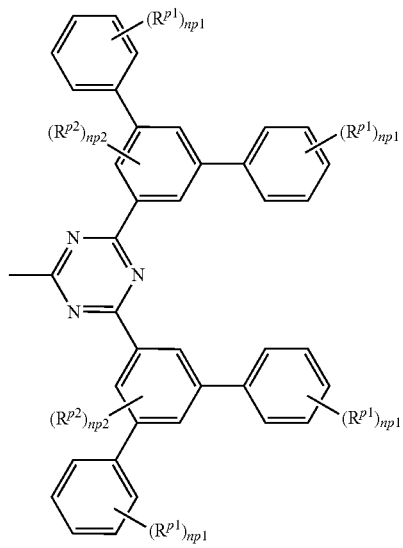
(D-B3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. When a plurality of np1 and np2 are present, they may be the same or different at each occurrence.]

np1 is preferably 0 or 1, more preferably 1. np2 is preferably 0 or 1, more preferably 0. np3 is preferably 0.

$R^{p1}$, $R^{p2}$ and $R^{p3}$ are preferably an alkyl group or a cycloalkyl group.

<Metal Complex>

Next, the metal complex of the present invention will be illustrated. The metal complex of the present invention is a metal complex represented by the formula (1).

At least one of the plurality of $R^1$ and $R^2$ present in the formula (1) is a group represented by the formula (2-1) or the formula (2-2).

In the formula (2-1) and the formula (2-2), $R^3$ is preferably a methyl group, an ethyl group or a propyl group, more preferably a methyl group, because synthesis of the metal complex of the present invention is easy.

In the formula (2-1) and the formula (2-2), $R^5$ is preferably a hydrogen atom, an alkyl group, a cycloalkyl group, an aryl group or a monovalent heterocyclic group, more preferably a hydrogen atom, an alkyl group or a cycloalkyl group, further preferably a hydrogen atom or an alkyl group, particularly preferably a hydrogen atom or a methyl group, because synthesis of the metal complex of the present invention is easy.

The group represented by the formula (2-1) is preferably a group represented by the formula (2-3).

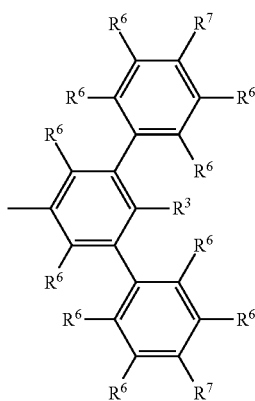

(2-3)

[in the formula (2-3), $R^3$ and $R^6$ represent the same meaning as described above.

$R^7$ represents a hydrogen atom, an alkyl group or a cycloalkyl group, and these groups each optionally have a substituent. The plurality of $R^7$ may be the same or different.]

In the formula (2-2), $R^{3a}$ is preferably a hydrogen atom or an alkyl group, more preferably a hydrogen atom or a methyl group, because synthesis of the metal complex of the present invention is easy.

In the formula (2-1) and the formula (2-2), $R^{4a}$ is preferably an aryl group having an alkyl group or a cycloalkyl group as the substituent, more preferably an aryl group having an alkyl group as the substituent, because the metal complex of the present invention is excellent in solubility in a solvent and film formability. The alkyl group or the cycloalkyl group which an aryl group has as the substituent optionally further has a substituent, and the substituent is preferably an alkyl group, a cycloalkyl group, an alkenyl group, a cycloalkenyl group, an aryl group or a halogen atom, more preferably an alkyl group, a cycloalkyl group or an aryl group.

In the formula (2-2) and the formula (2-3), $R^6$ is preferably a hydrogen atom or an alkyl group, more preferably a hydrogen atom or a methyl group, further preferably a hydrogen atom, because synthesis of the metal complex of the present invention is easy.

In the formula (2-3), $R^7$ is preferably a hydrogen atom or an alkyl group, more preferably an alkyl group, because the metal complex of the present invention is excellent in solubility in a solvent and film formability.

The metal complex represented by the formula (1) is constituted of an iridium atom or a platinum atom represented by M, a ligand number of which is prescribed by a subscript $n_1$ and a ligand number of which is prescribed by a subscript $n_2$.

In the formula (1), M is preferably an iridium atom. In this case, $n_1+n_2=3$ in the formula (1).

In the formula (1), $n_1$ is preferably 2 or 3, more preferably 3.

In the formula (1), the anionic bidentate ligand represented by $A^1$-$G^1$-$A^2$ includes, for example, ligands represented by the following formulae.

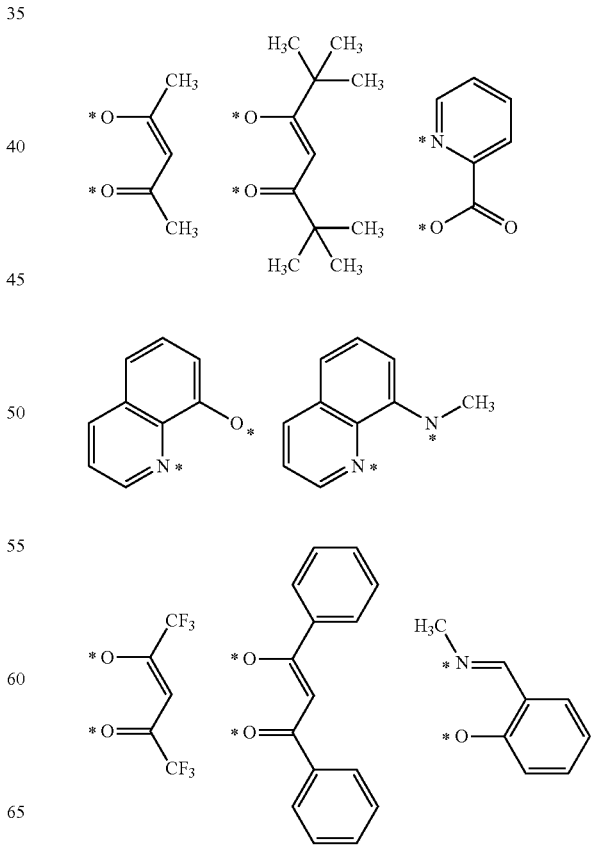

-continued

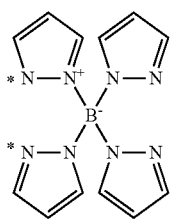

[wherein, * represents a position linking to an iridium atom or a platinum atom.]

In the formula (1), the anionic bidentate ligand represented by $A^1$-$G^1$-$A^2$ may be ligands represented by the following formulae. The anionic bidentate ligand represented by $A^1$-$G^1$-$A^1$ is different from the ligand of which number is defined by the subscript $n^1$.

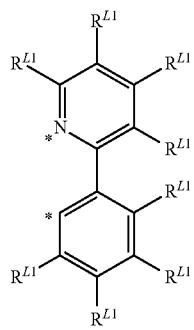 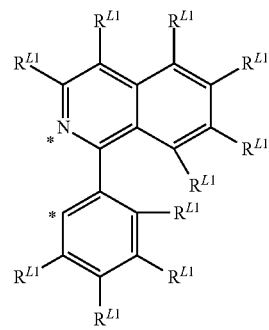

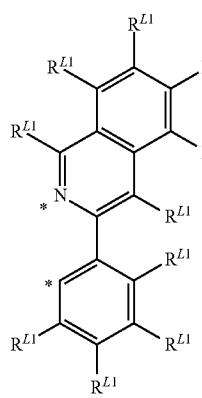 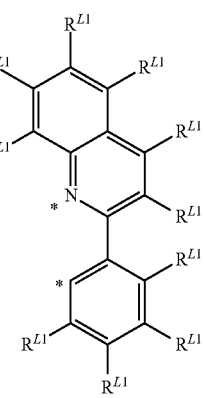

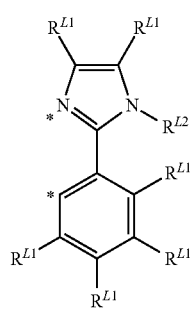 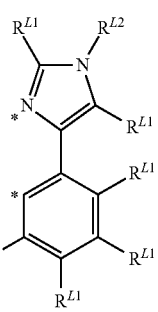

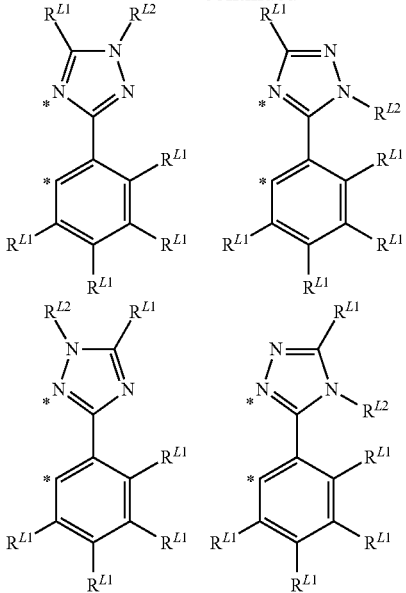

(wherein,
* represents a position linking to an iridium atom or a platinum atom.

$R^{L1}$ represents a hydrogen atom, an alkyl group, a cycloalkyl group, an aryl group, a monovalent heterocyclic group or a halogen atom, and these groups each optionally have a substituent. The plurality of $R^{L1}$ may be the same or different.

$R^{L2}$ represents an alkyl group, a cycloalkyl group, an aryl group, a monovalent heterocyclic group or a halogen atom, and these groups each optionally have a substituent.]

In the formula (1), $m_1$ is preferably 3 or 4, because the light emitting device of the present invention is excellent in stability. In the formula (1), $m_2$ is preferably 4, because the light emitting device of the present invention is excellent in stability.

When Ring A in the formula (1) is a 5-membered aromatic heterocyclic ring, it is preferable that at least one of three $E^1$s is a nitrogen atom and $E^3$ is a carbon atom, because the light emitting device of the present invention is excellent in stability. When Ring A is a 6-membered aromatic heterocyclic ring, it is preferable that all four $E^1$s are a carbon atom and $E^1$ is a carbon atom, because the light emitting device of the present invention is excellent in stability.

In the formula (1), Ring B is preferably a 6-membered aromatic hydrocarbon ring, because the light emitting device of the present invention is more excellent in driving voltage.

In the formula (1), $R^1$ and $R^2$ are preferably a hydrogen atom, an alkyl group, a cycloalkyl group, an aryl group or a monovalent heterocyclic group, preferably a hydrogen atom, an alkyl group, a cycloalkyl group or an aryl group, because the light emitting device of the present invention is excellent in stability. At least one of the plurality of $R^1$ and $R^2$ is a group represented by the formula (2-1) or the formula (2-2).

The metal complex represented by the formula (1) is preferably a metal complex represented by the following formula (1-a), because the light emitting device of the present invention is more excellent in driving voltage.

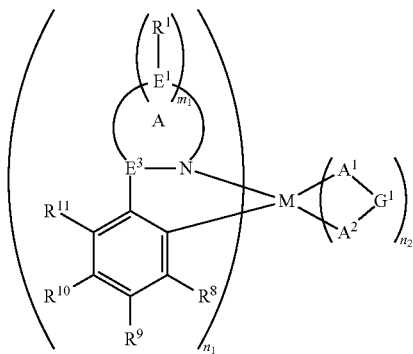

(1-a)

[in the formula (1-a),

M, $n_1$, $n_2$, $G^1$, $A^1$, $A^2$, $m_1$, $E^1$, $E^3$, $R^1$ and Ring A represent the same meaning as described above.

$R^8$, $R^9$, $R^{10}$ and $R^{11}$ each independently represent a hydrogen atom, an alkyl group, a cycloalkyl group, an alkoxyl group, a cycloalkoxy group, an aryl group, an aryloxy group, a monovalent heterocyclic group or a halogen atom, and these groups each optionally have a substituent. When a plurality of $R^8$, $R^9$, $R^{10}$ and $R^{11}$ are present, they may be the same or different at each occurrence. $R^1$ attached to $E^1$ adjacent to $E^1$ and $R^{11}$ may be combined to form a ring together with $E^1$ to which $R^1$ is attached and a carbon atom to which $R^{11}$ is attached. $R^{11}$ and $R^{10}$ may be combined to form a ring together with the carbon atoms to which they are attached. $R^{10}$ and $R^{11}$ may be combined to form a ring together with the carbon atoms to which they are attached. $R^9$ and $R^8$ may be combined to form a ring together with the carbon atoms to which they are attached. At least one of $R^1$, $R^8$, $R^9$, $R^{10}$ and $R^{11}$ is a group represented by the formula (2-1) or formula (2-2).]

In the formula (1-a), $R^8$, $R^9$, $R^{10}$ and $R^{11}$ are preferably a hydrogen atom, an alkyl group, a cycloalkyl group, an aryl group or a monovalent heterocyclic group, more preferably a hydrogen atom or an aryl group, because the light emitting device of the present invention is excellent in external quantum yield. At least one of $R^6$, $R^8$, $R^9$, $R^{10}$ and $R^{11}$ is a group represented by the formula (2-1) or the formula (2-2), and it is preferable that at least one of $R^1$ and $R^{10}$ is a group represented by the formula (2-1) or the formula (2-2).

The aryl group represented by $R^8$, $R^9$, $R^{10}$ and $R^{11}$ is preferably an aryl group having an alkyl group or a cycloalkyl group as the substituent, more preferably an aryl group having an alkyl group as the substituent.

The aryl group and the monovalent heterocyclic group represented by $R^8$, $R^9$, $R^{10}$ and $R^{11}$ are preferably a dendron. The dendron is preferably a group represented by the formula (2-1), a group represented by the formula (2-2), a group represented by the formula (D-A) or a group represented by the formula (D-B).

In the formula (1-a), Ring A is preferably a pyridine ring optionally having a substituent, an imidazole ring optionally having a substituent or a triazole ring optionally having a substituent.

The complex represented by the formula (1-a) is preferably a metal complex represented by the following formula (1-b) or a metal complex represented by the following formula (1-c), because the light emitting device of the present invention is excellent in stability.

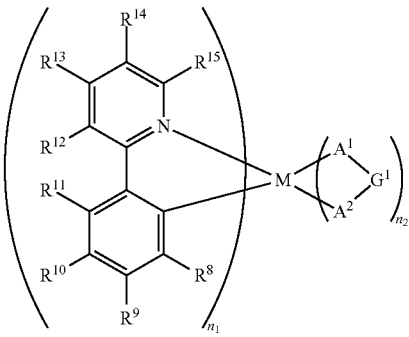

(1-b)

[in the formula (1-b),

M, $n_1$, $n_2$, $G^1$, $A^1$, $A^2$, $R^8$, $R^9$, $R^{10}$ and $R^{11}$ represent the same meaning as described above.

$R^{12}$, $R^{13}$, $R^{14}$ and $R^{15}$ each independently represent a hydrogen atom, an alkyl group, a cycloalkyl group, an alkoxyl group, a cycloalkoxy group, an aryl group, an aryloxy group, a monovalent heterocyclic group or a halogen atom, and these groups each optionally have a substituent. When a plurality of $R^{12}$, $R^{13}$, $R^{14}$ and $R^{15}$ are present, they may be the same or different at each occurrence. $R^{11}$ and $R^{12}$ may be combined to form a ring together with the carbon atoms to which they are attached. $R^{12}$ and $R^{13}$ may be combined to form a ring together with the carbon atoms to which they are attached. $R^{13}$ and $R^{14}$ may be combined to form a ring together with the carbon atoms to which they are attached. $R^{14}$ and $R^{15}$ may be combined to form a ring together with the carbon atoms to which they are attached. At least one of $R^8$, $R^9$, $R^{10}$, $R^{11}$, $R^{12}$, $R^{13}$, $R^{14}$ and $R^{15}$ is a group represented by the formula (2-1) or formula (2-2).]

$R^{12}$, $R^{13}$, $R^{14}$ and $R^{15}$ are preferably a hydrogen atom, an alkyl group, a cycloalkyl group, an aryl group or a monovalent heterocyclic group, more preferably a hydrogen atom or an aryl group, because the light emitting device of the present invention is excellent in external quantum yield. At least one of $R^8$, $R^9$, $R^{10}$, $R^{11}$, $R^{12}$, $R^{13}$, $R^{14}$ and $R^{15}$ is a group represented by the formula (2-1) or the formula (2-2), and it is preferable that at least one of $R^{10}$ and $R^{14}$ is a group represented by the formula (2-1) or the formula (2-2).

The aryl group represented by $R^{12}$, $R^{13}$, $R^{14}$ and $R^{15}$ is preferably an aryl group having an alkyl group or a cycloalkyl group as the substituent, preferably an aryl group having an alkyl group as the substituent.

The aryl group and the monovalent heterocyclic group represented by $R^{12}$, $R^{13}$, $R^{14}$ and $R^{15}$ are preferably a dendron. The dendron is preferably a group represented by the formula (2-1), a group represented by the formula (2-2), a group represented by the formula (D-A) or a group represented by the formula (D-B).

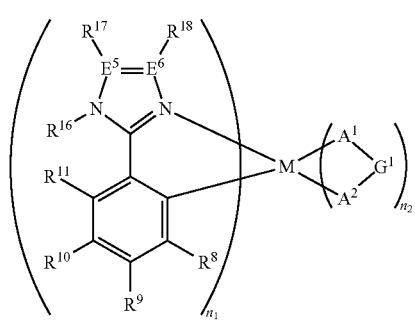

(1-c)

[in the formula (1-c),

M, $n^1$, $n_2$, $G^1$, $A^1$, $A^2$, $R^8$, $R^9$, $R^{10}$ and $R^{11}$ represent the same meaning as described above.

$E^5$ and $E^6$ each independently represent a nitrogen atom or a carbon atom. When a plurality of $E^5$ and $E^6$ are present, they may be the same or different at each occurrence. $R^{17}$ is not present when $E^5$ is a nitrogen atom. $R^{18}$ is not present when $E^6$ is a nitrogen atom.

$R^{16}$, $R^{17}$ and $R^{18}$ each independently represent a hydrogen atom, an alkyl group, a cycloalkyl group, an alkoxyl group, a cycloalkoxy group, an aryl group, an aryloxy group, a monovalent heterocyclic group or a halogen atom, and these groups each optionally have a substituent. When a plurality of $R^{16}$, $R^{17}$ and $R^{18}$ are present, they may be the same or different at each occurrence. $R^{11}$ and $R^{16}$ may be combined to form a ring together with the carbon atom to which $R^{11}$ is attached and the nitrogen atom to which $R^{16}$ is attached. $R^{16}$ and $R^{17}$ may be combined to form a ring together with the nitrogen atom to which $R^{16}$ is attached and the carbon atom to which $R^{17}$ is attached. $R^{17}$ and $R^{18}$ may be combined to form a ring together with the carbon atoms to which they are attached. At least one of $R^8$, $R^9$, $R^{10}$, $R^{11}$, $R^{16}$, $R^{17}$ and $R^{18}$ is a group represented by the formula (2-1) or formula (2-2).]

$R^{16}$, $R^{17}$ and $R^{18}$ are preferably a hydrogen atom, an alkyl group, a cycloalkyl group, an aryl group or a monovalent heterocyclic group, more preferably a hydrogen atom or an aryl group, because the light emitting device of the present invention is excellent in external quantum yield. At least one of $R^8$, $R^9$, $R^{10}$, $R^{11}$, $R^{16}$, $R^{17}$ and $R^{18}$ is a group represented by the formula (2-1) or the formula (2-2), and it is preferable that $R^{10}$ is a group represented by the formula (2-1) or the formula (2-2).

The aryl group represented by $R^{16}$, $R^{17}$ and $R^{18}$ is preferably an aryl group having an alkyl group or a cycloalkyl group as the substituent, more preferably an aryl group having an alkyl group as the substituent.

As the aryl group and the monovalent heterocyclic group represented by $R^{16}$, $R^{17}$ and $R^{18}$, a dendron is preferable. The dendron is preferably a group represented by the formula (2-1), a group represented by the formula (2-2), a group represented by the formula (D-A) or a group represented by the formula (D-B).

The metal complex represented by the formula (1) includes, for example, metal complexes represented by the following formulae (Ir-1) to (Ir-18), and includes preferably metal complexes represented by the formula (Ir-1), (Ir-2), (Ir-3), (Ir-4), (Ir-5), (Ir-7), (Ir-8), (Ir-9), (Ir-10) or (Ir-15), more preferably metal complexes represented by the formula (Ir-1), (IL-2), (Ir-3), (Ir-4), (Ir-9) or (Ir-15), further preferably metal complexes represented by the formula (Ir-1), the formula (Ir-2), the formula (Ir-3) or (Ir-4), because the light emitting device of the present invention is excellent in external quantum yield.

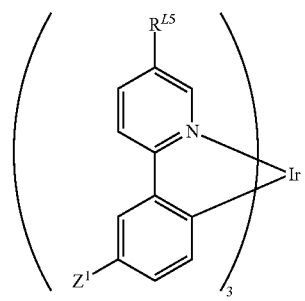

(Ir-1)

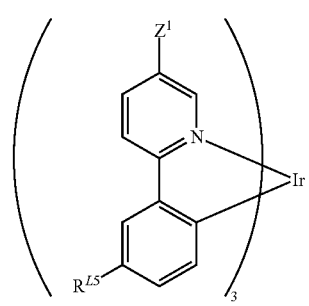

(Ir-2)

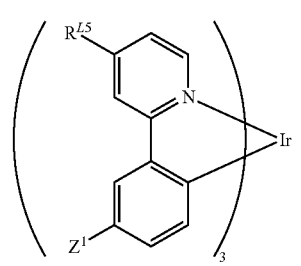

(Ir-3)

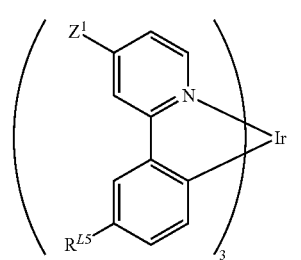

(Ir-4)

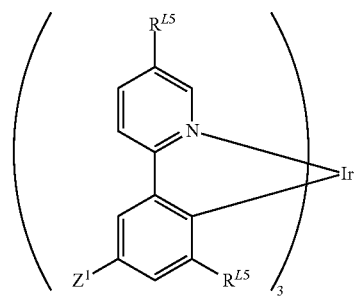

(Ir-5)

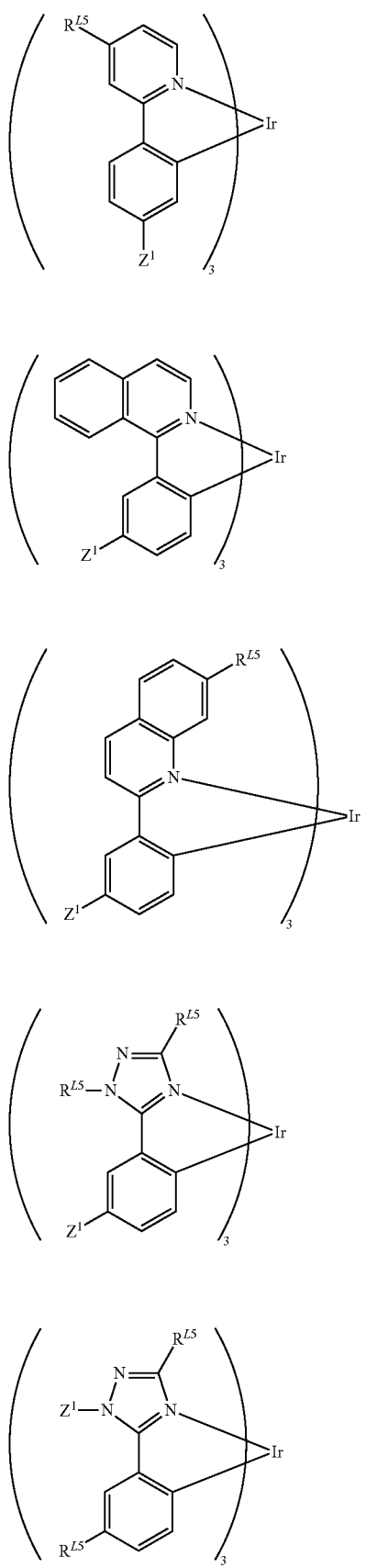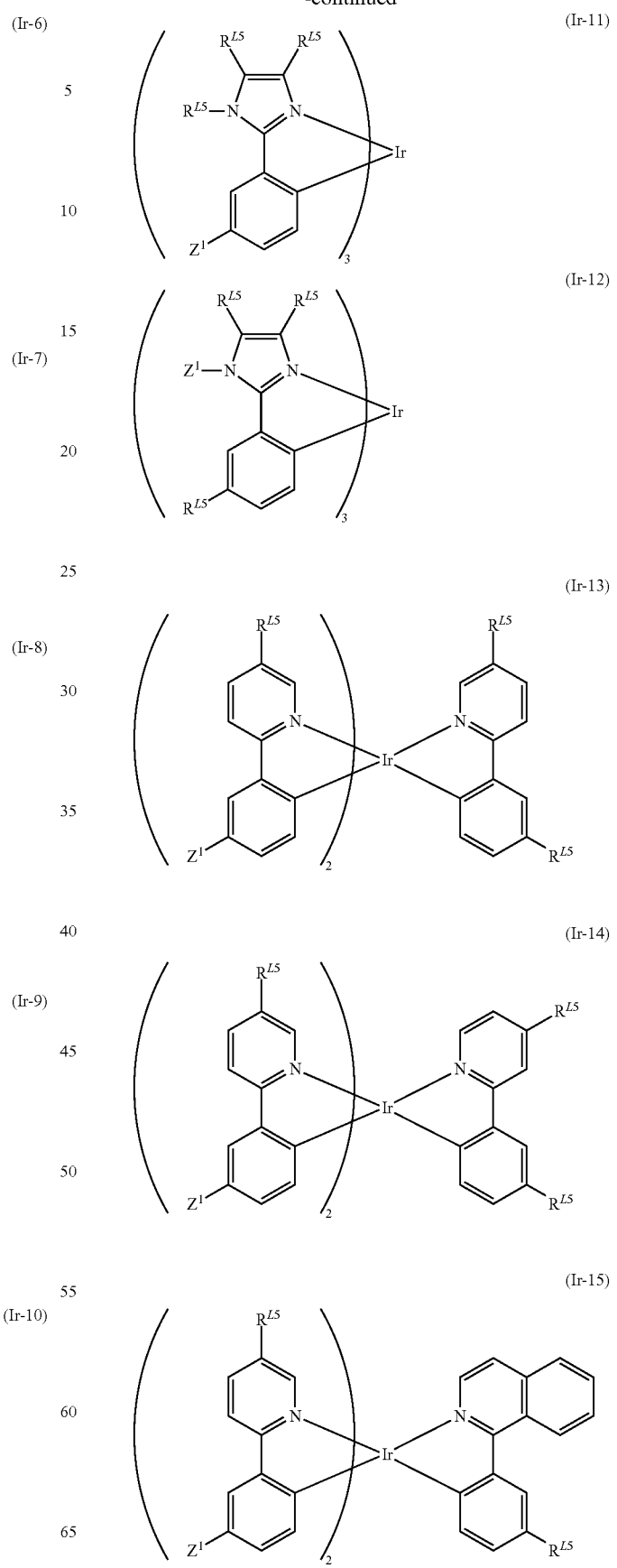

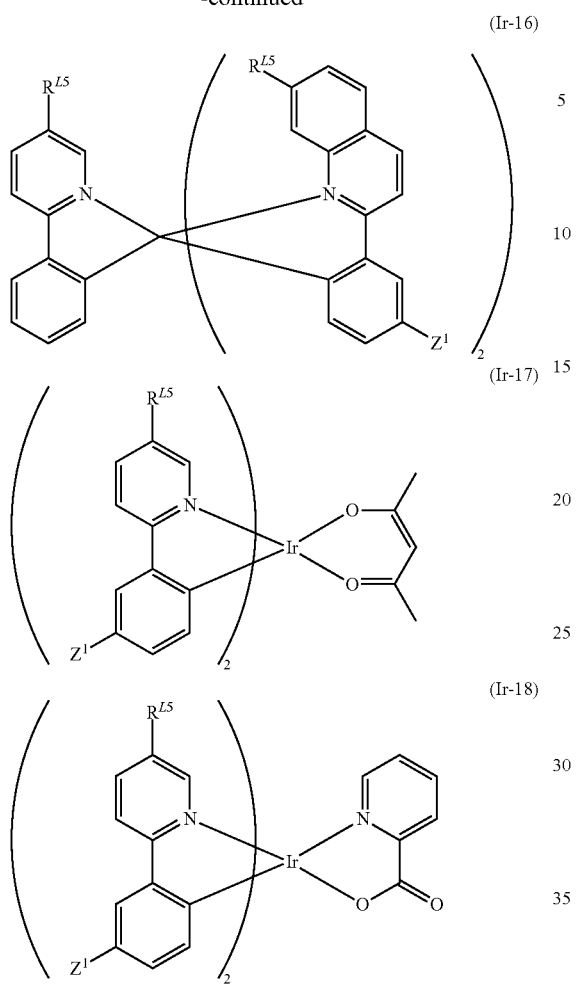

(in the formulae (Ir-1) to (Ir-18), $R^{L5}$ represents a hydrogen atom, an alkyl group, a cycloalkyl group, an alkoxyl group, a cycloalkoxy group, an aryl group, an aryloxy group, a monovalent heterocyclic group or a halogen atom, and these groups each optionally have a substituent. When a plurality of $R^{L5}$ are present, they may be the same or different at each occurrence.

$Z^1$ is a group represented by the formula (2-1) or formula (2-2). When a plurality of $Z^1$ are present, they may be the same or different at each occurrence.)

In the formulae (Ir-1) to (Ir-18), $R^{L5}$ is preferably a group selected from the group consisting of groups represented by the formula (II-01) to the formula (II-22) in Group II described below.

In the formulae (Ir-1) to (Ir-18), $Z^1$ is preferably a group selected from the group consisting of groups represented by the formula (III-01) to the formula (III-15) in Group III described below as the group represented by the formula (2-1) or the formula (2-2).

<Group II>

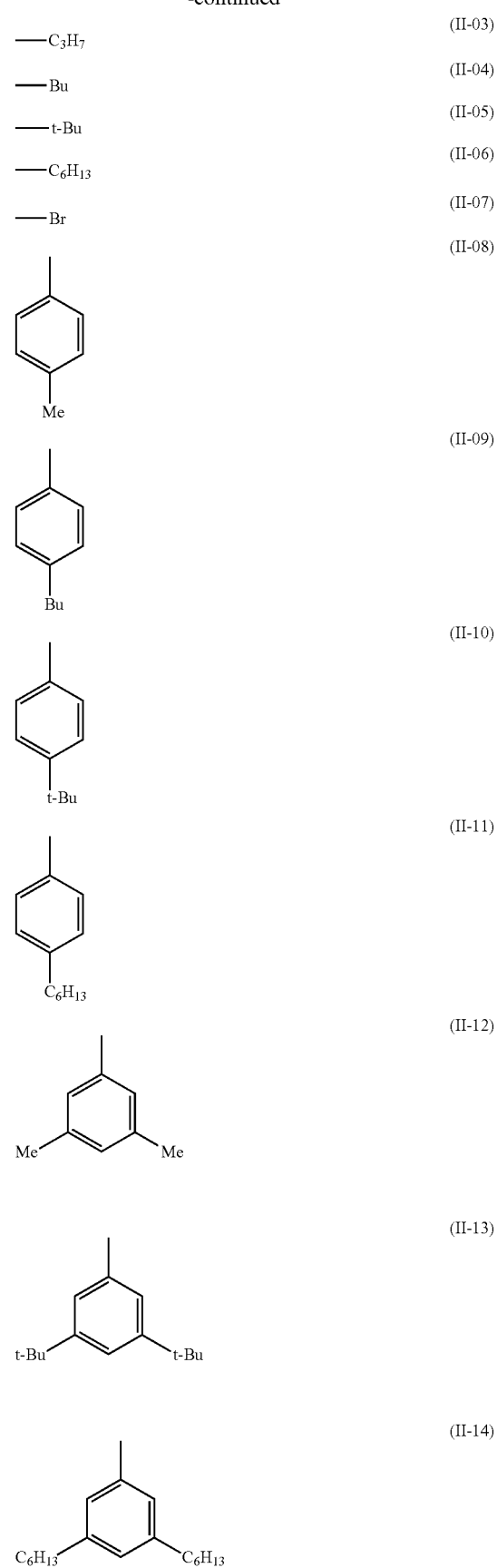

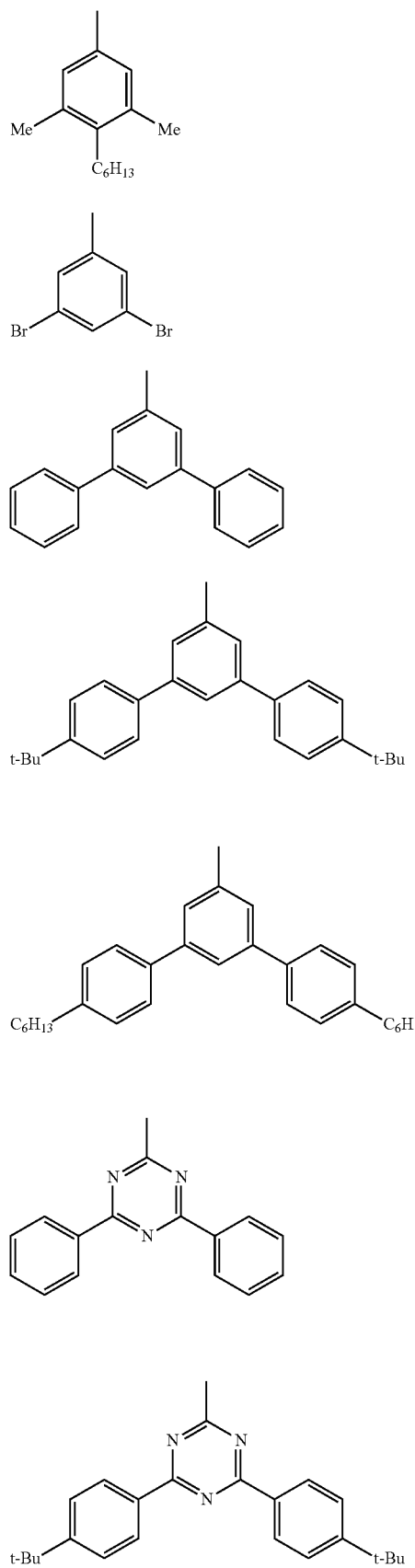
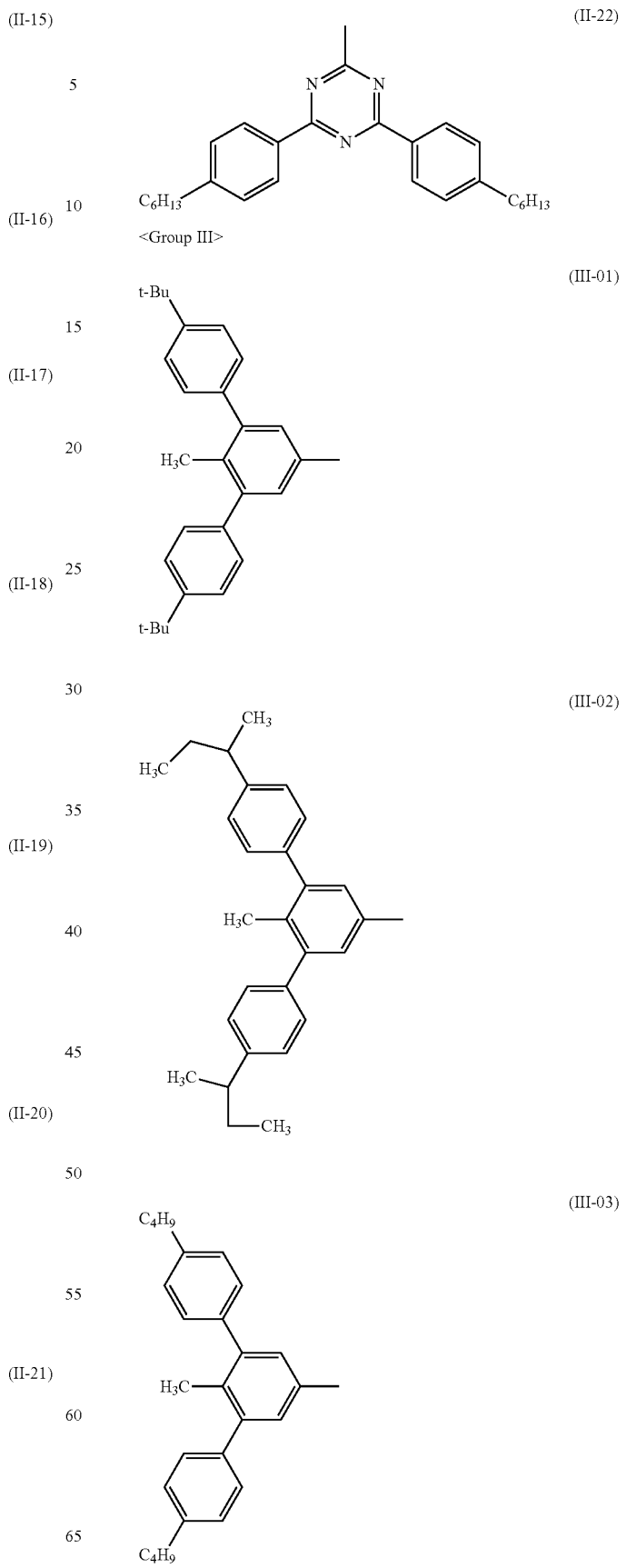

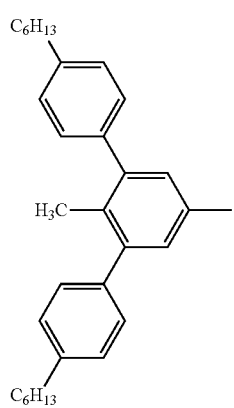 (III-04)
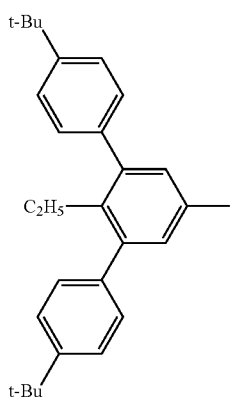 (III-07)
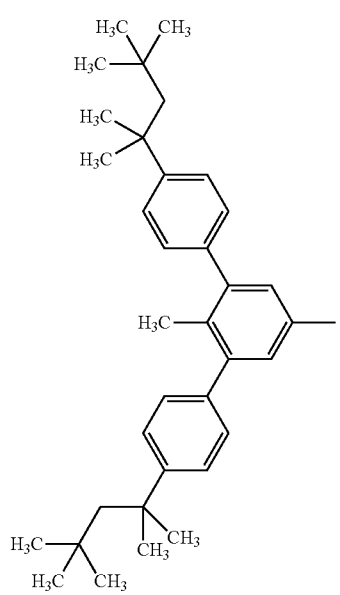 (III-05)
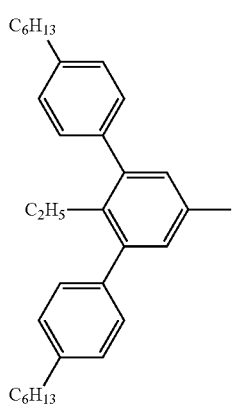 (III-08)
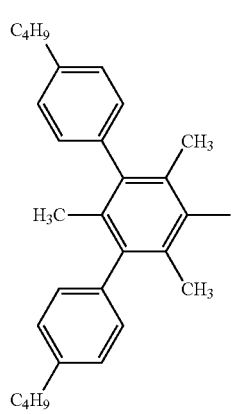 (III-06)
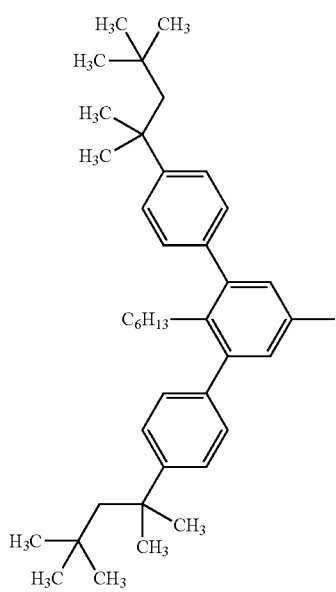 (III-09)

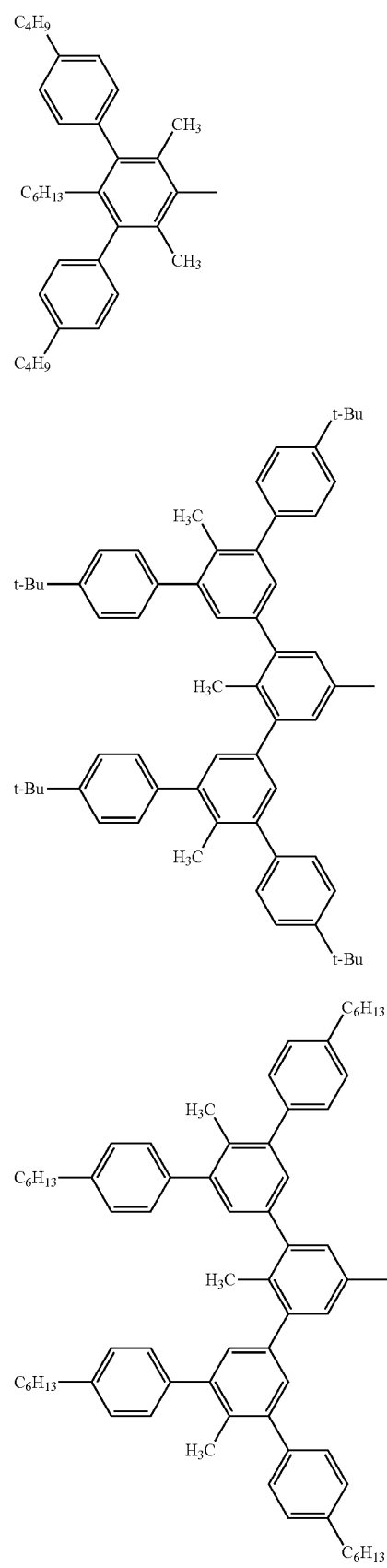

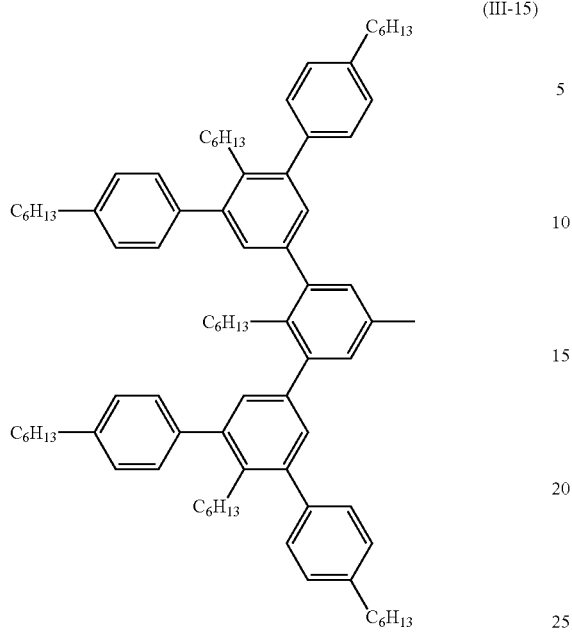

(III-15)

In the formulae (Ir-1) to (Ir-18), $R^{L5}$ is preferably a group represented by the formula (II-01), the formula (II-02), the formula (11-03) or the formula (11-17) to the formula (II-22).

In the formula (Ir-1) to the formula (Ir-18), $Z^2$ is preferably a group represented by the formula (III-1), the formula (III-3), the formula (III-5) or (111-14).

Specific examples of the metal complex represented by the formula (1), the formula (2-1) or the formula (2-2) include metal complexes represented by the following formulae (Ir-101) to (Ir-122).

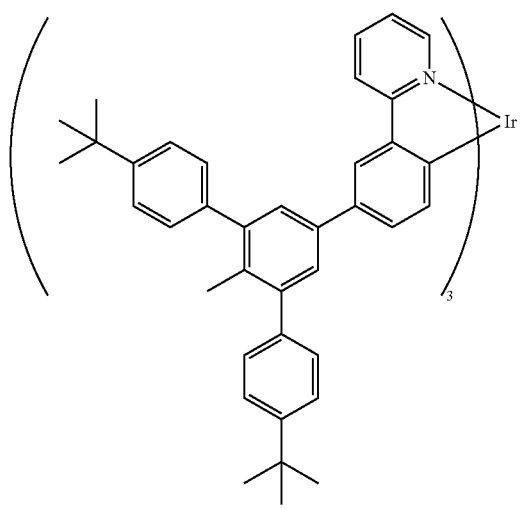

(Ir-101)

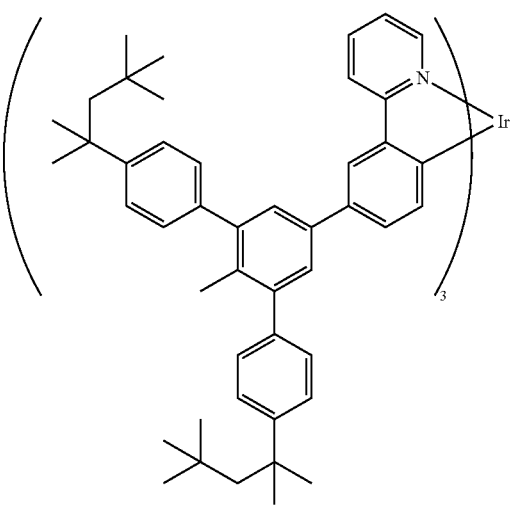

(Ir-102)

-continued
(Ir-103)
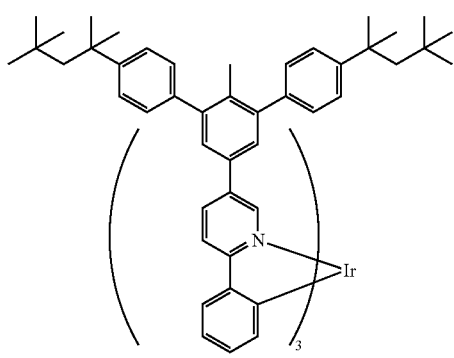
(Ir-104)
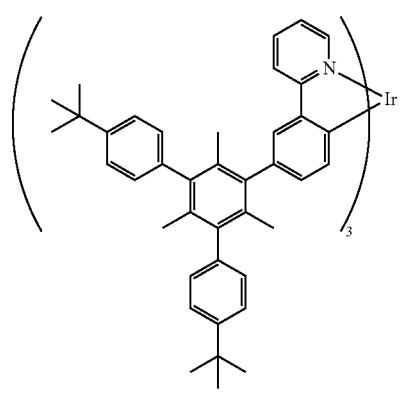
(Ir-105)
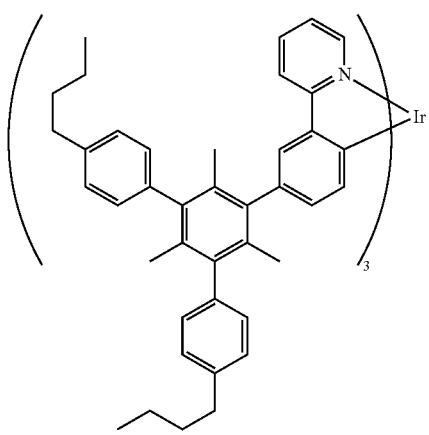
(Ir-106)
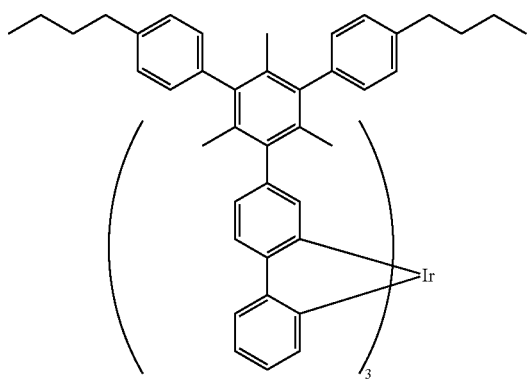
(Ir-107)
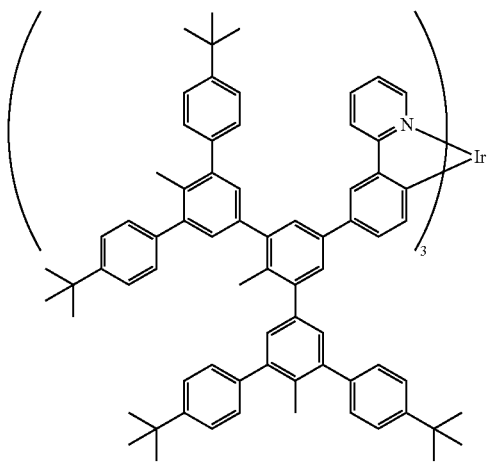
(Ir-108)
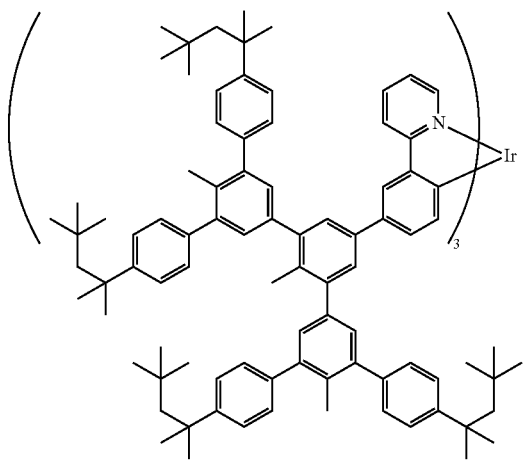

-continued
(Ir-109)
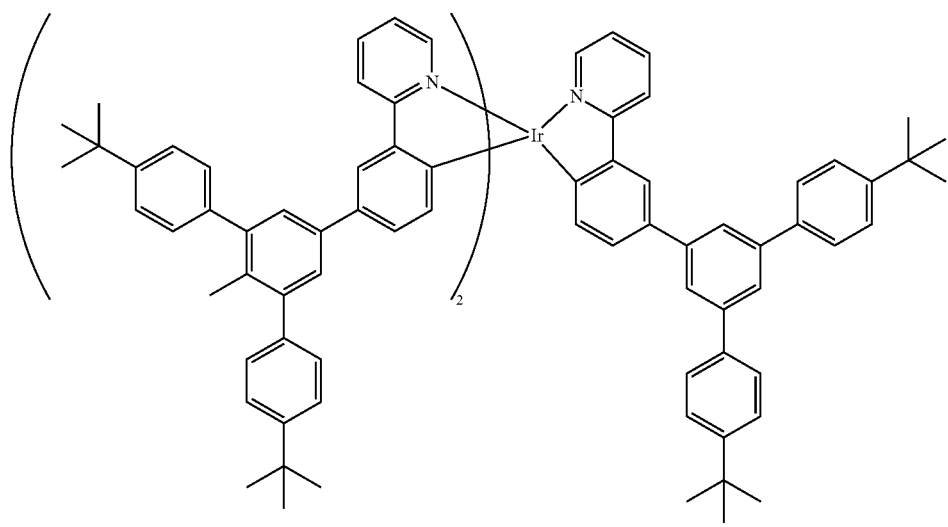
(Ir-110)
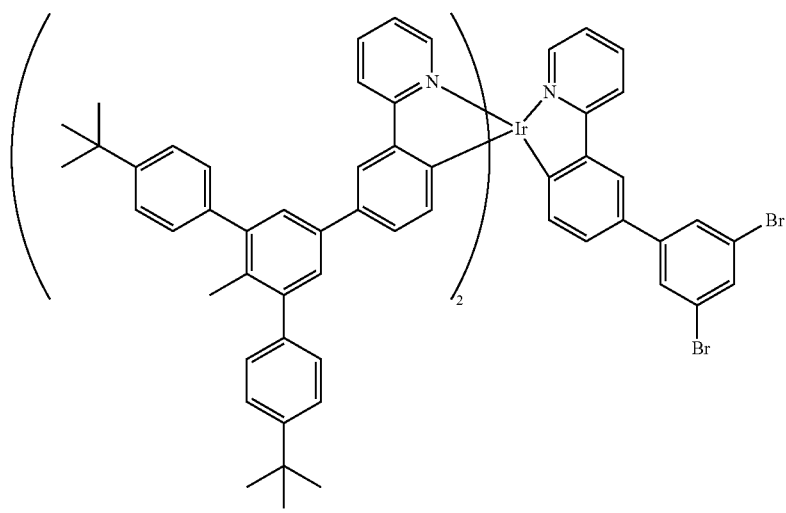
(Ir-111) (Ir-112)
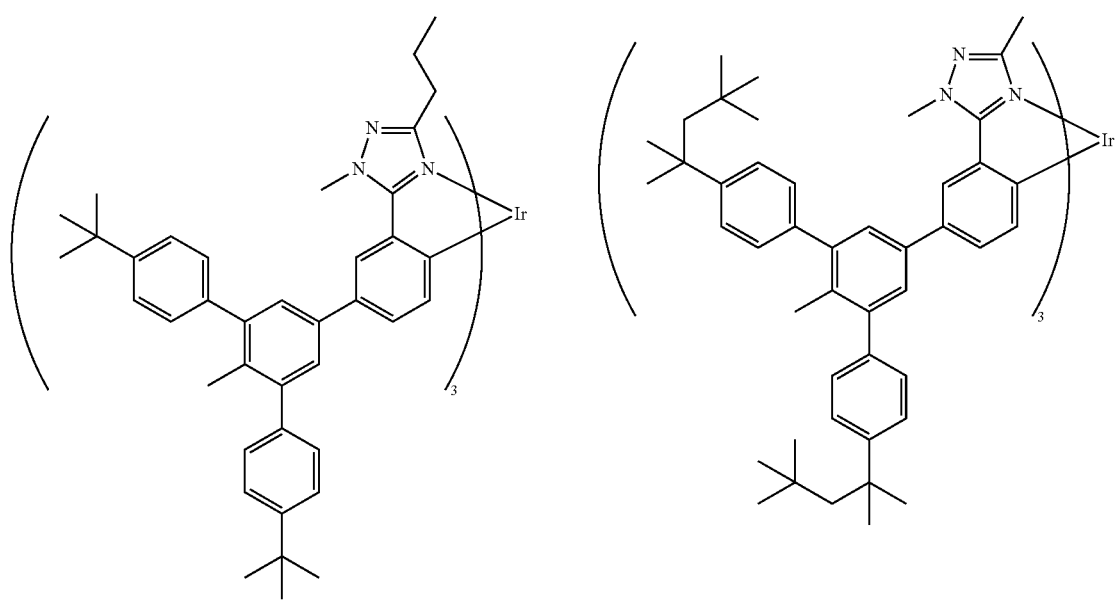

(Ir-113)
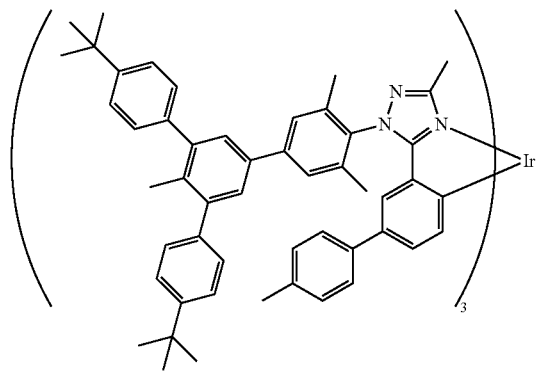
(Ir-114)
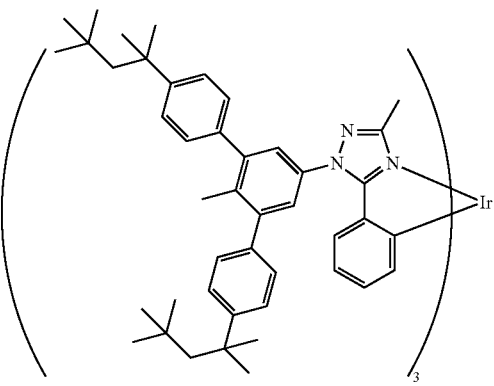
(Ir-115)
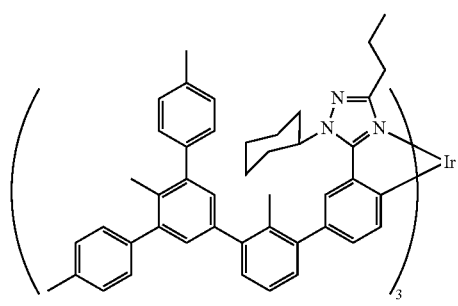
(Ir-116)
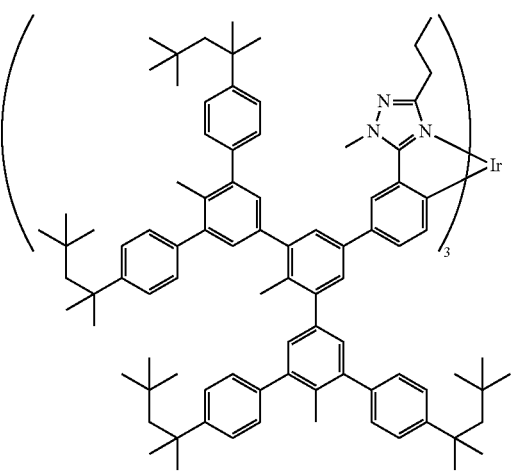
(Ir-117)
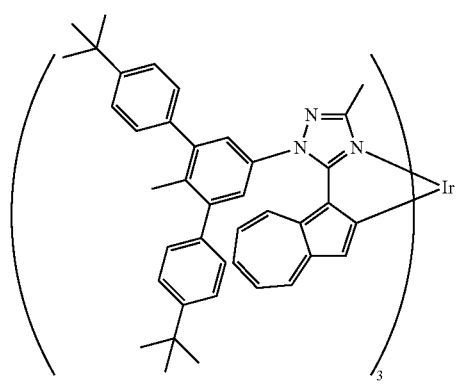
(Ir-118)
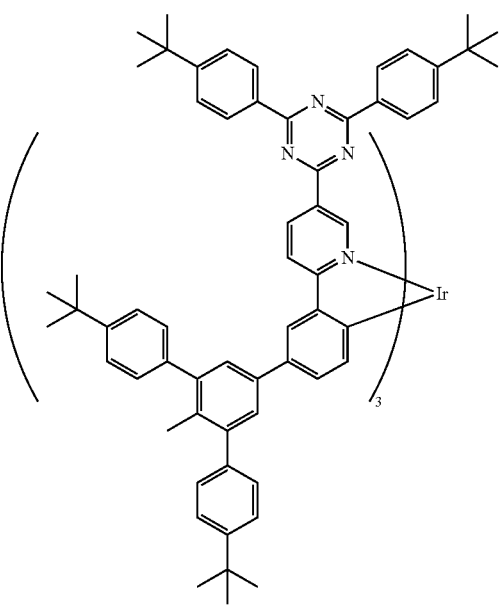

-continued
(Ir-120)
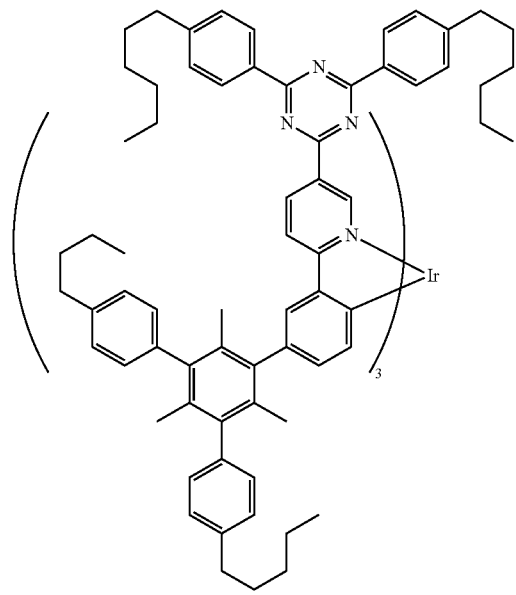
(Ir-121)
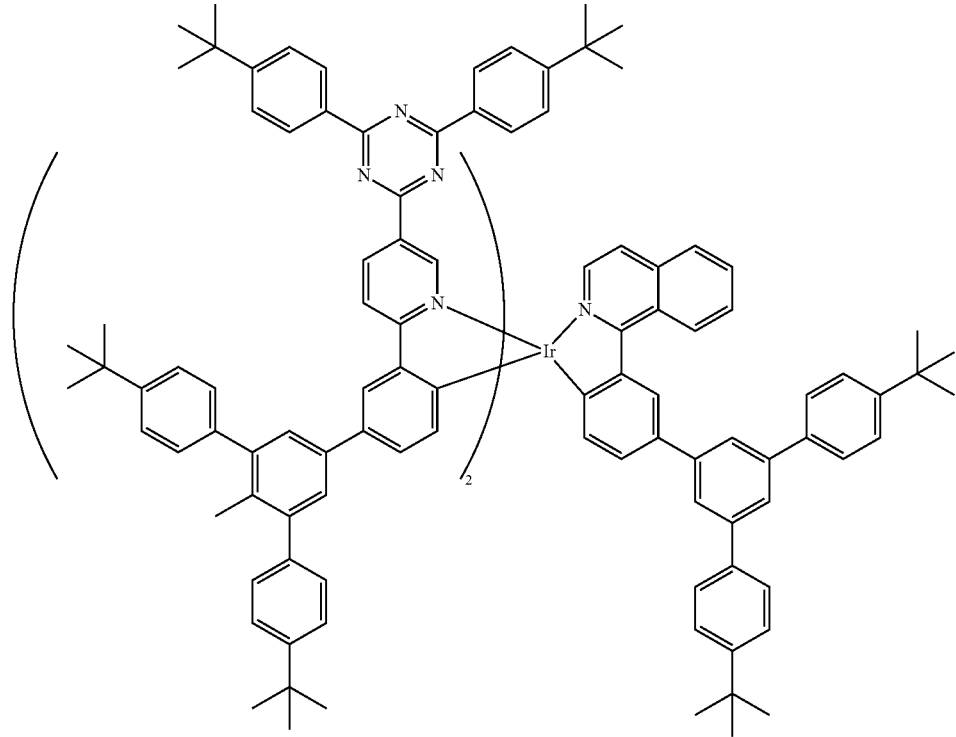

-continued (Ir-122)

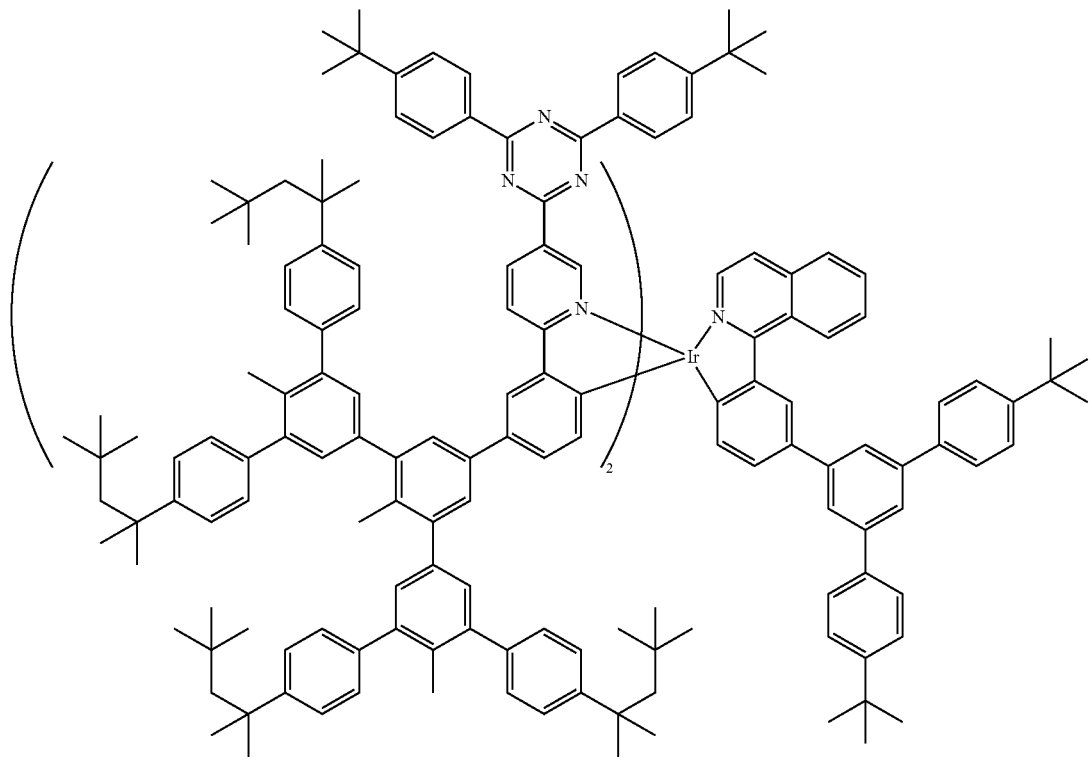

In the light emitting device of the present invention, the metal complex of the present invention may be used singly or two or more of the metal complexes may be used in combination.

For the metal complex represented by the formula (1), several geometric isomers are envisaged and any geometric isomers may be used, and the proportion of facial isomers with respect to the whole metal complex is preferably 80 mol % or more, more preferably 90 mol % or more, further preferably 99 mol % or more, particularly preferably 100 mol % (namely, no other geometric isomers are contained), because the light emitting device of the present invention is excellent in luminance life.

<Production Method of Metal Complex>

[Production Method 1]

The metal complex represented by the formula (1) as the metal complex of the present invention can be produced, for example, by a method of reacting a compound acting as a ligand with a metal compound. If necessary, a functional group transformation reaction of a ligand of a metal complex may be conducted.

Of metal complexes represented by the formula (1), one in which M is an iridium atom and $n_1$ is 3 can be produced, for example, by a method including Step A1 of reacting a compound represented by the formula (5) and an iridium compound or its hydrate to synthesize a metal complex represented by the formula (6) and Step B1 of reacting a metal complex represented by the formula (6) and a compound represented by the formula (5) or a precursor of a ligand represented by $A^1$-$G^1$-$A^2$.

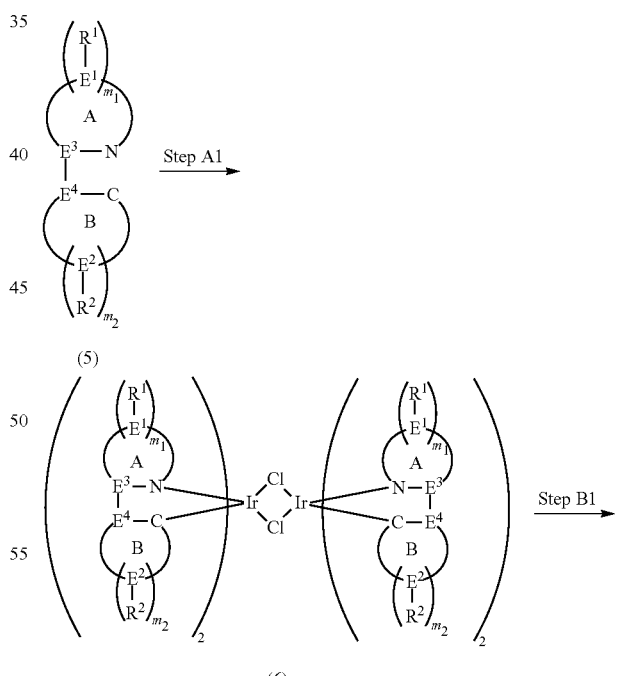

[wherein, $m^1$, $m_2$, $E^1$, $E^2$, $E^3$, $E^4$, $R^1$, $R^2$, Ring A and Ring B represent the same meaning as described above.]

In Step A1, the iridium compound includes, for example, iridium chloride, tris(acetylacetonato)iridium(III), chloro (cyclooctadiene)iridium(I) dimer and iridium(III) acetate, and the iridium compound hydrate includes, for example, iridium chloride trihydrate.

Step A1 and Step B1 are conducted usually in a solvent. The solvent includes, for example, alcohol solvents such as methanol, ethanol, propanol, ethylene glycol, glycerin, 2-methoxyethanol and 2-ethoxyethanol; ether solvents such as diethyl ether, tetrahydrofuran, dioxane, cyclopentyl methyl ether and diglyme; halogen-based solvents such as methylene chloride and chloroform; nitrile solvents such as acetonitrile and benzonitrile; hydrocarbon solvents such as hexane, decalin, toluene, xylene and mesitylene; amide solvents such as N,N-dimethylformamide and N,N-dimethylacetamide; acetone, dimethyl sulfoxide, and water.

In Step A1 and Step B1, the reaction time is usually 30 minutes to 150 hours and the reaction temperature is usually between the melting point and the boiling point of the solvent present in the reaction system.

In Step A1, the amount of a compound represented by the formula (5) is usually 2 to 20 mol with respect to 1 mol of an iridium compound or its hydrate.

In Step B1, the amount of a compound represented by the formula (5) or a precursor of a ligand represented by $A^1$-$G^1$-$A^2$ is usually 1 to 100 mol with respect to 1 mol of a metal complex represented by the formula (6).

In Step B1, the reaction is conducted preferably in the presence of a silver compound such as silver trifluoromethanesulfonate. When a silver compound is used, its amount is usually 2 to 20 mol with respect to 1 mol of a metal complex represented by the formula (6).

The compound represented by the formula (5) can be synthesized by a step of subjecting a compound represented by the formula (7) and a compound represented by the formula (3) to a coupling reaction such as the Suzuki reaction, the Kumada reaction and the Stille reaction.

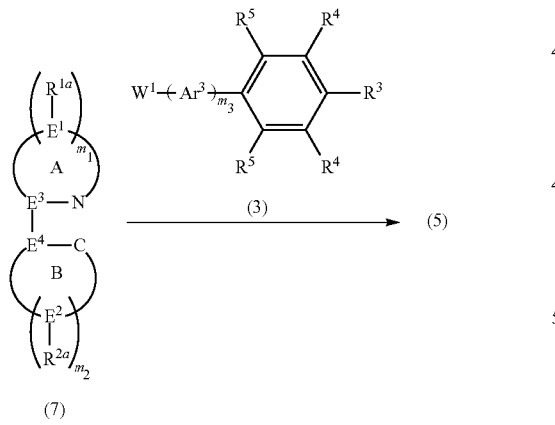

[wherein, $m^1$, $m_2$, $E^1$, $E^2$, $E^3$, $E^4$, Ring A, Ring B, $m_3$, $Ar^3$, $R^3$, $R^4$, $R^5$ and $W^1$ represent the same meaning as described above.

$R^{1a}$ and $R^{2a}$ each independently represent a hydrogen atom, an alkyl group, a cycloalkyl group, an alkoxyl group, a cycloalkoxy group, an aryl group, an aryloxy group, a monovalent heterocyclic group, a halogen atom, a group represented by —B(OR$^{W1}$)$_2$ (R$^{W1}$ represents a hydrogen atom, an alkyl group, a cycloalkyl group, an aryl group or an amino group, and these groups each optionally have a substituent. The plurality of R$^{W1}$ may be the same or different, and may be combined together to form a cyclic structure together with the oxygen atoms to which they are attached.), an alkylsulfonyloxy group or an arylsulfonyloxy group, and these groups each optionally have a substituent.

The plurality of $R^{1a}$ and $R^{2a}$ each may be the same or different. Adjacent $R^{1a}$ may be combined together to form a ring together with $E^1$s to which they are attached. Adjacent $R^{2a}$ may be combined together to form a ring together with $E^2$s to which they are attached. $R^{1a}$ attached to $E^1$ adjacent to $E^3$ and $R^{2a}$ attached to $E^2$ adjacent to $E^4$ may be combined to form a ring together with $E^1$ to which $R^{1a}$ is attached and $E^2$ to which $R^{2a}$ is attached. At least one of the plurality of $R^{1a}$ and $R^{2a}$ is a group represented by —B(OR$^{W1}$)$_2$, an alkylsulfonyloxy group, an arylsulfonyloxy group, a chlorine atom, a bromine atom or an iodine atom.]

The group represented by —B(OR$^{W1}$)$_2$ includes, for example, groups represented by the following formulae (W-1) to (W-10).

(W-1)

(W-2)

(W-3)

(W-4)

(W-5)

(W-6)

(W-7)

(W-8)

(W-9)

-continued (W-10)

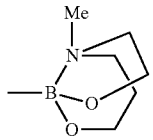

The alkylsulfonyloxy group represented by $W^1$ includes, for example, a methanesulfonyloxy group, an ethanesulfonyloxy group and a trifluoromethanesulfonyloxy group.

The arylsulfonyloxy group represented by $W^1$ includes, for example, a p-toluenesulfonyloxy group.

$W^1$ is preferably a group represented by $—B(OR^{W1})_2$, a trifluoromethanesulfonyloxy group, a chlorine atom, a bromine atom or an iodine atom, because a coupling reaction of a compound represented by the formula (3) and a metal complex represented by the formula (7) progresses easily, and of them, a chlorine atom, a bromine atom or a group represented by the formula (W-7) is more preferable, because synthesis of a compound represented by the formula (3) is easy.

The alkylsulfonyloxy group, the cycloalkylsulfonyloxy group and the arylsulfonyloxy group represented by $R^{1a}$ and $R^{2a}$ each represent the same meaning as the alkylsulfonyloxy group, the cycloalkylsulfonyloxy group and the arylsulfonyloxy group represented by $W^1$.

$R^{1a}$ and $R^{2a}$ are preferably a bromine atom, an iodine atom or a group represented by the formula (W-7).

The coupling reaction of a compound represented by the formula (7) and a compound represented by the formula (3) is conducted usually in a solvent. The solvent to be used, the reaction time and the reaction temperature are the same as those explained for Step A1 and Step B1.

In the coupling reaction of a compound represented by the formula (7) and a compound represented by the formula (3), the amount of the compound represented by the formula (3) is usually 0.05 to 20 mol with respect to 1 mol of the compound represented by the formula (7).

A compound represented by the formula (3-1) as one embodiment of the compound represented by the formula (3) can be synthesized, for example, by a method described below.

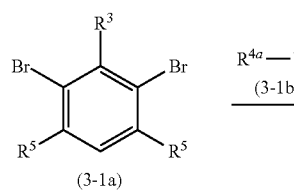

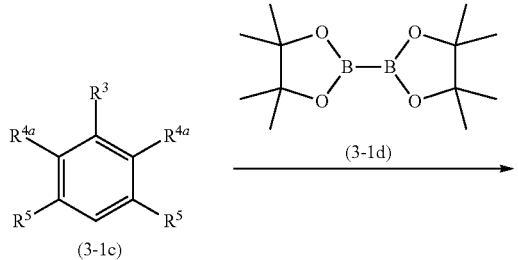

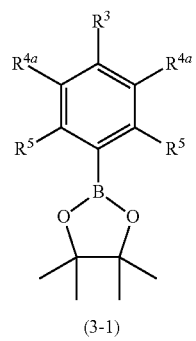

(3-1)

[wherein, $R^3$, $R^4$ and $R^5$ represent the same meaning as described above.

$W^2$ represents a group represented by $—B(OR^{W1})_2$, an alkylsulfonyloxy group, a cycloalkylsulfonyloxy group, an arylsulfonyloxy group, a chlorine atom, a bromine atom or an iodine atom, and these groups each optionally have a substituent.]

A compound represented by the formula (3-1c) can be produced, for example, by a coupling reaction of a compound represented by the formula (3-1a) and a compound represented by the formula (3-1b). This coupling reaction is the same as that explained for a compound represented by the formula (5).

A compound represented by the formula (3-1) can be synthesized, for example, by the Ishiyama-Miyaura-Hartwig reaction of a compound represented by the formula (3-1c) and a compound represented by the formula (3-1d).

A compound represented by the formula (3-2) as one embodiment of the compound represented by the formula (3) can be synthesized, for example, by a method described below.

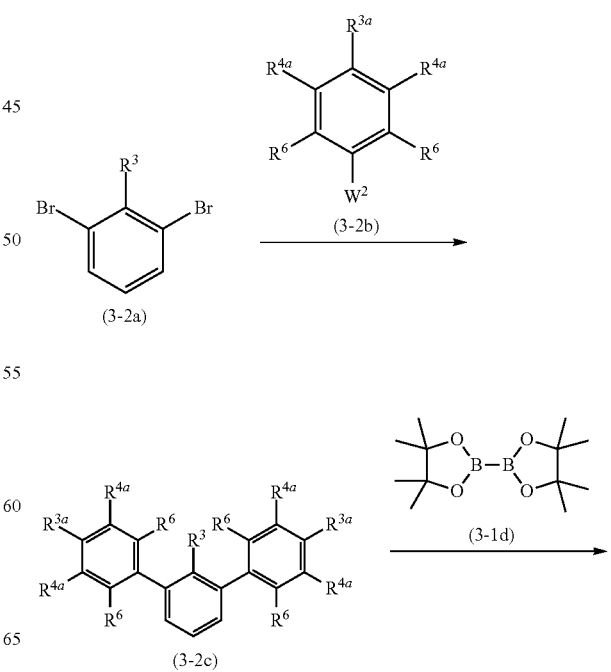

-continued

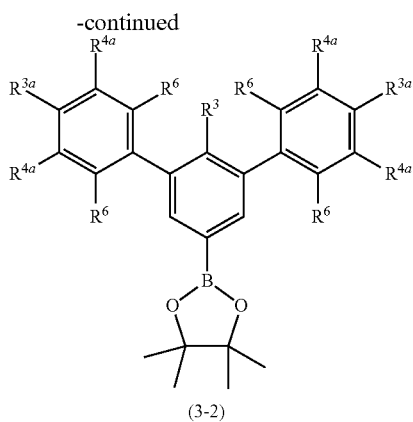

(3-2)

[wherein, $R^3$, $R^6$, $R^{3a}$, $R^{4a}$ and $W^2$ represent the same meaning as described above.]

A compound represented by the formula (3-2c) can be produced, for example, by a coupling reaction of a compound represented by the formula (3-2a) and a compound represented by the formula (3-2b). This coupling reaction is the same as that explained for a compound represented by the formula (5).

A compound represented by the formula (3-2) can be synthesized, for example, by the Ishiyama-Miyaura-Hartwig reaction of a compound represented by the formula (3-2c) and a compound represented by the formula (3-2d).

[Production Method 2]

A metal complex represented by the formula (1) as the metal complex of the present invention can be produced, for example, also by a method of reacting a precursor of a metal complex and a precursor of a ligand of a metal complex.

A metal complex represented by the formula (1) can be produced, for example, by a coupling reaction of a compound represented by the formula (3) and a metal complex represented by the formula (4). This coupling reaction is the same as that explained for a compound represented by the formula (5).

a compound represented by the formula (5), in Step A1 and Step B1 in the above-described [Production Method 1].

[Compound Represented by the Formula (3) in Production Method 1 and Production Method 2]

The compound represented by the formula (3) is preferably a compound represented by the formula (8-1) or a compound represented by the formula (8-2), because the metal complex of the present invention to be produced is excellent in solubility in a solvent and film formability. The compound represented by the formula (8-1) is preferably a compound represented by the formula (8-3).

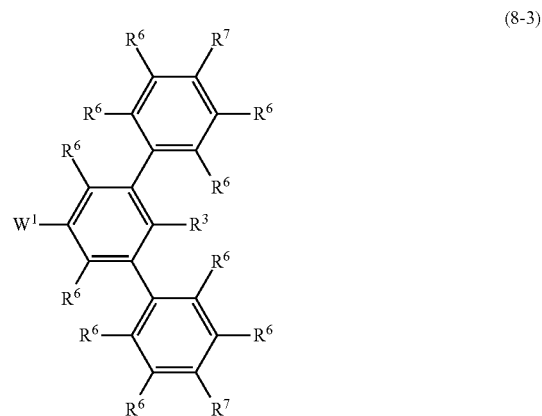

(8-3)

[in the formula (8-3), $R^3$, $R^6$, $R^7$ and $W^1$ represent the same meaning as described above.]

[Coupling Reaction in Production Method 1 and Production Method 2]

In the coupling reaction, a catalyst such as a palladium catalyst may be used for promoting the reaction. The palladium catalyst includes, for example, palladium acetate, bis(triphenylphosphine)palladium(II) dichloride, tetrakis

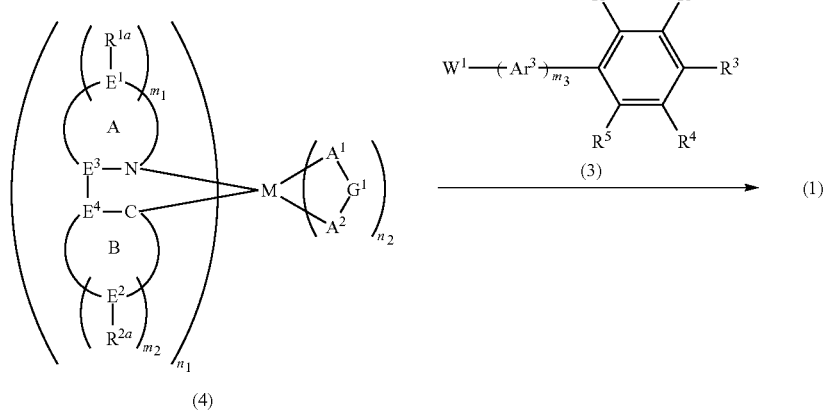

[in the formulae (3) and (4), $m_3$, $Ar^3$, $R^3$, $R^4$, $R^5$, $W^1$, M, $n^1$, $n_2$, $G^1$, $A^1$, $A^2$, $m^1$, $m_2$, $E^1$, $E^2$, $E^3$, $E^4$, Ring A, Ring B, $R^{1a}$ and $R^{2a}$ represent the same meaning as described above.]

A metal complex represented by the formula (4) can be synthesized, for example, by effecting the same reaction using a compound represented by the formula (7) instead of (triphenylphosphine)palladium(0), [1,1'-bis(diphenylphosphino)ferrocene]dichloropalladium(II) and tris(dibenzylideneacetone)dipalladium (0).

The palladium catalyst may also be used together with a phosphorus compound such as triphenylphosphine, tri(o- tolyl)phosphine, tri(tert-butyl)phosphine, tricyclohexylphosphine and 1,1'-bis(diphenylphosphino)ferrocene.

When a palladium catalyst is used in a coupling reaction, its amount is, for example, usually an effective amount, and it is preferable that the amount is 0.00001 to 10 mol in terms of a palladium element with respect to 1 mol of a compound represented by the formula (7) or 1 mol of a compound represented by the formula (4) or 1 mol of a compound represented by the formula (3) as a raw material used in each coupling reaction.

In the coupling reaction, if necessary, a base may be used together.

The compounds, the catalysts and the solvents used in respective reactions explained in <Production method of metal complex> may each be used singly or in combination of two or more.

<Composition>

The composition of the present invention comprises at least one material selected from the group consisting of a hole transporting material, a hole injection material, an electron transporting material, an electron injection material, a light emitting material (the light emitting material is different from the metal complex of the present invention), an antioxidant and a solvent, and the metal complex of the present invention.

In the composition of the present invention, the metal complex of the present invention may be contained singly, or the two or more metal complexes of the present invention may be contained.

[Host Material]

By a composition comprising the metal complex of the present invention and a host material having at least one function selected from hole injectability, hole transportability, electron injectability and electron transportability, the light emitting device of the present invention is more excellent in driving voltage. In the composition of the present invention, a host material may be contained singly or two or more host materials may be contained.

In the composition comprising the metal complex of the present invention and the host material, the content of the metal complex of the present invention is usually 0.05 to 80 parts by weight, preferably 0.1 to 50 parts by weight, more preferably 0.5 to 40 parts by weight, when the total amount of the metal complex of the present invention and the host material is 100 parts by weight.

It is preferable that the lowest excited triplet state ($T_1$) of the host material has energy level equal to or higher than the lowest excited triplet state ($T_1$) of the metal complex of the present invention because a light emitting device produced by using the composition of the present invention is excellent in luminous efficiency.

It is preferable that the host material shows solubility in a solvent which is capable of dissolving the metal complex of the present invention because the light emitting device of the present invention can be produced by a solution coating process.

The host materials are classified into low molecular weight compounds and polymer compounds.

The low molecular weight compound used as the host material includes, for example, a compound having a carbazole structure, a compound having a triarylamine structure, a compound having a phenanthroline structure, a compound having a triaryltriazine structure, a compound having an azole structure, a compound having a benzothiophene structure, a compound having a benzofuran structure, a compound having a fluorene structure and a compound having a spirofluorene structure. The low molecular weight compound used as the host material includes, more specifically, low molecular weight compounds represented by the following formulae.

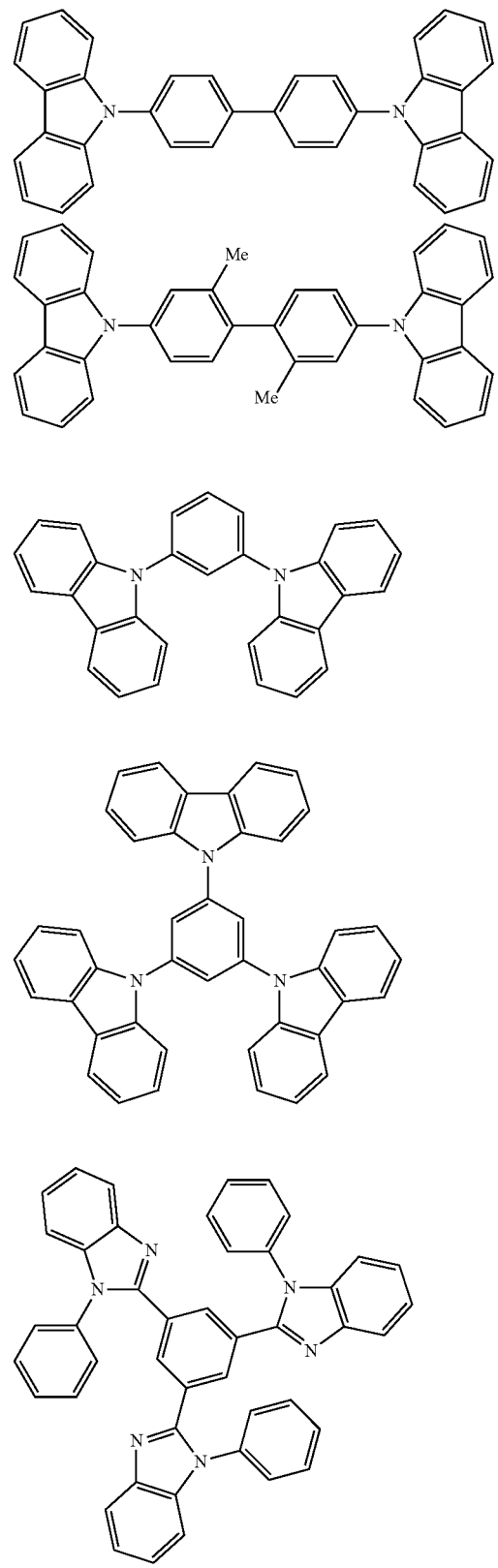

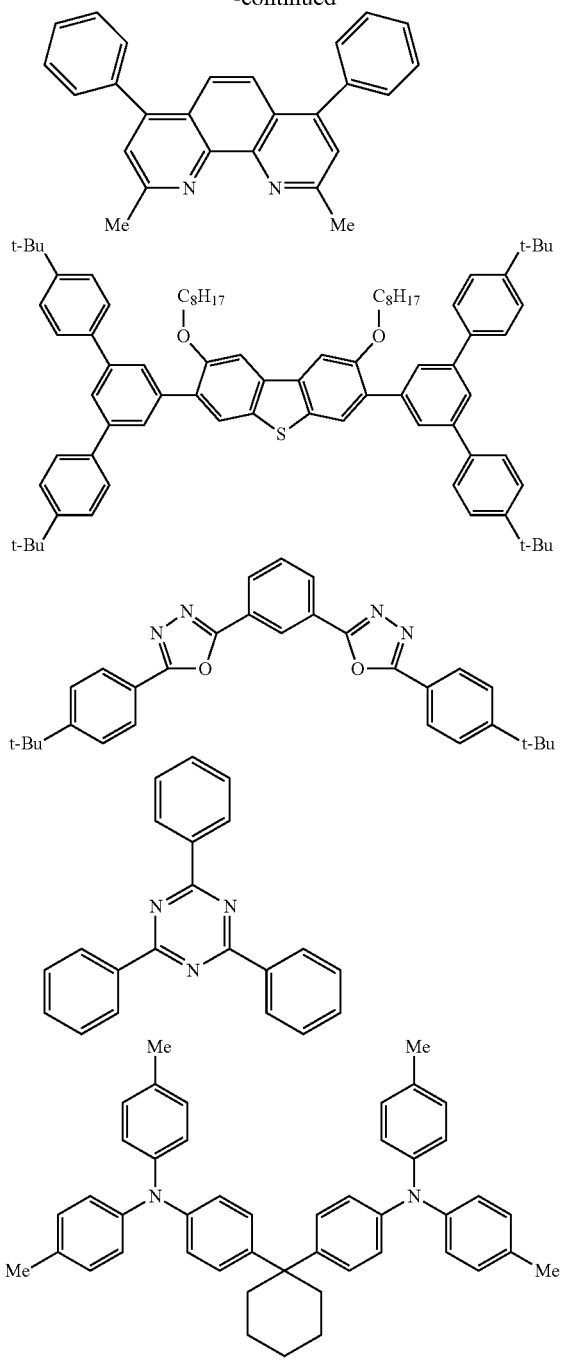

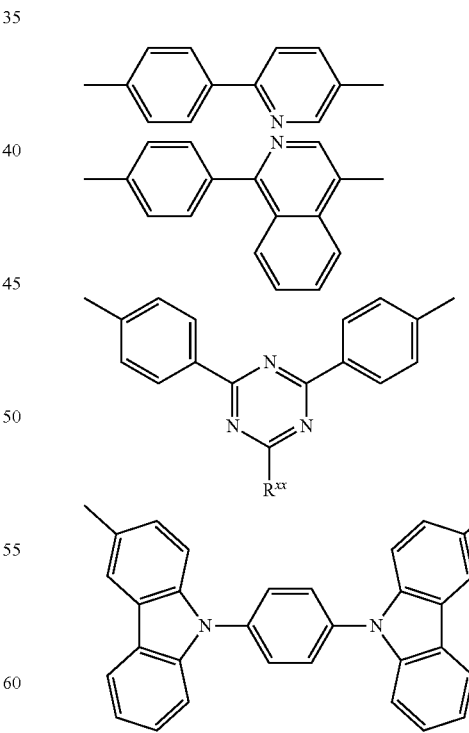

The polymer compound used as a host material includes, for example, polymer compounds as a hole transporting material described later and polymer compounds as an electron transporting material described later.

[Polymer Host]

The polymer compound which is preferable as a host compound (hereinafter, referred to also as "polymer host") will be explained.

The polymer host is preferably a polymer compound comprising a constitutional unit represented by the formula (Y):

 (Y)

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.]

The arylene group represented by $Ar^{Y1}$ is more preferably a group represented by the formula (A-1), the formula (A-2), the formula (A-6) to (A-10), the formula (A-19) or the formula (A-20), further preferably a group represented by the formula (A-1), the formula (A-2), the formula (A-7), the formula (A-9) or the formula (A-19), and these groups each optionally have a substituent.

The divalent heterocyclic group represented by $Ar^{Y1}$ is more preferably a group represented by the formula (AA-1) to (AA-4), the formula (AA-10) to (AA-15), the formula (AA-18) to (AA-21), the formula (A-53) or the formula (A-54), further preferably a group represented by the formula (AA-4), the formula (AA-10), the formula (AA-12), the formula (AA-14) or the formula (AA-33), and these groups each optionally have a substituent.

The more preferable range and the further preferable range of the arylene group and the divalent heterocyclic group in the divalent group in which at least one arylene group and at least one divalent heterocyclic group are bonded directly to each other represented by $Ar^{Y1}$ are the same as the more preferable range and the further preferable range of the arylene group and the divalent heterocyclic group represented by $Ar^{Y1}$ described above, respectively.

"The divalent group in which at least one arylene group and at least one divalent heterocyclic group are bonded directly to each other" includes, for example, groups represented by the following formulae, and each of them optionally has a substituent.

[wherein, $R^{xx}$ represents a hydrogen atom, an alkyl group, a cycloalkyl group, an aryl group or a monovalent heterocyclic group and these groups each optionally have a substituent.]

$R^{XX}$ is preferably an alkyl group, a cycloalkyl group or an aryl group, and these groups each optionally have a substituent.

The substituent which the group represented by $Ar^{Y1}$ optionally has is preferably an alkyl group, a cycloalkyl group or an aryl group, and these groups each optionally further have a substituent.

The constitutional unit represented by the formula (Y) includes, for example, constitutional units represented by the formulae (Y-1) to (Y-10), and from the standpoint of the luminance life of the light emitting device produced by using the composition comprising the polymer host and the metal complex of the present invention preferable are constitutional units represented by the formula (Y-1), (Y-2) or (Y-3), from the standpoint of electron transportability preferable are constitutional units represented by the formulae (Y-4) to (Y-7), and from the standpoint of hole transportability preferable are constitutional units represented by the formulae (Y-8) to (Y-10).

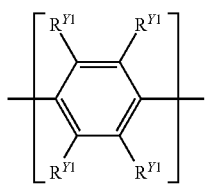

(Y-1)

(wherein, $R^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different, and adjacent $R^{Y1}$'s may be combined together to form a ring together with the carbon atoms to which they are attached.]

$R^{Y1}$ is preferably a hydrogen atom, an alkyl group, a cycloalkyl group or an aryl group, and these groups each optionally have a substituent.

It is preferable that the constitutional unit represented by the formula (Y-1) is a constitutional unit represented by the formula (Y-1').

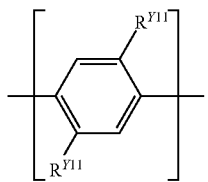

(Y-1')

[wherein, $R^{Y11}$ represents an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different.]

$R^{Y11}$ is preferably an alkyl group, a cycloalkyl group or an aryl group, more preferably an alkyl group or a cycloalkyl group, and these groups each optionally have a substituent.

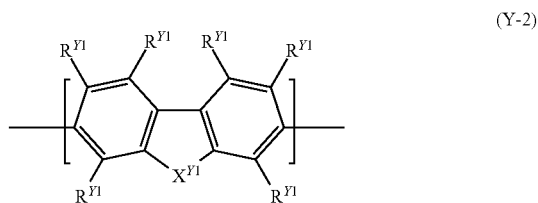

(Y-2)

[wherein, $R^{Y1}$ represents the same meaning as described above. $X^{Y1}$ represents a group represented by $—C(R^{Y2})_2—$, $—C(R^{Y2})=C(R^{Y2})—$ or $—C(R^{Y2})_2—C(R^{Y2})_2—$. $R^{Y2}$ represents a hydrogen atom, an alkyl group, a cycloalkyl group, an alkoxy group, a cycloalkoxy group, an aryl group or a monovalent heterocyclic group and these groups each optionally have a substituent. The plurality of $R^{Y2}$ may be the same or different, and these $R^{Y2}$s may be combined together to form a ring together with the carbon atoms to which they are attached.]

$R^{Y2}$ is preferably an alkyl group, a cycloalkyl group, an aryl group or a monovalent heterocyclic group, more preferably an alkyl group a cycloalkyl group or an aryl group, and these groups each optionally have a substituent.

Regarding the combination of two $R^{Y2}$s in the group represented by $—C(R^{Y2})_2—$ in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, and these groups each optionally have a substituent. The two groups $R^{Y2}$ may be combined together to form a ring together with the atoms to which they are attached, and when the groups $R^{Y2}$ form a ring, the group represented by $—C(R^{Y2})_2—$ is preferably a group represented by the formula (Y-A1) to (Y-A5), more preferably a group represented by the formula (Y-A4), and these groups each optionally have a substituent.

(Y-A1)

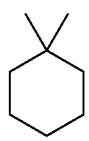

(Y-A2)

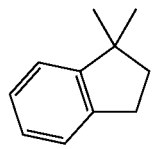

(Y-A3)

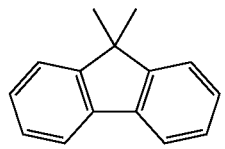

(Y-A4)

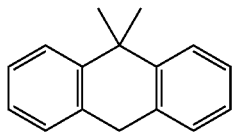
(Y-A5)

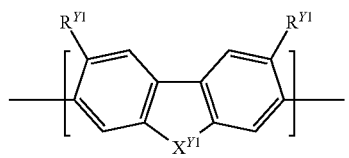
(Y-2')

[wherein, $R^{Y1}$ and $X^{Y1}$ represent the same meaning as described above.]

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, and these groups each optionally have a substituent.

Four $R^{Y2}$s in the group represented by —C($R^{Y2}$)$_2$—C($R^{Y2}$)$_2$— in $X^{Y1}$ are preferably an alkyl group or a cycloalkyl group each optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), and these groups each optionally have a substituent.

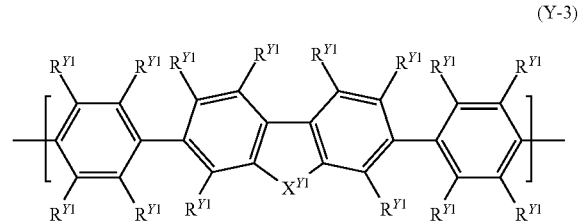
(Y-3)

[wherein, $R^{Y1}$ and $X^{Y1}$ represent the same meaning as described above.]

It is preferable that the constitutional unit represented by the formula (Y-3) is a constitutional unit represented by the formula (Y-3').

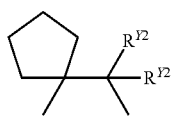

(Y-B1)

(Y-B2)

(Y-B3)

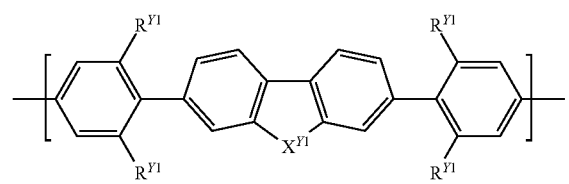
(Y-3')

[wherein, $R^{Y11}$ and $X^{Y1}$ represent the same meaning as described above.]

(Y-B4)

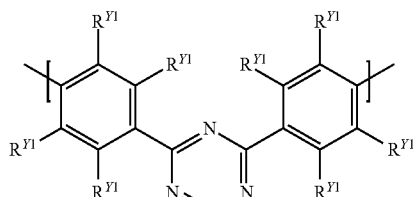
(Y-4)

(Y-B5)

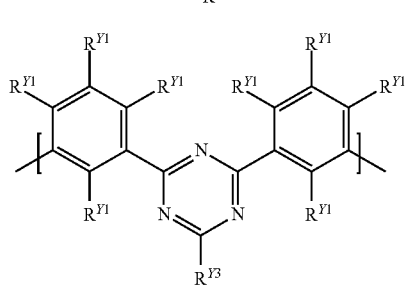
(Y-5)

[wherein, $R^{Y2}$ represents the same meaning as described above.]

It is preferable that the constitutional unit represented by the formula (Y-2) is a constitutional unit represented by the formula (Y-2').

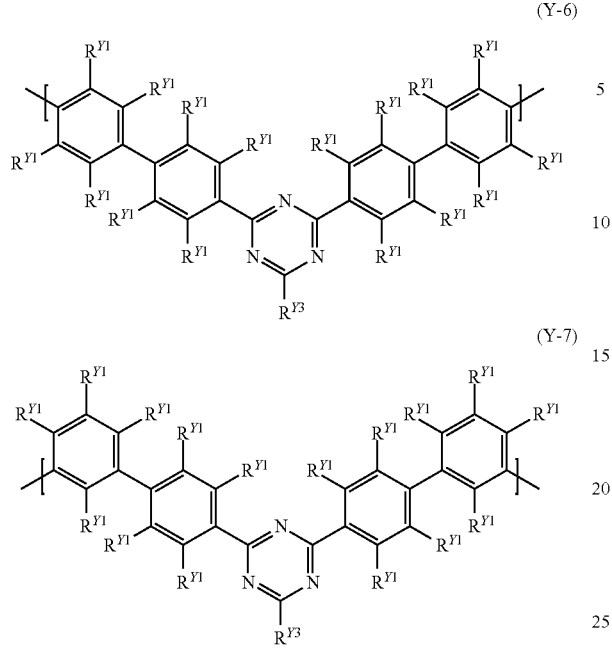

(Y-6)

(Y-7)

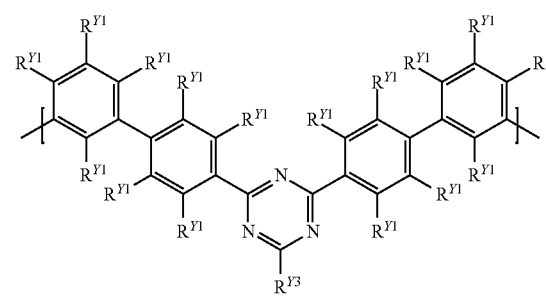

(Y-8)

(Y-9)

(Y-10)

[wherein, $R^{X1}$ represents the same meaning as described above. $R^{Y3}$ represents a hydrogen atom, an alkyl group, a cycloalkyl group, an alkoxy group, a cycloalkoxy group, an aryl group or a monovalent heterocyclic group and these groups each optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and these groups each optionally have a substituent.

It is preferable that the constitutional unit represented by the formula (Y-4) is a constitutional unit represented by the formula (Y-4'), and it is preferable that the constitutional unit represented by the formula (Y-6) is a constitutional unit represented by the formula (Y-6')

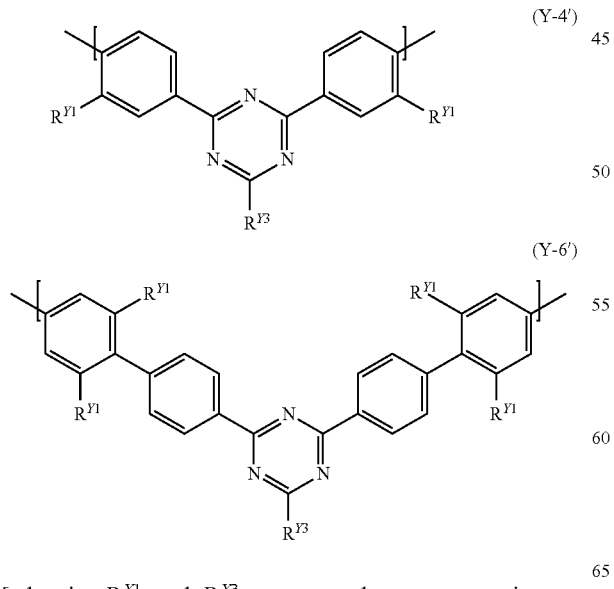

(Y-4')

(Y-6')

[wherein, $R^{Y1}$ and $R^{Y3}$ represent the same meaning as described above.]

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups each optionally have a substituent.

The constitutional unit represented by the formula (Y) includes, for example, a constitutional unit composed of an arylene group represented by the formula (Y-101) to (Y-121), a constitutional unit composed of a divalent heterocyclic group represented by the formula (Y-201) to (Y-206), and a constitutional unit composed of a divalent group in which at least one arylene group and at least one divalent heterocyclic group are bonded directly to each other represented by the formula (Y-301) to (Y-304).

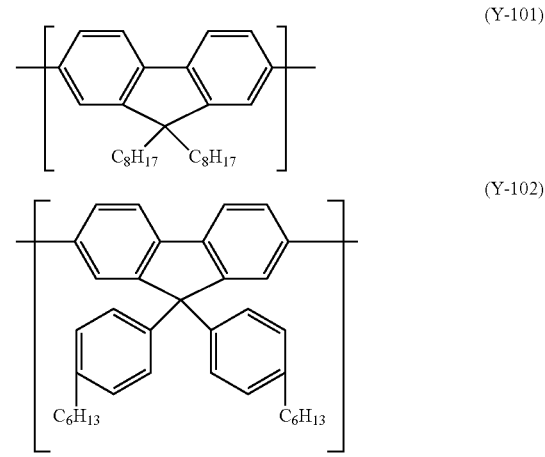

(Y-101)

(Y-102)

(Y-103) 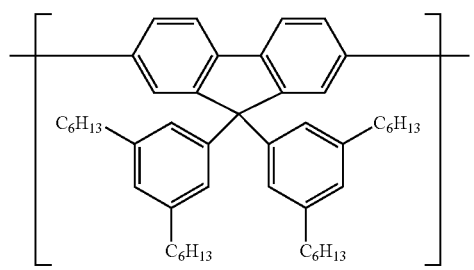
(Y-104) 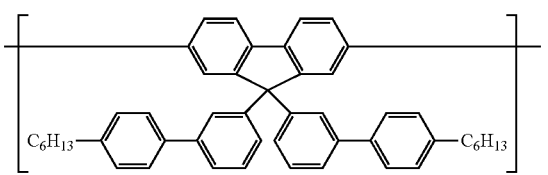
(Y-105) 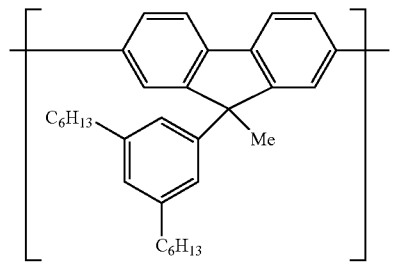
(Y-106) 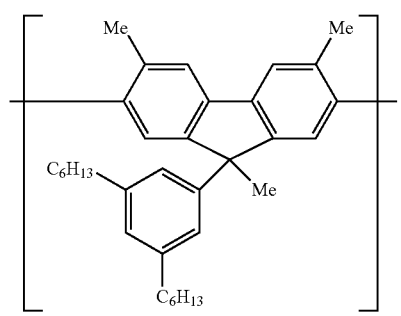
(Y-107) 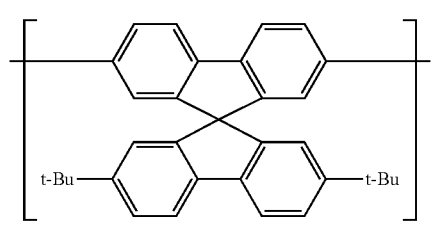
(Y-108) 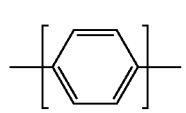
(Y-109) 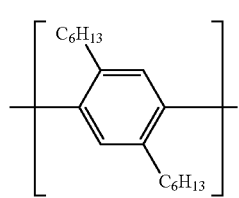
(Y-110) 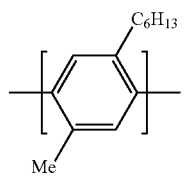
(Y-111) 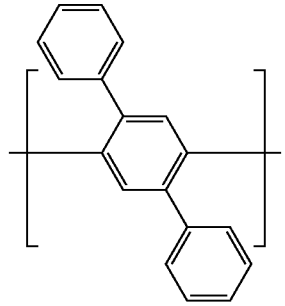
(Y-112) 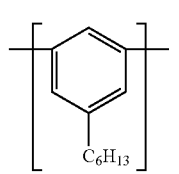
(Y-113) 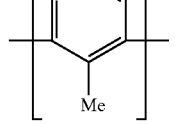
(Y-114) 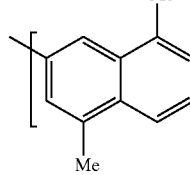
(Y-115) 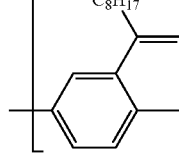
(Y-116) 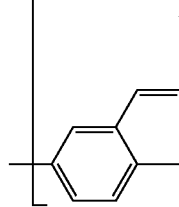
(Y-117)

-continued
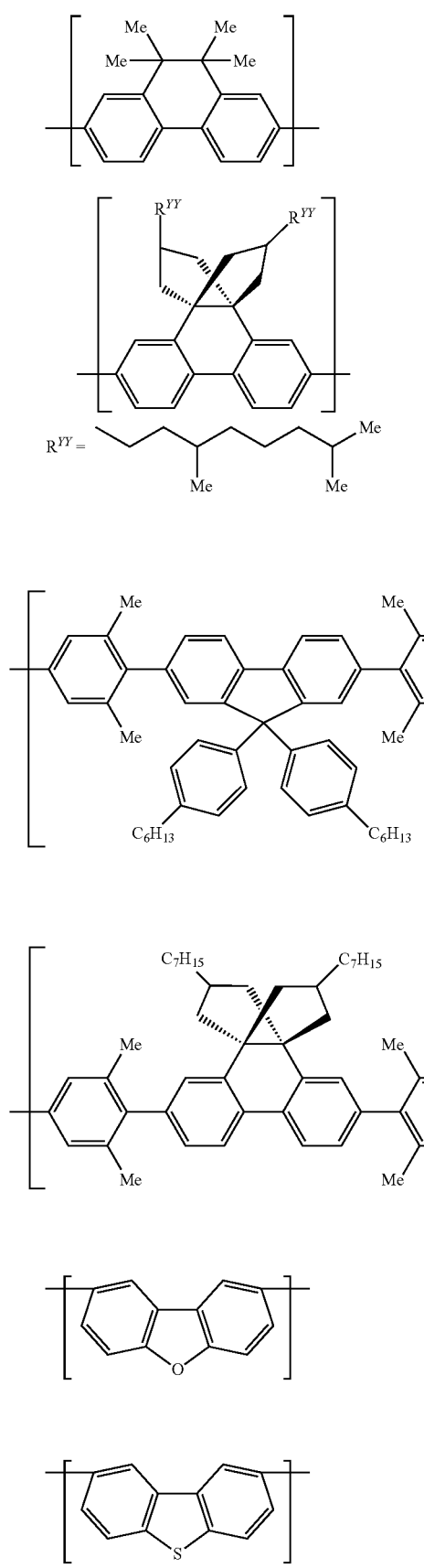
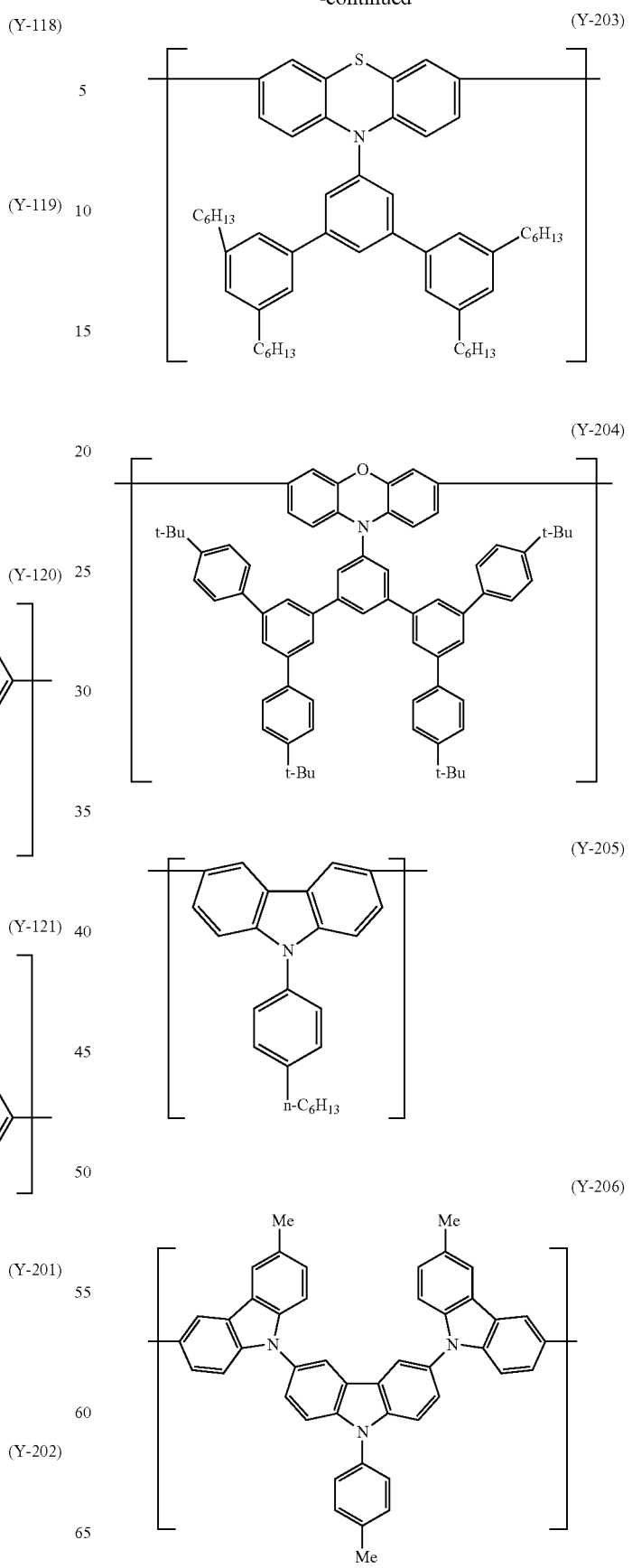

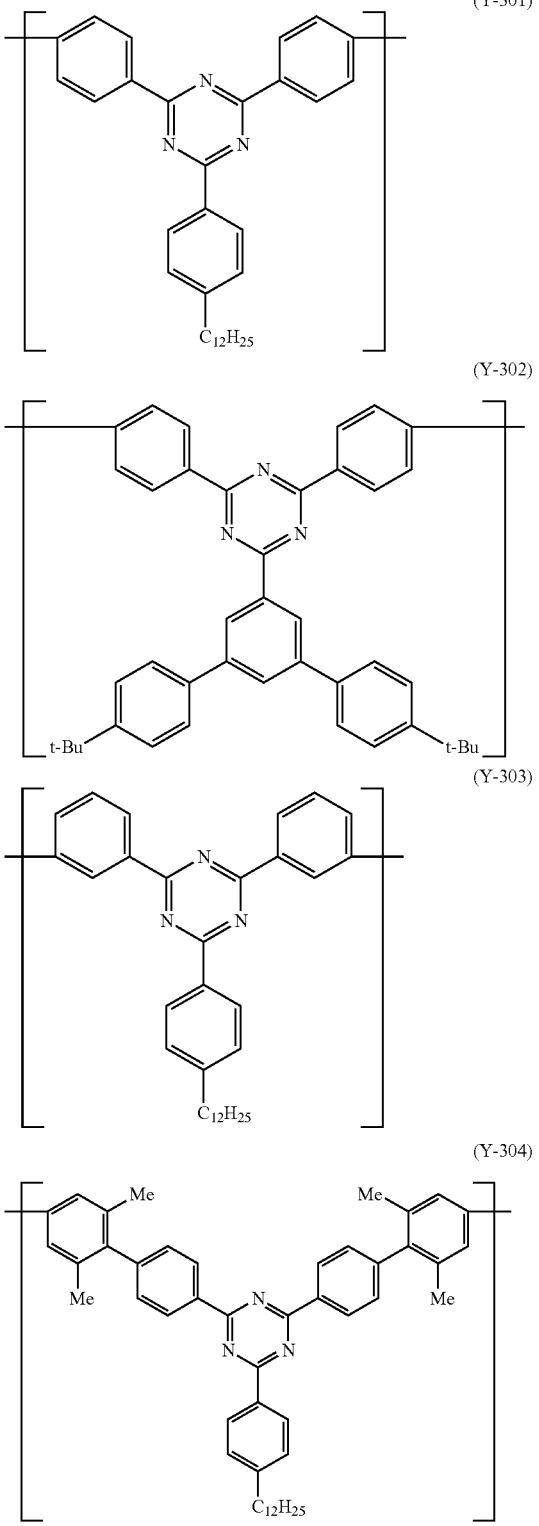

(Y-301)
(Y-302)
(Y-303)
(Y-304)

The amount of the constitutional unit represented by the formula (Y) in which $Ar^{Y1}$ is an arylene group is preferably 0.5 to 95 mol %, more preferably 30 to 95 mol % with respect to the total amount of constitutional units contained in a polymer compound, because the luminance life of a light emitting device produced by using a composition comprising a polymer host and the metal complex of the present invention is excellent.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 50 mol %, more preferably 3 to 20 mol % with respect to the total amount of constitutional units contained in a polymer compound, because the charge transportability of a light emitting device produced by using a composition comprising a polymer host and the metal complex of the present invention is excellent.

The constitutional unit represented by the formula (Y) may be contained only singly or two or more units thereof may be contained in the polymer host.

It is preferable that the polymer host further comprises a constitutional unit represented by the following formula (X), because hole transportability is excellent.

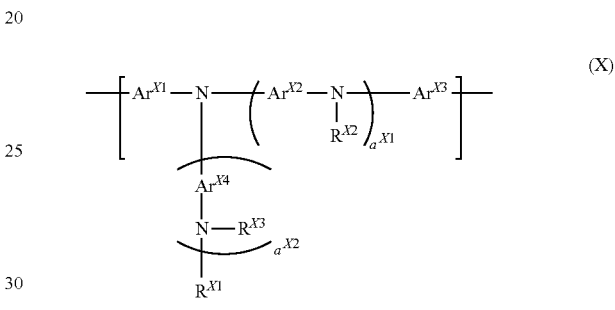

(X)

[wherein, $a^{X1}$ and $a^{X2}$ each independently represent an integer of 0 or more. $Ar^{X1}$ and $Ar^{X3}$ each independently represent an arylene group or a divalent heterocyclic group, and these groups each optionally have a substituent. $Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent. $R^{X1}$, $R^{X2}$ and $R^{X3}$ each independently represent a hydrogen atom, an alkyl group, a cycloalkyl group, an aryl group or a monovalent heterocyclic group, and these groups each optionally have a substituent.]

$a^{X1}$ is preferably 2 or less, more preferably 1, because the luminance life of a light emitting device produced by using a composition comprising a polymer host and the metal complex of the present invention is excellent.

$a^{X2}$ is preferably 2 or less, more preferably 0, because the luminance life of a light emitting device produced by using a composition comprising a polymer host and the metal complex of the present invention is excellent.

$R^{X1}$, $R^{X2}$ and $R^{X3}$ are preferably an alkyl group, a cycloalkyl group, an aryl group or a monovalent heterocyclic group, more preferably an aryl group, and these groups each optionally have a substituent.

The arylene group represented by $Ar^{X1}$ and $Ar^{X3}$ is more preferably a group represented by the formula (A-1) or the formula (A-9), further preferably a group represented by the formula (A-1), and these groups each optionally have a substituent.

The divalent heterocyclic group represented by $Ar^{X1}$ and $Ar^{X3}$ is more preferably a group represented by the formula (AA-1), the formula (AA-2) or the formula (AA-7) to (AA-26), and these groups each optionally have a substituent.

Ar$^{X1}$ and Ar$^{X3}$ are preferably an arylene group optionally having a substituent.

The arylene group represented by Ar$^{X2}$ and Ar$^{X4}$ is more preferably a group represented by the formula (A-1), the formula (A-6), the formula (A-7), the formula (A-9) to (A-11) or the formula (A-19), and these groups each optionally have a substituent.

The more preferable range of the divalent heterocyclic group represented by Ar$^{X2}$ and Ar$^{X4}$ is the same as the more preferable range of the divalent heterocyclic group represented by Ar$^{X1}$ and Ar$^{X3}$.

The more preferable range and the further preferable range of the arylene group and the divalent heterocyclic group in the divalent group in which at least one arylene group and at least one divalent heterocyclic group are bonded directly to each other represented by Ar$^{X2}$ and Ar$^{X4}$ are the same as the more preferable range and the further preferable range of the arylene group and the divalent heterocyclic group represented by Ar$^{X1}$ and Ar$^{X3}$, respectively.

The divalent group in which at least one arylene group and at least one divalent heterocyclic group are bonded directly to each other represented by Ar$^{X2}$ and Ar$^{X4}$ includes the same groups as the divalent group in which at least one arylene group and at least one divalent heterocyclic group are bonded directly to each other represented by Ar$^{Y1}$ in the formula (Y).

Ar$^{X2}$ and Ar$^{X4}$ are preferably an arylene group optionally having a substituent.

The substituent which the group represented by Ar$^{X1}$ to Ar$^{X4}$ and R$^{X1}$ to R$^{X3}$ optionally has is preferably an alkyl group, a cycloalkyl group or an aryl group, and these groups each optionally further have a substituent.

The constitutional unit represented by the formula (X) is preferably a constitutional unit represented by the formula (X-1) to (X-7), more preferably a constitutional unit represented by the formula (X-1) to (X-6), further preferably a constitutional unit represented by the formula (X-3) to (X-6).

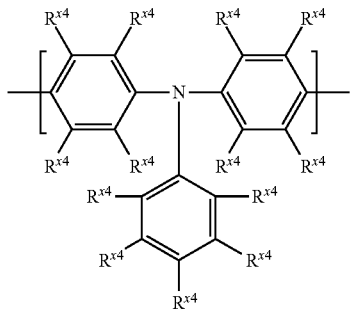

(X-1)

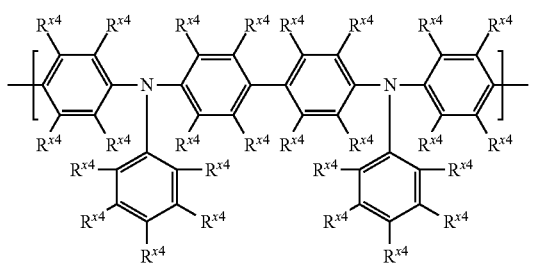

(X-2)

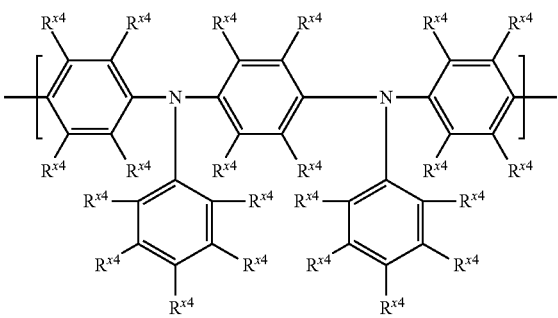

(X-3)

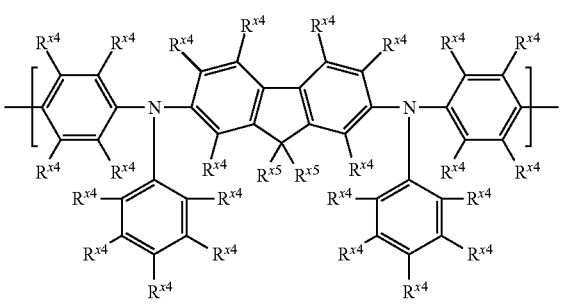

(X-4)

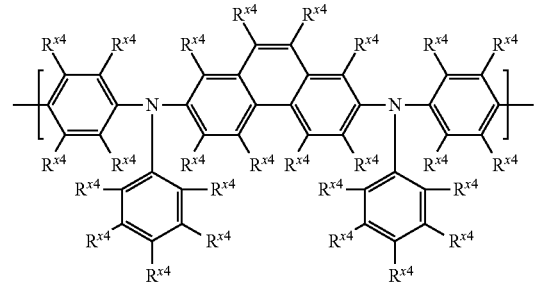

(X-5)

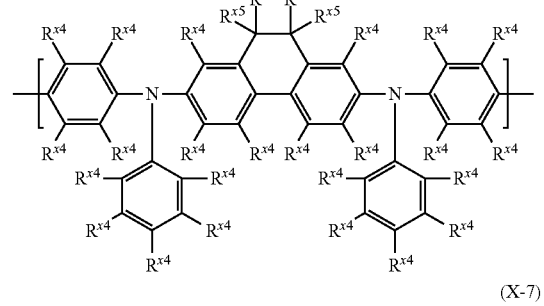

(X-6)

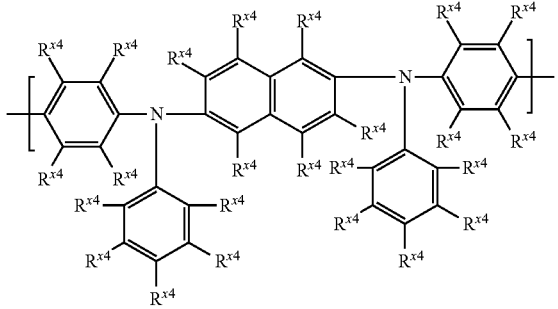

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and these groups each optionally have a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The amount of the constitutional unit represented by the formula (X) is preferably 0.1 to 30 mol %, more preferably 1 to 25 mol %, further preferably 3 to 20 mol % with respect to the total amount of constitutional units contained in a polymer host, because hole transportability is excellent.

The constitutional unit represented by the formula (X) includes, for example, constitutional units represented by the formulae (X1-1) to (X1-11), preferably constitutional units represented by the formulae (X1-3) to (X1-10).

(X1-1)

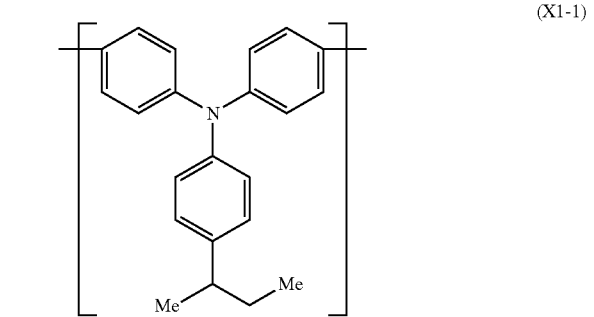

(X1-2)

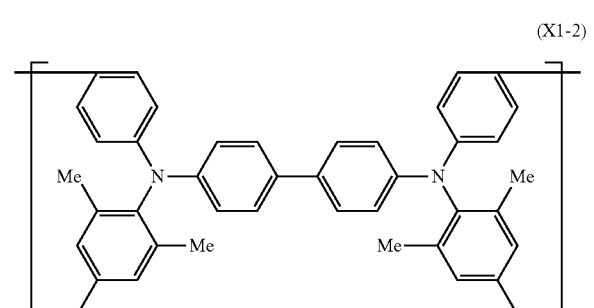

(X1-3)

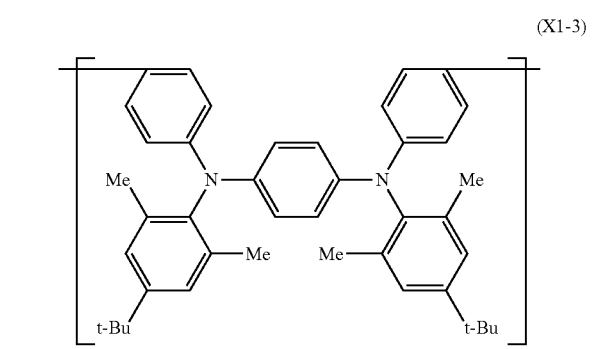

(X1-4)

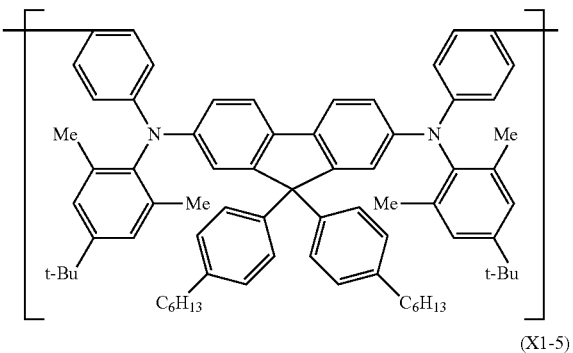

(X1-5)

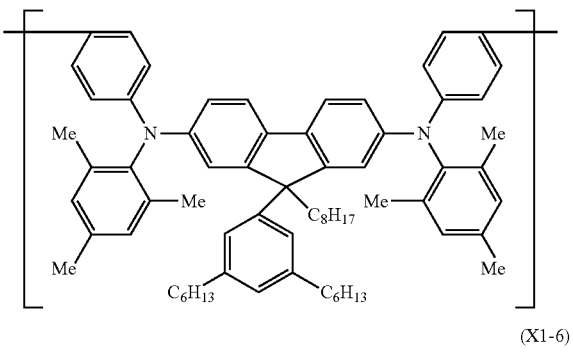

(X1-6)

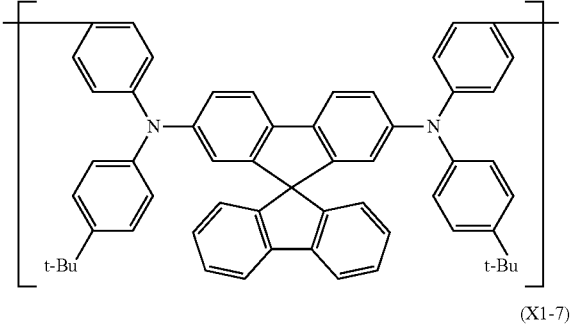

(X1-7)

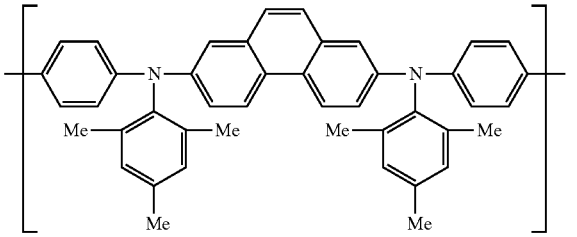

(X1-8)

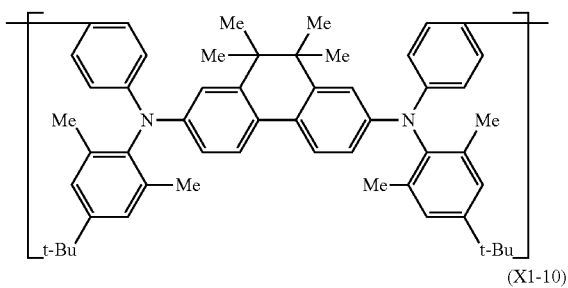

(X1-9)

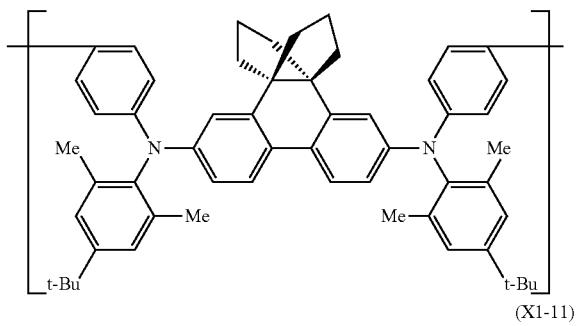

(X1-10)

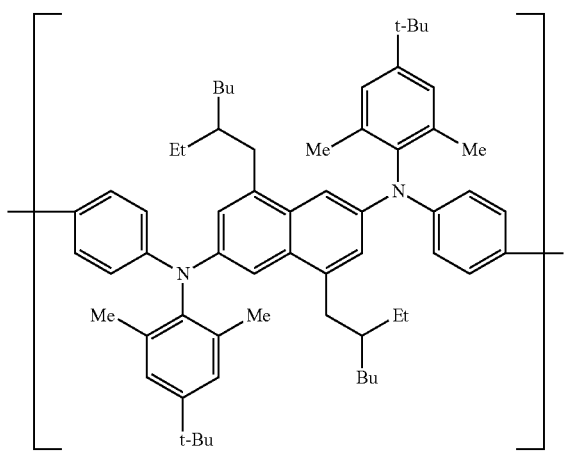

(X1-11)

The constitutional unit represented by the formula (X) may be contained only singly or two or more units thereof may be contained in the polymer host.

Examples of the polymer host include polymer compounds P-1 to P-6 in the following Table 1. "Other" constitutional unit denotes a constitutional unit other than the constitutional unit represented by the formula (Y) and the constitutional unit represented by the formula (X).

TABLE 1

| polymer compound | constitutional unit and mole fraction thereof | | | | |
|---|---|---|---|---|---|
| | formula (Y) | | | formula (X) | |
| | formulae (Y-1) to (Y-3) p | formulae (Y-4) to (Y-7) q | formulae (Y-8) to (Y-10) r | formulae (X-1) to (X-7) s | other t |
| P-1 | 0.1 to 99.9 | 0.1 to 99.9 | 0 | 0 | 0 to 30 |
| P-2 | 0.1 to 99.9 | 0 | 0.1 to 99.9 | 0 | 0 to 30 |
| P-3 | 0.1 to 99.8 | 0.1 to 99.8 | 0 | 0.1 to 99.8 | 0 to 30 |
| P-4 | 0.1 to 99.8 | 0.1 to 99.8 | 0.1 to 99.8 | 0 | 0 to 30 |

TABLE 1-continued

| polymer compound | constitutional unit and mole fraction thereof | | | | |
|---|---|---|---|---|---|
| | formula (Y) | | | formula (X) | |
| | formulae (Y-1) to (Y-3) p | formulae (Y-4) to (Y-7) q | formulae (Y-8) to (Y-10) r | formulae (X-1) to (X-7) s | other t |
| P-5 | 0.1 to 99.8 | 0 | 0.1 to 99.8 | 0.1 to 99.8 | 0 to 30 |
| P-6 | 0.1 to 99.7 | 0.1 to 99.7 | 0.1 to 99.7 | 0.1 to 99.7 | 0 to 30 |

[In the table, p, q, r, s and t represent the mole fraction of each constitutional unit. p+q+r+s+t=100, and 100 ≥ p+q+r+s≥70. Other constitutional unit denotes a constitutional unit other than the constitutional unit represented by the formula (Y) and the constitutional unit represented by the formula (X).]

The polymer host is preferably a polymer compound P-1 or a polymer compound P-3, because a light emitting device produced by using a composition comprising the metal complex of the present invention and the polymer host is more excellent in driving voltage. As the polymer compound P-1, a polymer compound P-1A or a polymer compound P-1B in Table 2 described below is preferable. As the polymer compound P-3, a polymer compound P-3A in Table 2 described below is preferable. When the metal complex of the present invention shows blue light emission, it is preferable to combine the metal complex with a polymer compound P-1A or P-1B. When the metal complex of the present invention shows green light emission, it is preferable to combine the metal complex with a polymer compound P-1A. Further, when the metal complex of the present invention shows red light emission, it is preferable to combine the metal complex with a polymer compound P-3A.

TABLE 2

| polymer compound | constitutional unit and mole fraction thereof | | | | |
|---|---|---|---|---|---|
| | formula (Y) | | | formula (X) | |
| | formulae (Y-1) to (Y-3) p | formulae (Y-4) to (Y-7) q | formulae (Y-8) to (Y-10) r | formulae (X-1) to (X-7) s | other t |
| P-1A | 70 to 95 | 5 to 30 | 0 | 0 | 0 to 30 |
| P-1B | 0.1 to 70 | 30 to 99.9 | 0 | 0 | 0 to 30 |
| P-3A | 77 to 94 | 3 to 20 | 0 | 3 to 20 | 0 to 30 |

[In the table, p, q, r, s and t represent the same meaning as described above.]

The polymer host may be any of a block copolymer, a random copolymer, an alternating copolymer or a graft copolymer, and may also be another embodiment, and is preferably a copolymer produced by copolymerizing a plurality of raw material monomers.

<Production Method of Polymer Host>

The polymer host can be produced by using a known polymerization method described in Chem. Rev., vol. 109, pp. 897-1091 (2009) and the like, and specifically, the production method includes methods of causing polymerization by a coupling reaction using a transition metal catalyst such as the Suzuki reaction, the Yamamoto reaction, the Buchwald reaction, the Stille reaction, the Negishi reaction and the Kumada reaction.

In the above-described polymerization method, the method of charging monomers includes, for example, a method in which the total amount of monomers is charged in a lump into the reaction system, a method in which monomers are partially charged and reacted, then, the remaining monomers are charged in a lump, continuously or in divided doses, and a method in which monomers are charged continuously or in divided doses.

The transition metal catalyst is not particularly restricted and includes, for example, a palladium catalyst and a nicked catalyst.

For the post treatment of the polymerization reaction, known methods, for example, a method of removing water-soluble impurities by liquid-separation, a method in which the reaction solution after the polymerization reaction is added to a lower alcohol such as methanol to cause deposition of a precipitate which is then filtrated before drying, and other methods, are used each singly or combined. When the purity of the polymer host is low, the polymer host can be purified by usual methods such as, for example, recrystallization, reprecipitation, continuous extraction with a Soxhlet extractor and column chromatography.

In examples of the present specification, polymerization methods utilizing the Suzuki coupling reaction using a palladium catalyst are shown as one example of the method of producing the polymer compound of the present invention.

The composition comprising the metal complex of the present invention and a solvent (hereinafter, referred to as "ink" in some cases) is suitable for fabrication of a light emitting device by using a printing method such as an inkjet printing method and a nozzle printing method.

The viscosity of the ink may be adjusted depending on the kind of the printing method, and when a solution goes through a discharge apparatus such as in an inkjet printing method, the viscosity is preferably in the range of 1 to 20 mPa·s at 25° C. for preventing curved aviation and clogging in discharging.

As the solvent contained in the ink, those capable of dissolving or uniformly dispersing solid components in the ink are preferable. The solvent includes, for example, chlorine-based solvents such as 1,2-dichloroethane, 1,1,2-trichloroethane, chlorobenzene and o-dichlorobenzene; ether solvents such as tetrahydrofuran, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-dodecane and bicyclohexyl; ketone solvents such as acetone, methylethylketone, cyclohexanone and acetophenone; ester solvents such as ethyl acetate, butyl acetate, ethylcellosolve acetate, methyl benzoate and phenyl acetate; poly-hydric alcohols such as ethylene glycol, glycerin and 1,2-hexanediol and derivatives thereof; alcohol solvents such as isopropanol and cyclohexanol; sulfoxide solvents such as dimethyl sulfoxide; and amide solvents such as N-methyl-2-pyrrolidone and N,N-dimethylformamide. These solvents may be used singly or two or more of them may be used in combination.

In the ink, the compounding amount of the solvent is usually 1000 to 100000 parts by weight, preferably 2000 to 20000 parts by weight with respect to 100 parts by weight of the metal complex of the present invention.

[Hole Transporting Material]

The hole transporting material is classified into low molecular weight compounds and polymer compounds, and polymer compounds are preferable, and polymer compounds having a crosslinkable group are more preferable.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene, trinitrofluorenone, preferably fullerene.

In the composition of the present invention, the compounding amount of the hole transporting material is usually 1 to 400 parts by weight, preferably 5 to 150 parts by weight with respect to 100 parts by weight of the metal complex of the present invention.

The hole transporting material may be used singly or two or more hole transporting materials may be used in combination.

[Electron Transporting Material]

The electron transporting material is classified into low molecular weight compounds and polymer compounds. The electron transporting material optionally has a crosslinkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the compounding amount of the electron transporting material is usually 1 to 400 parts by weight, preferably 5 to 150 parts by weight with respect to 100 parts by weight of the metal complex of the present invention.

The electron transporting material may be used singly or two or more electron transporting materials may be used in combination.

[Hole Injection Material and Electron Injection Material]

The hole injection material and the electron injection material are each classified into low molecular weight compounds and polymer compounds. The hole injection material and the electron injection material optionally have a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising a group represented by the formula (X) in the side chain or main chain.

In the composition of the present invention, the compounding amounts of the hole injection material and the electron injection material are each usually 1 to 400 parts by weight, preferably 5 to 150 parts by weight with respect to 100 parts by weight of the metal complex of the present invention.

The hole injection material and the electron injection material may each be used singly or two or more of them may be used in combination.

[Ion Dope]

When the hole injection material or the electron injection material comprises an electrically conductive polymer, the electric conductivity of the electrically conductive polymer is preferably $1\times10^{-5}$ S/cm to $1\times10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly or two or more ions to be doped may be used.

[Light Emitting Material]

The light emitting material (the light emitting material is different form the metal complex of the present invention) is classified into low molecular weight compounds and polymer compounds. The light emitting material optionally has a crosslinkable group.

The low molecular weight compound includes, for example, naphthalene and derivatives thereof, anthracene and derivatives thereof, perylene and derivatives thereof, and, triplet light emitting complexes having iridium, platinum or europium as the central metal.

The polymer compound includes, for example, polymer compounds comprising a phenylene group, a naphthalenediyl group, an anthracenediyl group, a fluorenediyl group, a phenanthrenediyl group, dihydrophenanthrenediyl group, a group represented by the formula (X), a carbazolediyl group, a phenoxazinediyl group, a phenothiazinediyl group, a pyrenediyl group and the like.

The light emitting material may comprise a low molecular weight compound and a polymer compound, and preferably, comprises a triplet light emitting complex and a polymer compound.

The triplet light emitting complex includes, for example, metal complexes listed below.

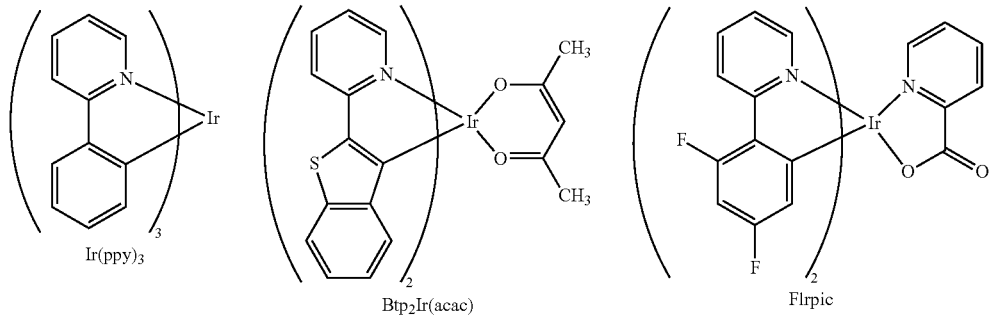

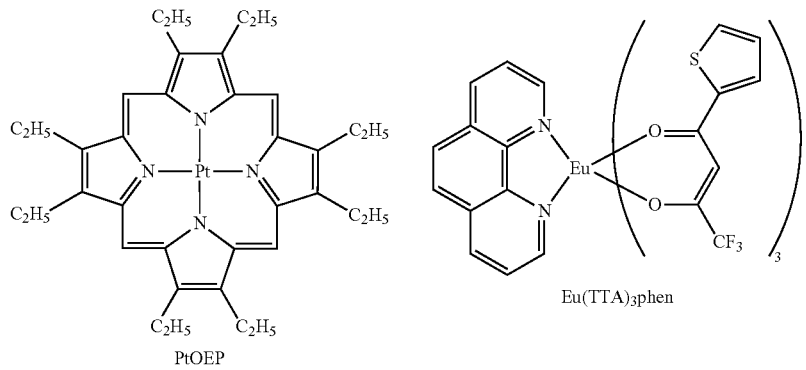

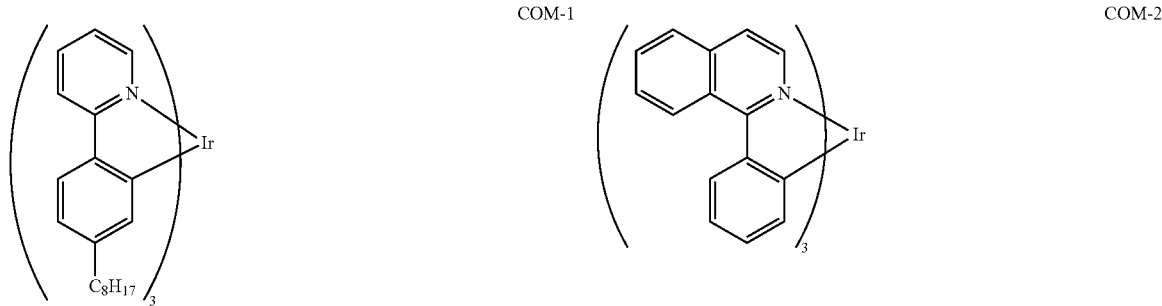

-continued
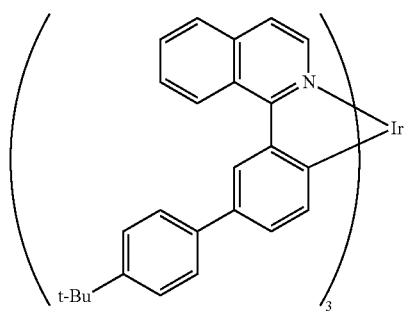 COM-3
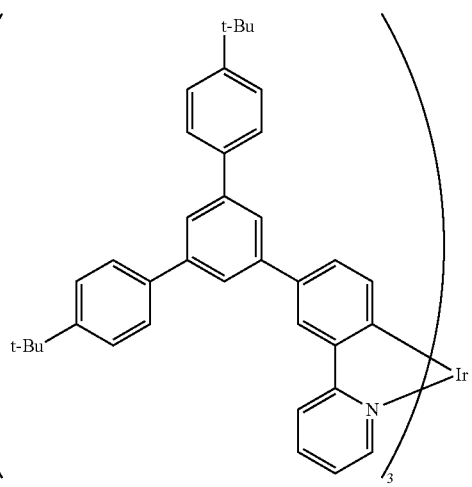 COM-4
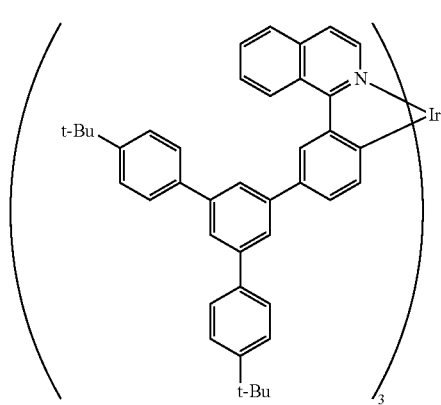 COM-5
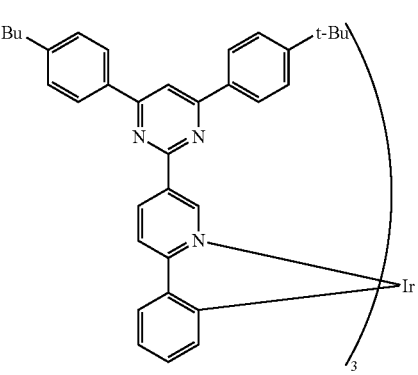 COM-6
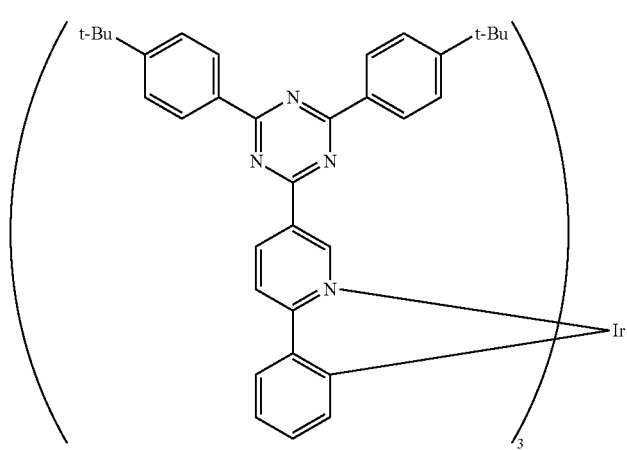 COM-7

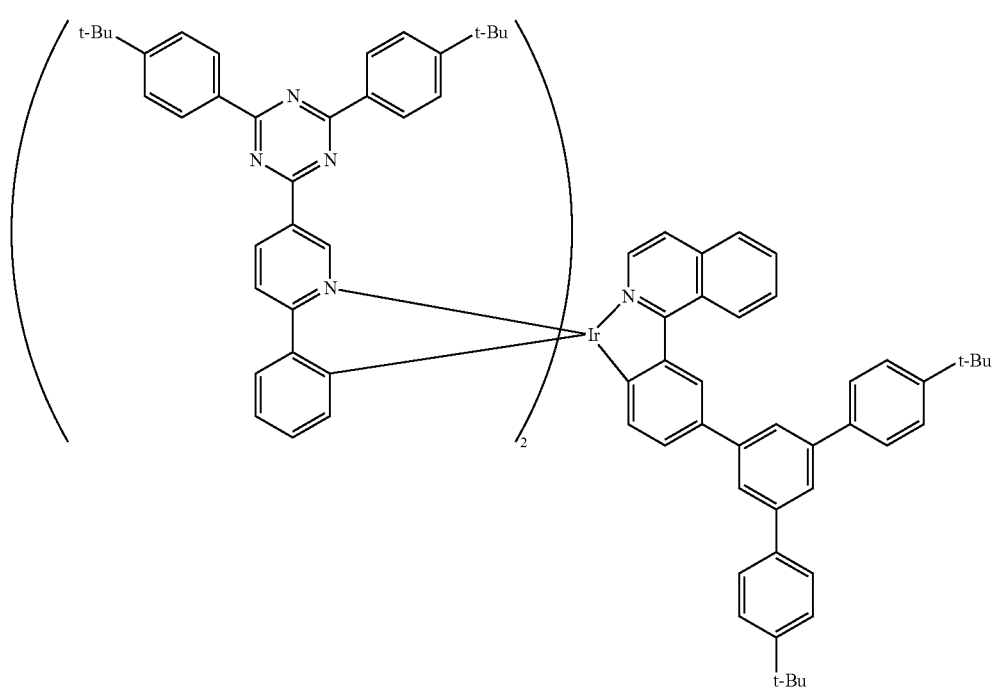

COM-8

In the composition of the present invention, the compounding amount of the light emitting material is usually 0.1 to 400 parts by weight with respect to 100 parts by weight of the metal complex of the present invention.

[Antioxidant]

The antioxidant may advantageously be one which is soluble in the same solvent as for the metal complex of the present invention and does not disturb light emission and charge transportation, and the examples thereof include phenol antioxidants and phosphorus-based antioxidants.

In the composition of the present invention, the compounding amount of the antioxidant is usually 0.001 to 10 parts by weight with respect to 100 parts by weight of the metal complex of the present invention.

The antioxidant may be used singly or two or more antioxidants may be used in combination.

<Film>

The film comprises the metal complex of the present invention.

The film also includes an insolubilized film produced by insolubilizing the metal complex of the present invention in a solvent by crosslinking. The insolubilized film is a film produced by crosslinking the metal complex of the present invention by an external stimulus such as heating and light irradiation. The insolubilized film can be suitably used for lamination of a light emitting device because the insolubilized film is substantially insoluble in a solvent.

The heating temperature for crosslinking the film is usually 25 to 300° C., and because the external quantum efficiency is improved, preferably 50 to 250° C., more preferably 150 to 200° C.

The kind of light used in light irradiation for crosslinking the film includes, for example, ultraviolet light, near-ultraviolet light and visible light.

The film is suitable as a light emitting layer in a light emitting device.

The film can be fabricated, for example, by a spin coating method, a casting method, a micro gravure coating method, a gravure coating method, a bar coating method, a roll coating method, a wire bar coating method, a dip coating method, a spray coating method, a screen printing method, a flexo printing method, an offset printing method, an inkjet printing method, a capillary coating method or a nozzle coating method, using the ink.

The thickness of the film is usually 1 nm to 10 Um.

<Light Emitting Device>

The light emitting device of the present invention is a light emitting device produced by using the metal complex of the present invention, and may be one in which the metal complexes of the present invention are intramolecularly or intermolecularly cross-linked, or one in which the metal complexes of the present inventions are intramolecularly and intermolecularly cross-linked.

The constitution of the light emitting device of the present invention comprises, for example, electrodes consisting of an anode and a cathode, and a layer produced by using the metal complex of the present invention disposed between the electrodes.

[Layer Constitution]

The layer produced by using the metal complex of the present invention is usually at least one selected from a light emitting layer, a hole transporting layer, a hole injection layer, an electron transporting layer and an electron injection layer, preferably a light emitting layer. These layers comprise a light emitting material, a hole transporting material, a hole injection material, an electron transporting material and an electron injection material, respectively. These layers can be formed by the same method as the above-described film fabrication using inks prepared by dissolving a light emitting material, a hole transporting material, a hole injection material, an electron transporting material and an electron injection material, respectively, in the solvent described above.

The light emitting device comprises a light emitting layer between an anode and a cathode. The light emitting device of the present invention preferably comprises at least one of a hole injection layer and a hole transporting layer between an anode and a light emitting layer from the standpoint of hole injectability and hole transportability, and preferably comprises at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the metal complex of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslinkable group to avoid dissolution of the materials in the solvent. After forming the layers using the materials having a crosslinkable group, the layers can be insolubilized by crosslinking the crosslinkable group.

Methods of forming respective layers such as a light emitting layer, a hole transporting layer, an electron transporting layer, a hole injection layer and an electron injection layer in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

The order and the number of layers to be laminated and the thickness of each layer may be controlled in view of external quantum efficiency and device life.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium.tin.oxide (ITO) and indium.zinc.oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

[Use]

For producing planar light emission by using a light emitting device, a planar anode and a planar cathode are disposed so as to overlap with each other. Patterned light emission can be produced by a method of placing a mask with a patterned window on the surface of a planer light emitting device, a method of forming extremely thick a layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

EXAMPLES

The present invention will be illustrated further in detail by examples below, but the present invention is not limited to these examples.

In the present examples, the polystyrene-equivalent number average molecular weight (Mn) and the polystyrene-equivalent weight average molecular weight (Mw) of a polymer compound were measured by size exclusion chromatography (SEC) (manufactured by Shimadzu Corp., trade name: LC-10Avp). SEC measurement conditions are as described below.

[Measurement Condition]

The polymer compound to be measured was dissolved in tetrahydrofuran at a concentration of about 0.05 wt %, and 10 μL of the solution was injected into SEC. As the mobile phase of SEC, tetrahydrofuran was used and allowed to flow at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

Measurement of LC-MS was carried out according to the following method.

A measurement sample was dissolved in chloroform or tetrahydrofuran so as to give a concentration of about 2 mg/mL, and about 1 μL of the solution was injected into LC-MS (manufactured by Agilent Technologies, trade name: 1100LCMSD). As the mobile phase of LC-MS, acetonitrile and tetrahydrofuran were used while changing the ratio thereof and allowed to flow at a flow rate of 0.2 mL/min. As the column, L-column 2 ODS (3 μm) (manufactured by Chemicals Evaluation and Research Institute, internal diameter: 2.1 mm, length: 100 mm, particle size: 3 μm) was used.

Measurement of NMR was carried out according to the following method.

5 to 10 mg of a measurement sample was dissolved in about 0.5 mL of deuterated chloroform (CDCl$_3$), deuterated tetrahydrofuran (THF-d$_6$) or deuterated methylene chloride (CD$_2$Cl$_2$), and measurement was performed using an NMR apparatus (manufactured by Agilent, Inc., trade name: INOVA 300).

As the index of the purity of a compound, a value of the high performance liquid chromatography (HPLC) area percentage was used. This value is a value in high performance liquid chromatography (HPLC, manufactured by Shimadzu Corp., trade name: LC-20A) at 254 nm, unless otherwise state. In this operation, the compound to be measured was dissolved in tetrahydrofuran or chloroform so as to give a concentration of 0.01 to 0.2 wt %, and depending on the concentration, 1 to 10 μL of the solution was injected into HPLC. As the mobile phase of HPLC, acetonitrile and tetrahydrofuran were used and allowed to flow at a flow rate of 1 mL/min as gradient analysis of acetonitrile/tetrahydrofuran=100/0 to 0/100 (volume ratio). As the column, Kaseisorb LC ODS 2000 (manufactured by Tokyo Chemical Industry Co., Ltd.) or an ODS column having an equivalent performance was used. As the detector, a photo diode array detector (manufactured by Shimadzu Corp., trade name: SPD-M20A) was used.

TLC-MS measurement was performed by the following method.

A measurement sample was dissolved in toluene, tetrahydrofuran or chloroform, the solution was applied on a TLC plate for DART (manufactured by Techno Applications, YSK5-100), and measurement was performed using TLC-MS (manufactured by JEOL Ltd., trade name: JMS-T100TD (The AccuTOF TLC)). The temperature of a helium gas in measurement was controlled in a range of 200 to 400° C.

<Example 1> Synthesis of Compound S1 and Metal Complex M1

Synthesis of Compound S1

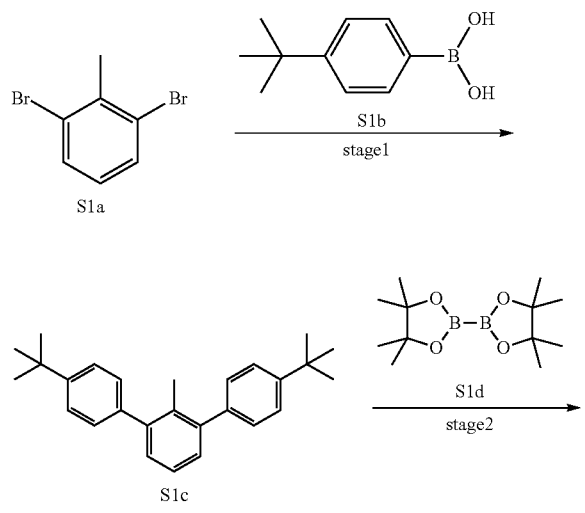

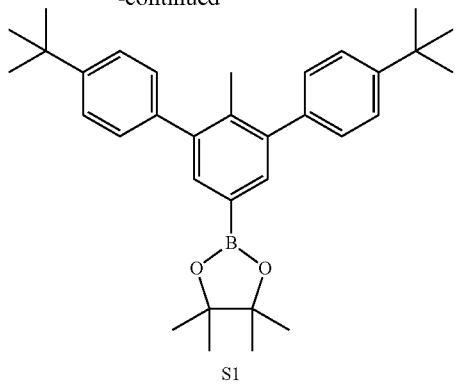

<Stage 1>

An argon gas atmosphere was prepared in a reaction vessel, then, a compound S1a (30.0 g), a compound S1b (44.9 g), bis[tris(2-methoxyphenyl)phosphine]palladium dichloride (215 mg), a 20 wt % tetraethylammonium hydroxide aqueous solution (266.3 g) and toluene (480 mL) were added and stirred for 4.5 hours under reflux with heating. The resultant reaction mixture was liquid-separated, thereby obtaining an organic layer. The resultant organic layer was washed with ion-exchanged water twice, washed with 5 wt % saline twice, dried over anhydrous sodium sulfate, then, the solution was allowed to pass through a filter paved with silica gel and celite, to remove solid components. The resultant filtrate was concentrated under reduced pressure, then, purified by recrystallization (toluene/acetonitrile), further, dried under reduced pressure at 50° C. overnight, thereby obtaining a compound S1c (33.3 g) as a white solid. The yield was 78%. The compound S1c showed an HPLC area percentage value (detection wavelength UV: 254 nm) of 99.5% or more.

TLC/MS (DART positive): m/z=357[M+H]$^+$

<Stage 2>

An argon gas atmosphere was prepared in a reaction vessel, then, a compound S1c (5.01 g), a compound S1d (4.00 g), (1,5-cyclooctadiene)(methoxy)iridium(I) (dimer) (0.140 g), 4,4'-di-tert-butyl-2,2'-bipyridyl (0.115 g) and cyclohexane (70 mL) were added and the mixture was stirred for 4.5 hours under reflux with heating. To the resultant reaction mixture was added silica gel and the mixture was stirred for 30 minutes, then, the solution was allowed to pass through a filter paved with silica gel, to remove solid components. The resultant filtrate was concentrated under reduced pressure, then, acetonitrile was added, and the solution was stirred at room temperature to cause deposition of a solid which was then isolated by filtration, and dried under reduced pressure at 50° C. overnight, thereby obtaining an intended substance compound S1 (5.06 g) as a white solid. The yield was 74%. The resultant compound S1 showed an HPLC area percentage value (detection wavelength UV: 254 nm) of 99.3%. This operation was repeated, thereby obtaining a necessary amount of the compound S1.

TLC/MS (DART positive): m/z=482[M]$^+$

LC/MS (ESI positive): m/z=521[M+K]$^+$ $^1$H-NMR (CD$_2$Cl$_2$, 300 MHz): δ (ppm)=7.57 (s, 2H), 7.45 (d, 4H), 7.29 (d, 4H), 2.16 (s, 3H), 1.37 (s, 18H), 1.30 (s, 12H).

Synthesis of Metal Complex M1
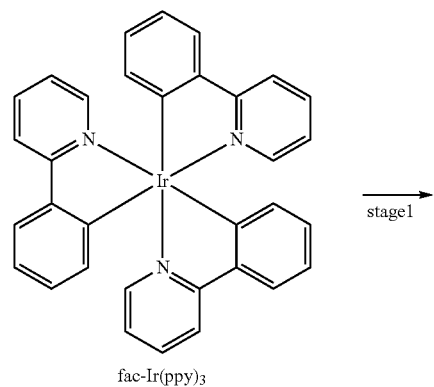
fac-Ir(ppy)₃
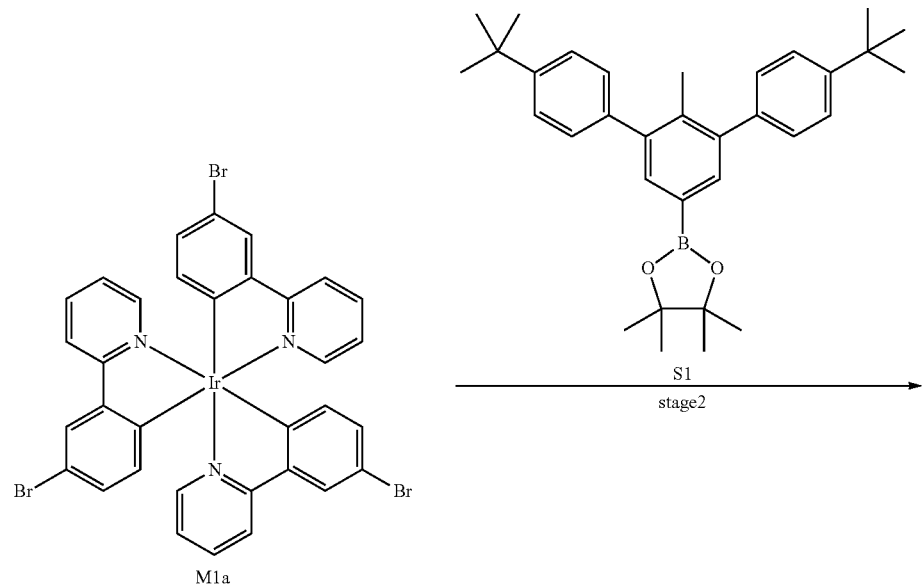
M1a
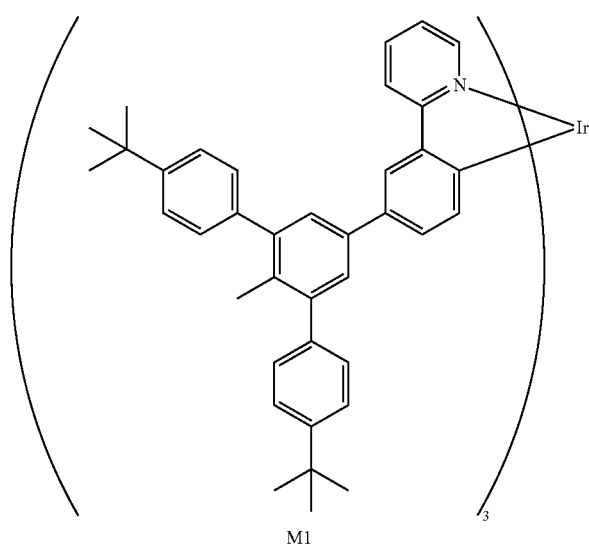
M1

<Stage 1>

A nitrogen gas atmosphere was prepared in a reaction vessel, then, fac-Ir(ppy)$_3$ (40.0 g), dichloromethane (8 L) and N-bromosuccinimide (47.1 g) were added, and the mixture was stirred for 68 hours. Thereafter, the deposited solid was isolated by filtration, washed with dichloromethane, dried under reduced pressured at 45° C. overnight, thereby obtaining a compound Mia (26.4 g) as a yellow solid. The yield was 48%. The resultant compound showed an HPLC area percentage value (detection wavelength UV: 280 nm) of 97%.

<Stage 2>

An argon gas atmosphere was prepared in a light-shielded reaction vessel, then, the compound Mia (2.00 g), a compound S1 (6.49 g) synthesized by the same method as described above, tetrahydrofuran (91 mL), tetrakis(triphenylphosphine)palladium(0) (0.30 g) and a 20 wt % tetraethylammonium hydroxide aqueous solution (8.25 g) were added, and the mixture was stirred for 36 hours under reflux with heating. The resultant reaction mixture was liquid-separated, thereby obtaining an organic layer. The resultant organic layer was washed with ion-exchanged water twice, washed with 5 wt % saline twice, dried over anhydrous sodium sulfate, then, the solution was allowed to pass through a filter paved with silica gel and celite, to remove solid components. The resultant filtrate was concentrated under reduced pressure, then, purified by silica gel column chromatography (hexane/chloroform), thereby obtaining a fraction containing an intended substance. The resultant fraction was concentrated under reduced pressure, further, purified by recrystallization (toluene/acetonitrile), then, dried under reduced pressure at 50° C. overnight, thereby obtaining an intended substance metal complex M1 (1.05 g) as a yellow solid. The yield was 35%. The resultant metal complex M1 showed an HPLC area percentage value (detection wavelength UV: 254 nm) of 99.5% or more.

LC/MS (APCI positive): m/z=1719[M+H]$^+$ $^1$H-NMR (CD$_2$Cl$_2$, 300 MHz): δ (ppm)=8.02 (d, 3H), 7.96 (s, 3H), 7.66 (t, 3H), 7.59 (d, 3H), 7.49-7.45 (m, 18H), 7.38-7.35 (m, 12H), 7.14 (d, 3H), 6.97-6.92 (m, 6H), 2.14 (s, 9H), 1.37 (s, 54H).

<Example 2> Synthesis of Compound S2 and Metal Complex M2

Synthesis of Compound S2

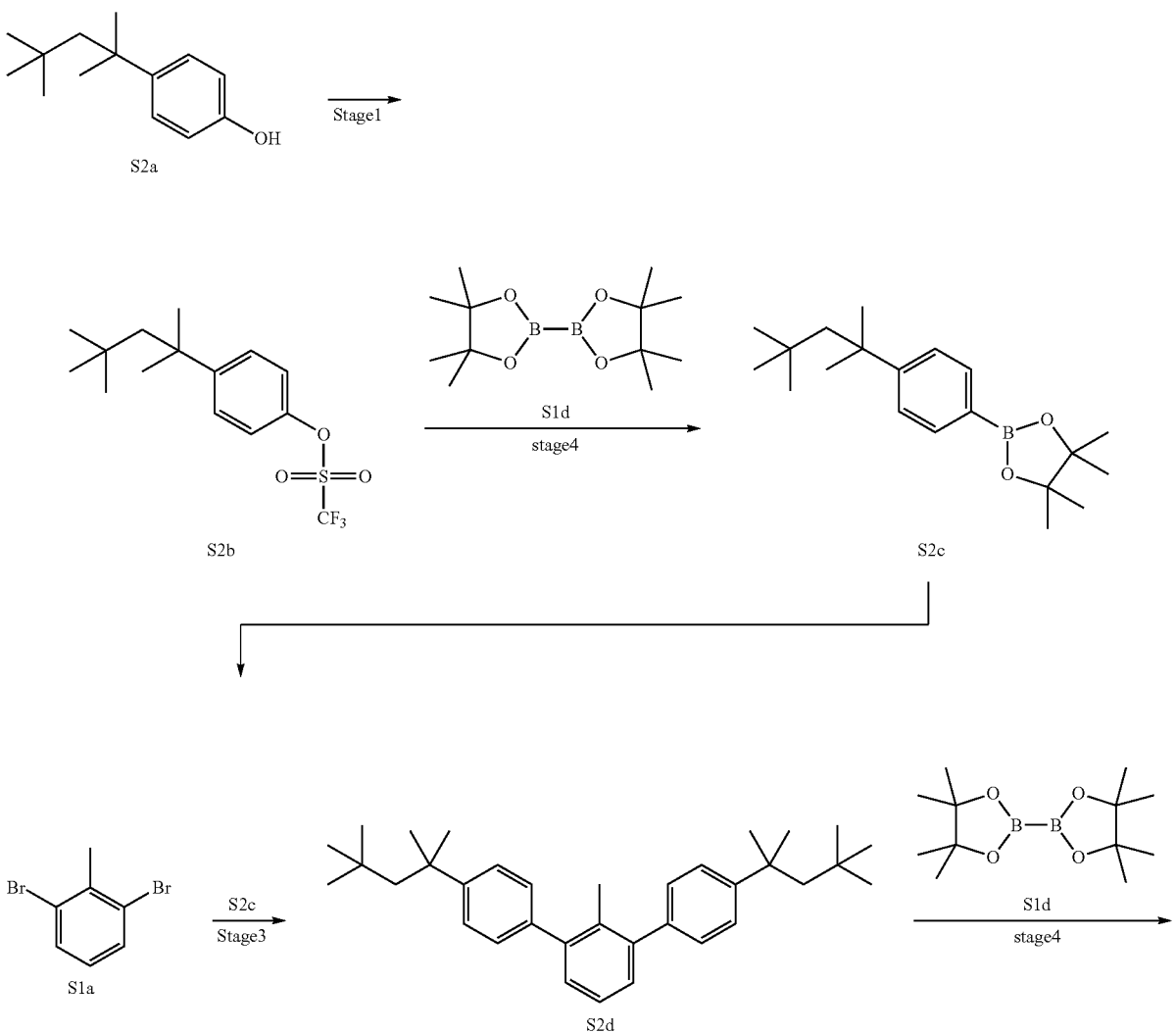

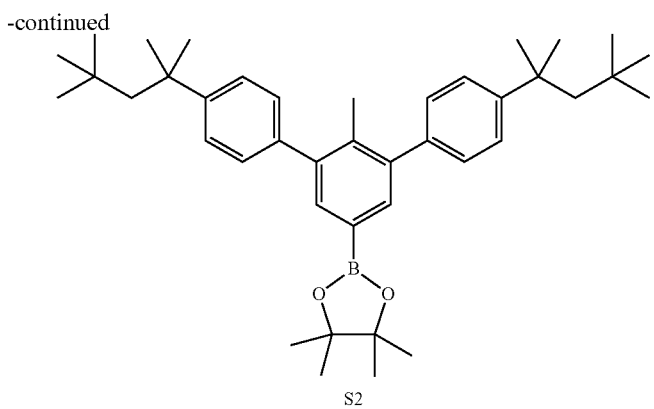

S2

<Stage 1>

An argon gas atmosphere was prepared in a reaction vessel, then, a compound S2a (250 g), 4-dimethylaminopyridine (178 g) and dichloromethane (3.1 L) were added, and the mixture was cooled in an ice bath. Thereafter, trifluoromethanesulfonic anhydride (376 g) was dropped into this over a period of 1 hour, and the mixture was stirred for 1.5 hours, then, the mixture was heated up to room temperature. Thereafter, hexane (3.1 L) was added and the mixture was stirred for 10 minutes, then, the solution was allowed to pass through a silica gel short column, and concentrated under reduced pressure to distill of the solvent, thereby obtaining a compound S2b (441 g) as a white solid.

<Stage 2>

An argon gas atmosphere was prepared in a reaction vessel, then, the compound S2b (410 g), a compound S1d (338 g), palladium acetate (4.08 g), tricyclohexylphosphine (10.2 g), potassium acetate (238 g) and dioxane (2.6 L) were added, and the mixture was stirred for 15 hours under reflux with heating. The resultant reaction mixture was allowed to pass through a filter paved with celite, then, the resultant filtrate was concentrated thereby obtaining a solid. The resultant solid was dissolved in a mixed solvent of hexane/dichloromethane=1/1 (volume ratio), then, the solution was allowed to pass through a filter paved with silica gel, and the resultant filtrate was concentrated under reduced pressure, thereby obtaining a solid. To the resultant solid was added methanol, and the mixture was stirred well, then, the deposited solid was isolated by filtration, and dried under reduced pressure at 50° C. overnight, thereby obtaining a compound S2c (274 g) as a white solid. The compound S2c showed an HPLC area percentage value (detection wavelength UV: 254 nm) of 98% or more. Further, the filtrate was concentrated under reduced pressure, then, methanol was added, and the mixture was stirred well, then, the deposited solid was isolated by filtration, and dried under reduced pressure at 50° C. overnight, to recover a compound S2c (45 g) (total yield: 75%).

<Stage 3>

An argon gas atmosphere was prepared in a reaction vessel, then, a compound S1a (90 g), the compound S2c (239 g), a 20 wt % tetraethylammonium hydroxide aqueous solution (795 g), palladium acetate (0.34 g), tri(orthomethoxyphenyl)phosphine (1.07 g) and toluene (1.7 L) were added, and the mixture was stirred at 95° C. for 5.5 hours. The resultant reaction mixture was liquid-separated, thereby obtaining an organic layer. The resultant organic layer was washed with ion-exchanged water and 5 wt % saline sequentially, and the solution was allowed to pass through a filter paved with silica gel, to remove solid components. The resultant filtrate was concentrated under reduced pressure, then, purified by silica gel column chromatography (hexane/dichloromethane), thereby obtaining a fraction containing an intended substance. The resultant fraction was concentrated under reduced pressure, and dried under reduced pressure at 50° C. overnight, thereby obtaining a compound S2d (167 g) as a white solid. The yield was 98%. The compound S2d showed an HPLC area percentage value (detection wavelength UV: 254 nm) of 99.4%.

<Stage 4>

An argon gas atmosphere was prepared in a reaction vessel, then, the compound S2d (175 g), a compound S1d (104 g), (1,5-cyclooctadiene)(methoxy)iridium(I) (dimer) (3.72 g), 4,4'-di-tert-butyl-2,2'-bipyridyl (3.01 g) and cyclohexane (2.0 L) were added, and the mixture was stirred for 4 hours under reflux with heating. To the resultant reaction mixture was added silica gel and the mixture was stirred for 30 minutes. Thereafter, the solution was allowed to pass through a filter paved with silica gel, to remove solid components. The resultant filtrate was concentrated under reduced pressure, then, hexane was added, and the mixture was stirred at room temperature, then, the deposited solid was isolated by filtration, washed with acetonitrile, and dried under reduced pressure at 50° C. overnight, thereby obtaining an intended substance compound S2 (137 g) as a white solid. The yield was 61%. The compound S2 showed an HPLC area percentage value (detection wavelength UV: 254 nm) of 99.3%. This operation was repeated, thereby obtaining a necessary amount of the compound S2.

$^1$H-NMR (CD$_2$Cl$_2$, 300 MHz): δ (ppm)=7.58 (s, 2H), 7.43 (d, 4H), 7.26 (d, 4H), 2.11 (s, 3H), 1.80 (s, 4H), 1.41 (s, 12H), 1.32 (s, 12H), 0.76 (s, 18H).

Synthesis of Metal Complex M2
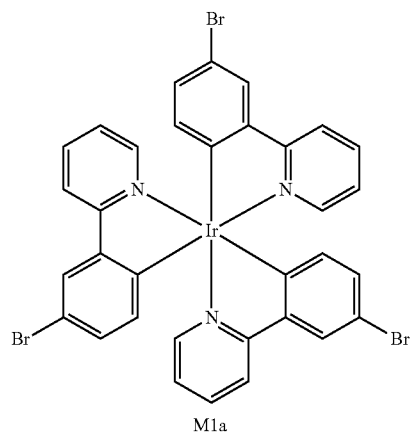
M1a
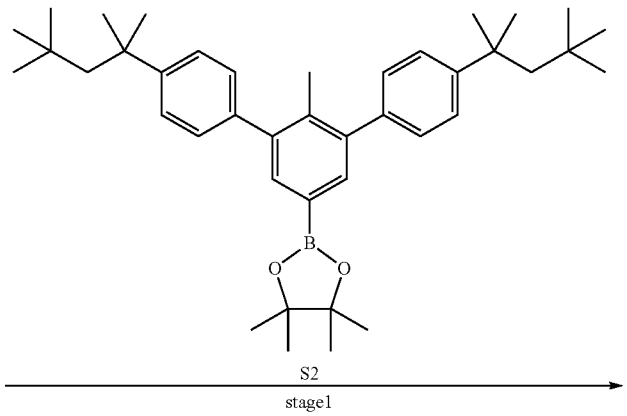
S2
stage1
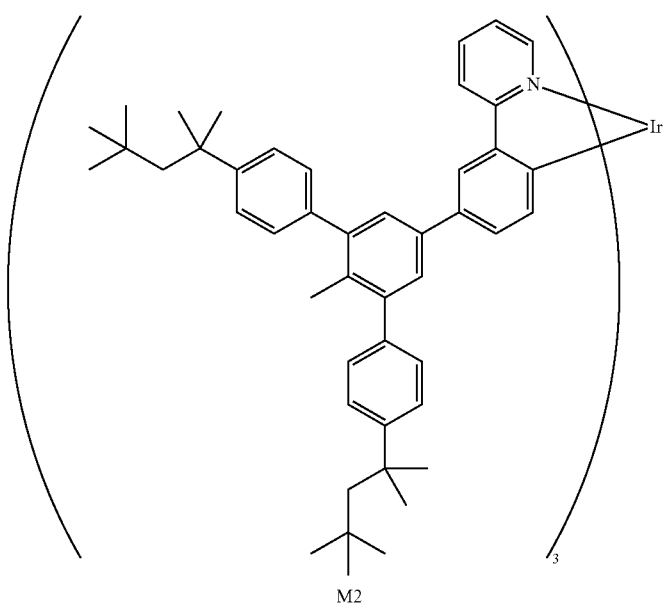
M2

An argon gas atmosphere was prepared in a light-shielded reaction vessel, then, a compound M1a (4.46 g), the compound S2 (13.5 g), tetrahydrofuran (405 mL), tetrakis(triphenylphosphine)palladium(0) (0.12 g) and a 20 wt % tetraethylammonium hydroxide aqueous solution (25.8 g) were added, and the mixture was stirred for 36 hours under reflux with heating. To the resultant reaction mixture were added toluene and ion-exchanged water and the liquid was allowed to separate, thereby obtaining an aqueous layer and an organic layer. The resultant aqueous layer was extracted with toluene twice and added to the organic layer obtained previously, and the mixture was washed with ion-exchanged water and 5 wt % saline sequentially, and dried over anhydrous sodium sulfate. Thereafter, the solution was allowed to pass through a filter paved with silica gel and celite, to remove solid components. The resultant filtrate was concentrated under reduced pressure, thereby obtaining a solid which was then dissolved in toluene, and the solution was allowed to pass through a filter paved with silica gel and celite, to remove solid components, and purified by performing recrystallization (toluene/methanol), then, purified by silica gel column chromatography (hexane/chloroform), thereby obtaining a fraction containing an intended substance. The resultant fraction was concentrated under reduced pressure, and purified by performing recrystallization (toluene/methanol), then, dried under reduced pressure at 50° C. overnight, thereby obtaining an intended substance metal complex M2 (5.35 g) as a yellow solid. The yield was 52%. The resultant metal complex M2 showed an HPLC area percentage value (detection wavelength UV: 254 nm) of 99.4%.

LC/MS (APCI positive): m/z=2055[M+H]$^+$ $^1$H-NMR (CD$_2$Cl$_2$, 300 MHz): δ (ppm)=8.04 (d, 3H), 7.96 (s, 3H), 7.66 (t, 3H), 7.60 (d, 3H), 7.49-7.43 (m, 18H), 7.33 (d, 12H), 7.14 (d, 3H), 6.97-6.91 (m, 6H), 2.09 (s, 91), 1.79 (s, 12H), 1.42 (s, 36H), 0.75 (s, 54H).

<Example 3> Synthesis of Compound S3, Compound S4 and Metal Complex M3

Synthesis of Compound S3 and Compound S4

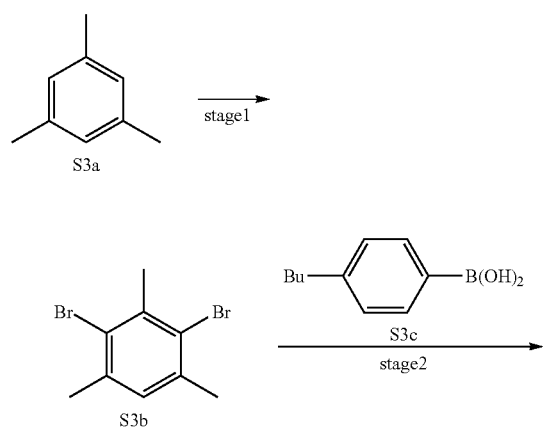

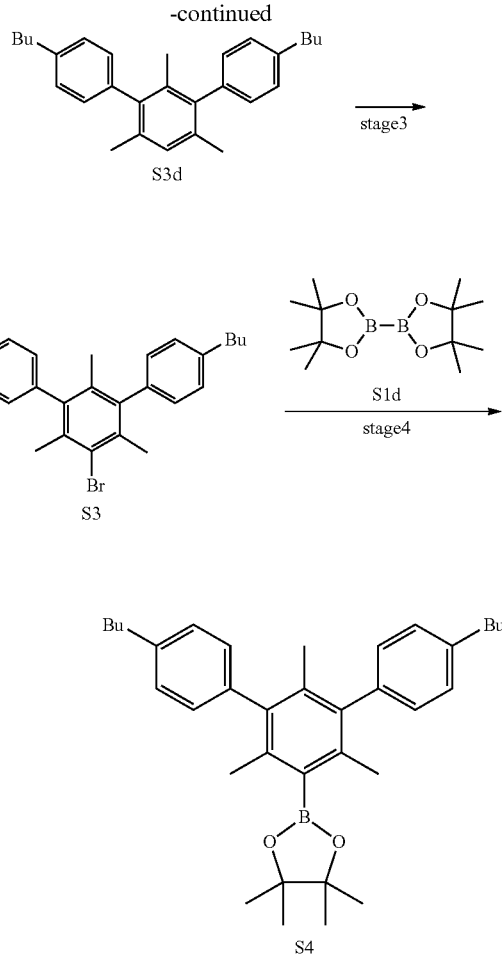

<Stage 1>

An argon gas atmosphere was prepared in a reaction vessel, then, a compound S3a (12.4 g), benzyltrimethylammonium tribromide (84.2 g), dichlorozinc (30.4 g) and acetic acid (500 mL) were added, and the mixture was stirred at 50° C. for 2 hours. The mixture was cooled down to room temperature, then, a 5 wt % sodium bisulfite aqueous solution was added and the mixture was stirred at room temperature for 30 minutes, to observe deposition of a solid. The solid was obtained by filtration. Further, hexane was added to the resultant filtrate and the mixture was stirred, then, liquid-separated thereby obtaining an organic layer. The solid obtained previously was added to the organic layer to cause dissolution, then, the solution was washed with ion-exchanged water twice, dried over anhydrous sodium sulfate, allowed to pass through a filter paved with active alumina, to remove solid components. The solvent was distilled off from the resultant filtrate by concentration under reduced pressure, thereby obtaining a compound S3b (28.22 g) as a white solid. The yield was 97%. The resultant compound S3b showed an HPLC area percentage value (detection wavelength UV: 254 nm) of 96.0%.

<Stage 2>

An argon gas atmosphere was prepared in a reaction vessel, then, the compound S3b (3.76 g), a compound S3c (5.22 g), tetrakis(triphenylphosphine)palladium(0) (1.56 g), potassium carbonate (10.8 g), water (12 mL) and dioxane (55 mL) were added, and the mixture was stirred for 6 hours under reflux with heating. The resultant reaction mixture was concentrated under reduced pressure to remove a solvent, then, toluene was added, and the mixture was washed with ion-exchanged water twice, dried over anhydrous sodium sulfate, and the solution was allowed to pass through a filter paved with silica gel and celite, to remove solid components. The resultant filtrate was concentrated under reduced pressure to obtain a solid when was dissolved in hexane, activated carbon was added and the mixture was stirred at room temperature for 30 minutes, then, the solution was allowed to pass through a filter paved with silica gel, to remove solid components, and the resultant filtrate was concentrated under reduced pressure, then, purified by silica gel column chromatography (hexane/ethyl acetate), concentrated under reduced pressure, then, dried under reduced pressure at 50° C. overnight, thereby obtaining a compound S3d (3.83 g) as a colorless oil. The yield was 74%. The resultant compound S3d showed an HPLC area percentage value (detection wavelength UV: 254 nm) of 96.9%.

<Stage 3>

An argon gas atmosphere was prepared in a reaction vessel, then, the compound S3d (1.99 g), benzyltrimethyl-ammonium tribromide (2.02 g), dichlorozinc (0.78 g) and acetic acid (12 mL) were added, and the mixture was stirred at 50° C. for 2 hours. The mixture was cooled down to room temperature, then, a 5 wt % sodium bisulfite aqueous solution and hexane were added and the solution was allowed to separate, thereby obtaining an aqueous layer and an organic layer. The resultant aqueous layer was extracted with toluene twice and added to the organic layer obtained previously, and the solution was washed with ion-exchanged water twice, dried over anhydrous sodium sulfate, allowed to pass through a filter paved with celite, to remove solid components. The solvent was distilled off from the resultant filtrate by concentration under reduced pressure, then, the resultant solid was purified by silica gel column chromatography (hexane/ethyl acetate), concentrated under reduced pressure, then, dried under reduced pressure at 50° C. overnight, thereby obtaining a compound S3 (2.14 g). The yield was 84%. The resultant compound S3 showed an HPLC area percentage value (detection wavelength UV: 254 nm) of 91.1% (compound S3d: 1.2%). This operation was repeated, thereby obtaining a necessary amount of the compound S3.

$^1$H-NMR (CD$_2$Cl$_2$, 300 MHz): δ (ppm)=7.22 (d, 4H), 7.03 (d, 4H), 2.66 (t, 4H), 2.17 (s, 6H), 1.70-1.61 (m, 7H), 1.39 (q, 4H), 0.95 (t, 6H).

<Stage 4>

An argon gas atmosphere was prepared in a reaction vessel, then, a compound S3 (13.0 g) synthesized by the same method as described above, a compound S1d (7.09 g), 1,1'-bis(diphenylphosphino)ferrocene-palladium(II) dichloride-dichloromethane complex (1.41 g), potassium acetate (16.4 g) and dimethoxyethane (340 mL) were added, and the mixture was stirred for 4.5 hours under reflux with heating. The resultant reaction mixture was allowed to pass through a filter paved with celite, thereby obtaining a filtrate. The resultant filtrate was washed with ion-exchanged water twice, and concentrated under reduced pressure, thereby obtaining an oil. The resultant oil was purified by silica gel column chromatography (hexane/ethyl acetate), concentrated under reduced pressure, then, dried under reduced pressure at 50° C. overnight, thereby obtaining an intended substance compound 54 (4.3 g) as a yellow white solid. The yield was 30%. The resultant compound S4 showed an HPLC area percentage value (detection wavelength UV: 254 nm) of 98.4%.

Synthesis of Metal Complex M3

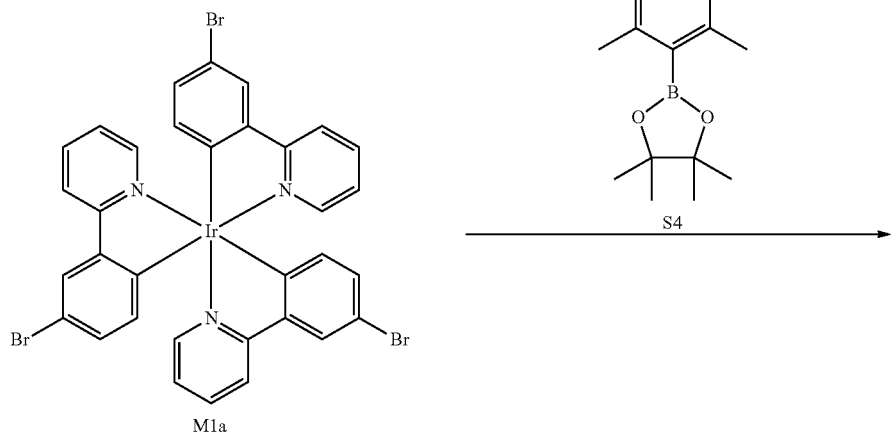

M1a

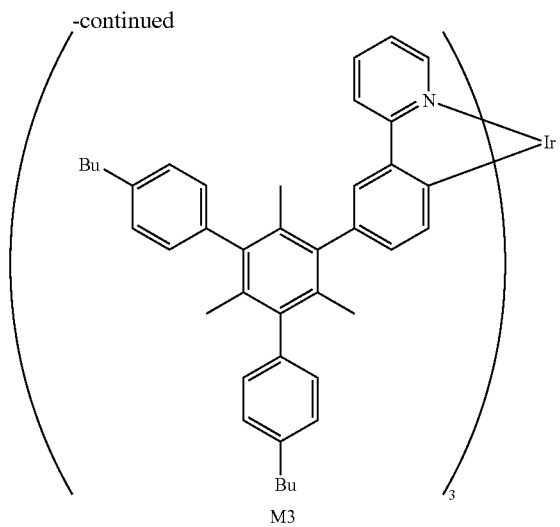

M3

An argon gas atmosphere was prepared in a light-shielded reaction vessel, then, a compound Mia (0.891 g), the compound S4 (2.30 g), tetrahydrofuran (81 mL), tetrakis(triphenylphosphine)palladium(0) (0.139 g) and a 20 wt % tetraethylammonium hydroxide aqueous solution (5.15 g) were added, and the mixture was stirred for 36 hours under reflux with heating. To the resultant reaction mixture were added toluene and ion-exchanged water and the solution was allowed to separate, thereby obtaining an aqueous layer and an organic layer. The resultant aqueous layer was extracted with toluene twice and added to the organic layer obtained previously, and the mixture was washed with ion-exchanged water and 5 wt % saline sequentially, dried over anhydrous sodium sulfate. Thereafter, the solution was allowed to pass through a filter paved with silica gel and celite, to remove solid components. The resultant filtrate was concentrated under reduced pressure, thereby obtaining a solid which was then dissolved in toluene, and the solution was allowed to pass through a filter paved with silica gel and celite, to remove solid components, and the solution was concentrated under reduced pressure, then, purified by recrystallization (toluene/methanol), silica gel column chromatography (hexane/chloroform) and recrystallization (toluene/methanol) sequentially, then, dried under reduced pressure at 50° C. overnight, thereby obtaining an intended substance metal complex M3 (0.542 g) as a pale yellow solid. The yield was 30%. The resultant metal complex M3 showed an HPLC area percentage value (detection wavelength UV: 254 nm) of 99.3%.

LC/MS (APCI positive): m/z=1803[M+H]

$^{1}$H-NMR (CDCl$_{3}$, 300 MHz): δ (ppm)=7.84 (d, 3H), 7.61-7.54 (m, 9H), 7.26 (s, 3H), 7.23-7.17 (m, 12H), 7.14-7.05 (m, 12H), 6.78 (m, 6H), 2.64 (d, 12H), 1.82 (s, 9H), 1.72-1.54 (m, 30H), 1.43-1.34 (m, 12H), 0.98-0.91 (m, 18H).

<Example 4> Synthesis of Metal Complex M4

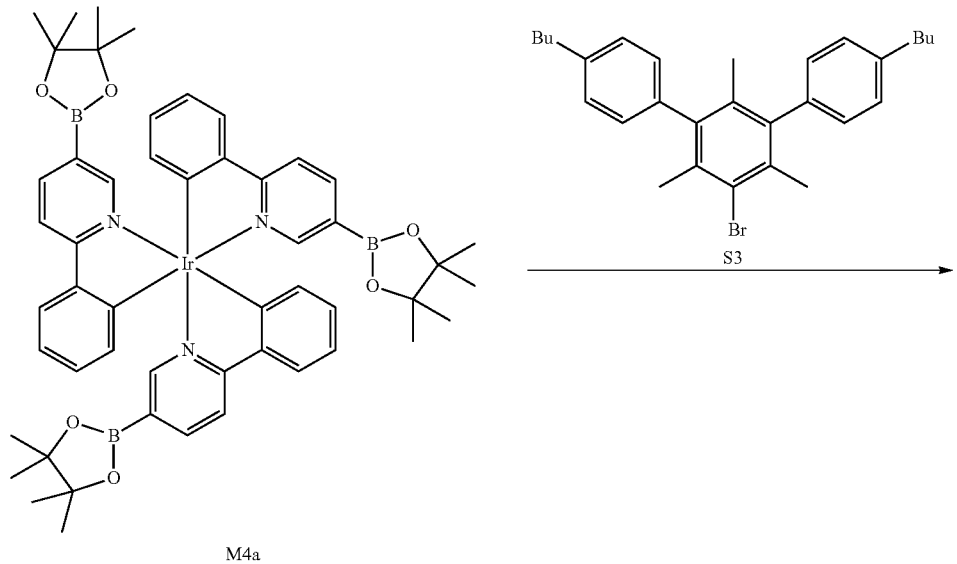

M4a

-continued

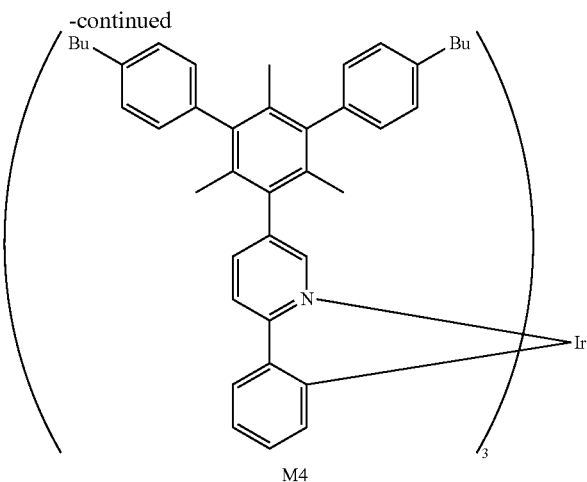

M4

An argon gas atmosphere was prepared in a light-shielded reaction vessel, then, a compound M4a (1.033 g), a compound S3 (1.460 g), toluene (6 mL), palladium acetate (4.5 mg), tris-(orthomethoxyphenyl)phosphine (1.4 mg) and a 20 wt % tetraethylammonium hydroxide aqueous solution (3.31 g) were added, and the mixture was stirred for 36 hours under reflux with heating. To the resultant reaction mixture were added toluene and ion-exchanged water and the solution was allowed to separate, thereby obtaining an aqueous layer and an organic layer. The resultant aqueous layer was extracted with toluene twice and added to the organic layer obtained previously, and the mixture was washed with ion-exchanged water and 5 wt % saline sequentially, and dried over anhydrous sodium sulfate. Thereafter, the solution was allowed to pass through a filter paved with silica gel and celite, to remove solid components. The resultant filtrate was concentrated under reduced pressure, thereby obtaining a solid which was then dissolved in toluene, and the solution was allowed to pass through a filter paved with silica gel and celite, to remove solid components, and concentrated under reduced pressure, then, purified by recrystallization (toluene/methanol), silica gel column chromatography (hexane/chloroform) and recrystallization (toluene/methanol) sequentially, then, dried under reduced pressure at 50° C. overnight, thereby obtaining an intended substance metal complex M4 (0.332 g) as a pale yellow solid. The yield was 18%. The resultant metal complex M4 showed an HPLC area percentage value (detection wavelength UV: 254 nm) of 99.5% or more.

LC/MS (APCI positive): m/z=1803[M+H]$^+$ $^1$H-NMR (CD$_2$Cl$_2$, 300 MHz): δ (ppm)=7.98 (d, 3H), 7.70-7.67 (d, 3H), 7.54-7.51 (m, 6H), 7.31-7.24 (m, 12H), 7.01 (t, 6H), 6.93-6.86 (m, 9H), 6.80 (d, 3H), 6.67 (d, 3H), 2.79-2.67 (m, 12H), 1.76-1.65 (m, 12H), 1.53-1.39 (m, 30H), 1.35 (s, 9H), 1.04-0.97 (m, 18H).

<Example 5> Synthesis of Compound S5 and Metal Complex M5

Synthesis of Compound S5

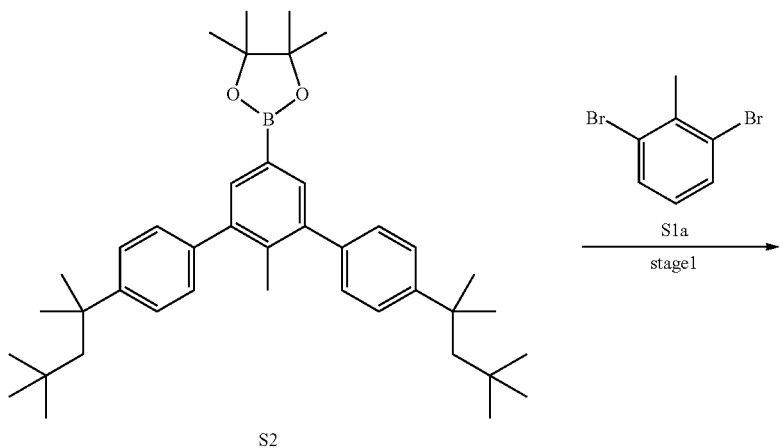

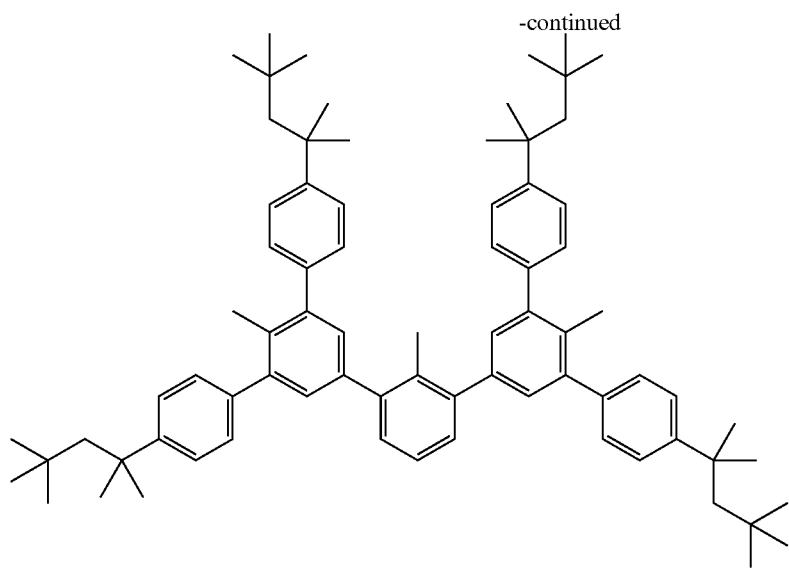

S5a

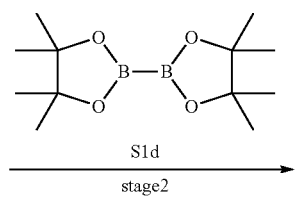

$\xrightarrow[\text{stage2}]{\text{S1d}}$

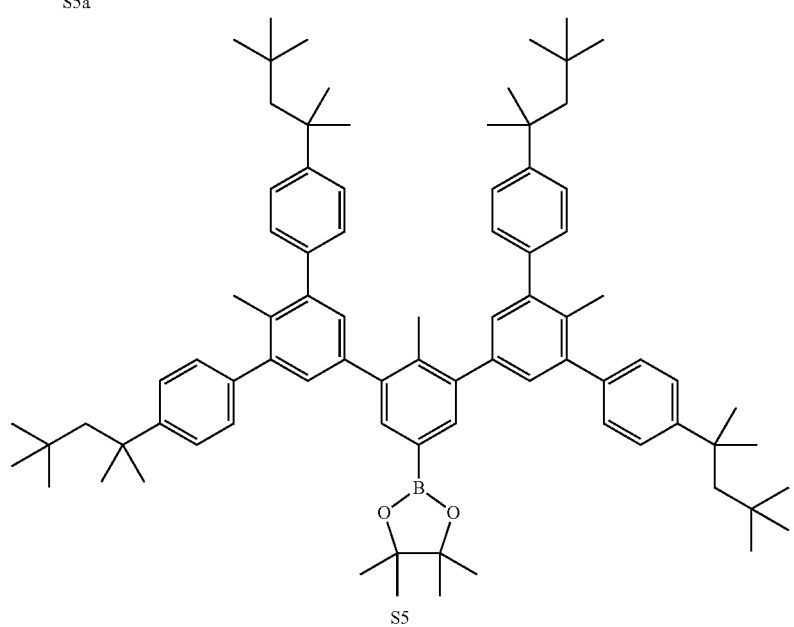

S5

<Stage 1>

An argon gas atmosphere was prepared in a reaction vessel, then, a compound S1a (46.0 g), a compound S2 (230 g) synthesized by the same method as described above, a 20 wt % tetraethylammonium hydroxide aqueous solution (407 g), palladium acetate (0.17 g), tri(orthomethoxyphenyl)phosphine (0.55 g) and toluene (880 mL) were added, and the mixture was stirred at 95° C. for 5.5 hours. The resultant reaction mixture was liquid-separated, thereby obtaining an organic layer. The resultant organic layer was washed with ion-exchanged water once, washed with 5 wt % saline once, dried over anhydrous sodium sulfate, and filtrated to remove solid components. The resultant filtrate was concentrated under reduced pressure, then, purified by silica gel column chromatography (hexane/chloroform), concentrated under reduced pressure, then, dried under reduced pressure at 50° C. overnight, thereby obtaining a compound S5a (181 g) as a white solid. The yield was 94%. The resultant compound S5a showed an HPLC area percentage value (detection wavelength UV: 254 nm) of 97.9%.

<Stage 2>

An argon gas atmosphere was prepared in a reaction vessel, then, the compound S5a (171 g), a compound S1d (46.5 g), (1,5-cyclooctadiene)(methoxy)iridium(I) (dimer) (3.31 g), 4,4'-di-tert-butyl-2,2'-bipyridyl (2.68 g) and cyclohexane (900 mL) were added, and the mixture was stirred for 16 hours under reflux with heating. To the resultant reaction mixture was added silica gel (192 g), and the mixture was stirred for 30 minutes, then, allowed to pass through a filter paved with silica gel, to remove solid components. The resultant filtrate was concentrated under reduced pressure, then, purified by recrystallization (hexane), and the resultant solid was washed with methanol, then, dried under reduced pressure at 50° C. overnight, thereby obtaining an intended substance compound S5 (95 g) as a white solid. The yield was 49%. The resultant compound S5 showed an HPLC area percentage value (detection wavelength UV: 254 nm) of 98.7%.

$^1$H-NMR (CD$_2$Cl$_2$, 300 MHz): δ (ppm)=7.65 (s, 2H), 7.44 (d, 8H), 7.32 (d, 8H), 7.22 (s, 4H), 2.35 (s, 3H), 2.14 (s, 6H), 1.79 (s, 8H), 1.41 (s, 24H), 1.29 (s, 12H), 0.74 (s, 36H).
Synthesis of Metal Complex M5
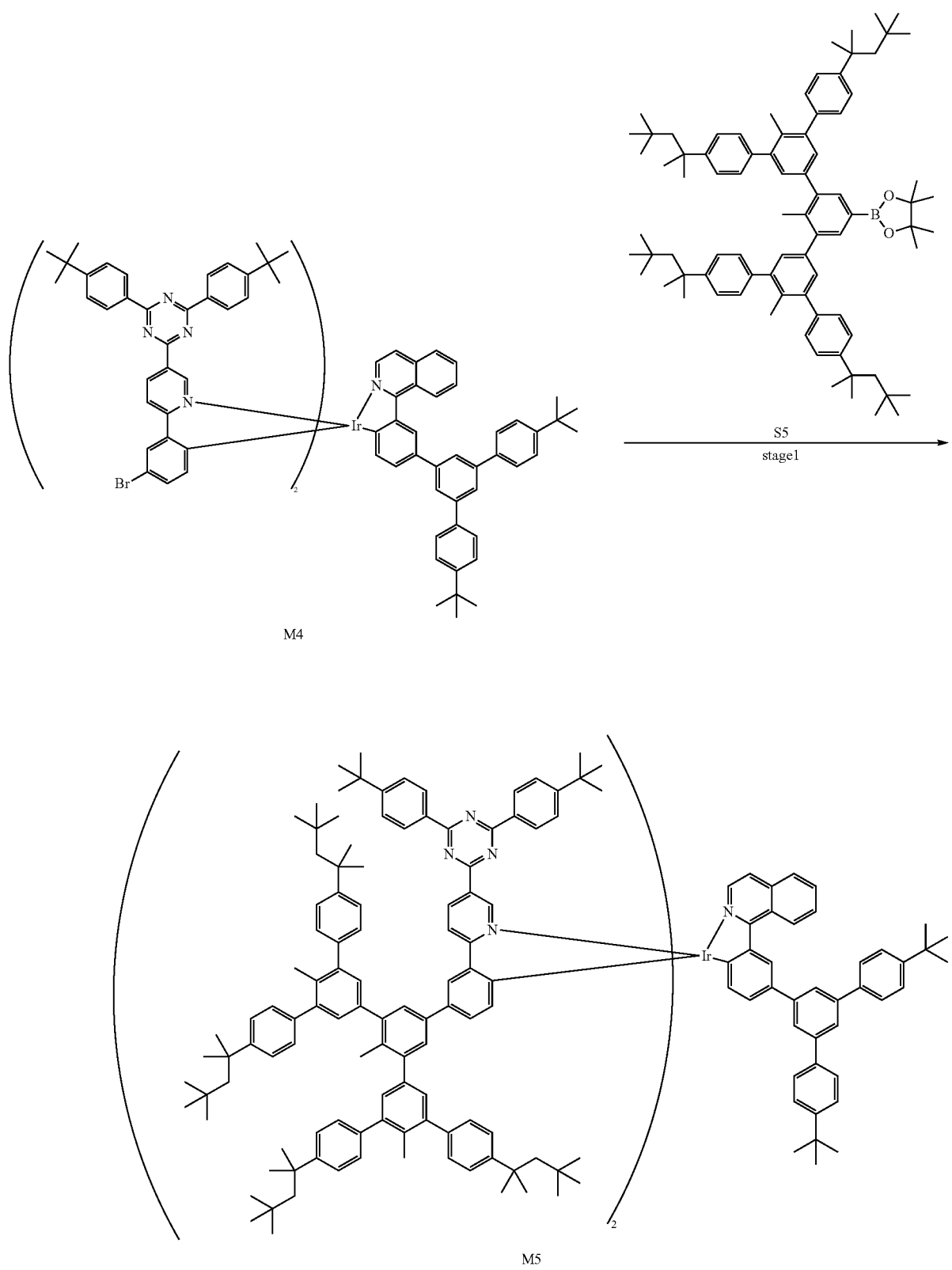

A metal complex M5a was synthesized according to a method described in JP-A No. 2011-105701, and one having an HPLC area percentage value (detection wavelength UV: 254 nm) of 99.5% or more was used.

<Stage 1>

An argon gas atmosphere was prepared in a light-shielded reaction vessel, then, the metal complex M5a (4.56 g), a compound S5 (8.35 g), tetrahydrofuran (240 mL), tetrakis(triphenylphosphine)palladium(0) (0.332 g) and a 20 wt % tetraethylammonium hydroxide aqueous solution (17.7 g) were added, and the mixture was stirred for 16 hours under reflux with heating. The resultant reaction mixture was concentrated under reduced pressure, then, toluene and ion-exchanged water were added and the solution was allowed to separate, thereby obtaining an aqueous layer and an organic layer. To the resultant aqueous layer was added toluene and extraction thereof was performed, and the resultant layer was added to the organic layer obtained previously, and the mixture was washed with 5 wt % saline twice, dried over anhydrous sodium sulfate, then, concentrated under reduced pressure to obtain a solid. The resultant solid was dissolved in toluene, and the solution was allowed to pass through a filter paved with silica gel, thereby obtaining a filtrate. The solvent of the resultant filtrate was distilled off by concentration under reduced pressure, then, the resultant solid was purified by silica gel column chromatography (hexane/toluene) and recrystallization (toluene/isopropanol) sequentially, then, dried under reduced pressure at 50° C. overnight, thereby obtaining a metal complex MS (7.89 g) as a red solid. The yield was 86%. The resultant metal complex M5 showed an HPLC area percentage value (detection wavelength UV: 254 nm) of 98.5%.

LC/MS (APCI positive): m/z=3778[M+H]$^+$ $^1$H-NMR (CD$_2$Cl$_2$, 300 MHz): δ (ppm)=9.32 (s, 1H), 9.20-9.16 (m, 2H), 9.12 (d, 18), 8.96 (d, 1H), 8.62 (s, 1H), 8.41-8.25 (m, 10H), 8.15 (d, 2H), 7.95-7.90 (m, 28), 7.77 (s, 2H), 7.70-7.59 (m, 12H), 7.52 (d, 2H), 7.46-7.18 (m, 56H), 2.33 (s, 68), 2.15 (s, 12H), 1.76 (s, 16H), 1.45-1.24 (m, 102H), 0.72 (s, 72H).

<Example 6> Synthesis of Metal Complex M6

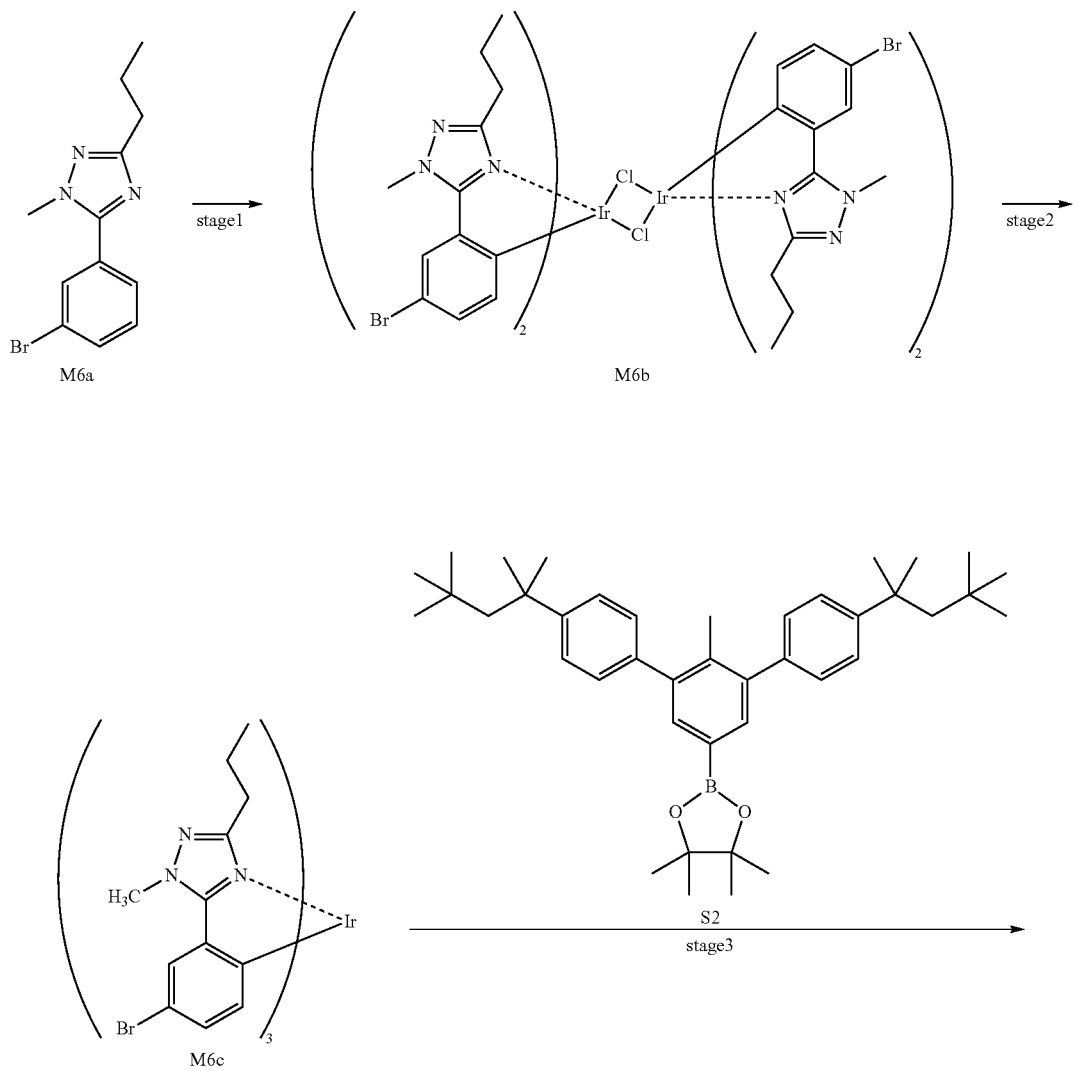

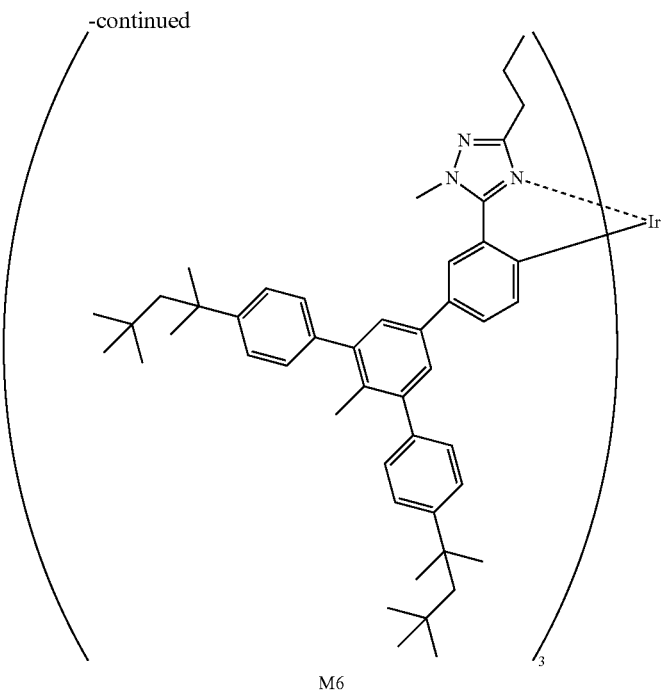

M6

<Stage 1>

A nitrogen gas atmosphere was prepared in a reaction vessel, then, iridium chloride trihydrate (20 g), a compound M6a (39.7 g) synthesized according to a method described in JP-A No. 2013-147551, ethoxyethanol (800 mL) and ion-exchanged water (270 mL) were added, then, the mixture was stirred for 22 hours under reflux with heating. Thereafter, ion-exchanged water (800 mL) was added and the mixture was stirred for 1 hour. Thereafter, the deposited precipitate was isolated by filtration, which was then washed with ion-exchanged water and hexane sequentially, then, dried under reduced pressure at 50° C., thereby obtaining an intended compound M6b (40.6 g) as a yellow powder. The metal complex M6b showed an HPLC area percentage value (detection wavelength UV: 254 nm) of 98.2%.

<Stage 2>

A nitrogen gas atmosphere was prepared in a reaction vessel, then, the metal complex M6b (40.6 g), a compound M6a (95.3 g) synthesized by the same method as described above, diethylene glycol dimethyl ether (570 mL) and silver trifluoroacetate (29.2 g) were added, then, the mixture was stirred at 170° C. for 22 hours. The resultant reaction mixture was cooled down to room temperature, then, filtrated. To the resultant filtrate was added ion-exchanged water and the mixture was stirred, and the deposited precipitate was taken out as a solid by filtration. The resultant solid was washed with ion-exchanged water and methanol sequentially, and dried under reduced pressure, thereby obtaining a yellow solid. The resultant yellow solid was purified by silica gel column chromatography (dichloromethane), recrystallization (dichloromethane/methanol), recrystallization (dichloromethane/ethyl acetate) and recrystallization (ethyl acetate/methanol) sequentially, then, dried under reduced pressure at 50° C. overnight, thereby obtaining an intended substance metal complex M6c (48.0 g). The resultant crystal showed an HPLC area percentage value (detection wavelength UV: 254 nm) of 99.4%.

LC/MS (APCI positive): m/z=1028[M+H]$^+$

<Stage 3>

An argon gas atmosphere was prepared in a light-shielded reaction vessel, then, the metal complex M6c (3.50 g), a compound S2 (6.47 g), tetrahydrofuran (275 mL), tetrakis(triphenylphosphine)palladium(0) (113 mg) and a 20 wt % tetraethylammonium hydroxide aqueous solution (17.5 g) were added, and the mixture was stirred for 10 hours under reflux with heating. To the resultant reaction mixture were added toluene and ion-exchanged water and the solution was allowed to separate, thereby obtaining an organic layer. The resultant organic layer was washed with ion-exchanged water and 5 wt % saline sequentially, dried over anhydrous sodium sulfate, and allowed to pass through a filter paved with celite, to remove solid components. The resultant filtrate was concentrated under reduced pressure, then, purified by silica gel column chromatography (hexane/ethyl acetate) and recrystallization (toluene/acetonitrile) sequentially, then, dried under reduced pressure at 50° C. overnight, thereby obtaining an intended substance metal complex M6 (5.74 g) as a yellow solid. The yield was 77%.

The resultant metal complex M6 showed an HPLC area percentage value (detection wavelength UV: 254 nm) of 99.5% or more.

LC/MS (APCI positive): m/z=2193[M+H]$^+$ $^1$H-NMR (CDCl$_3$, 300 MHz): δ (ppm)=7.72 (s, 3B), 7.44-7.39 (m, 18H), 7.30 (d, 12H), 7.17 (d, 3H), 7.09 (d, 3H), 4.20 (s, 9H), 2.09 (s, 9H), 1.77 (s, 12H), 1.47-1.31 (m, 42H), 0.79-0.63 (mm, 69H).

Synthesis Example 1: Synthesis of Metal Complexes MC1 and MC2 and Monomers CM1 to CM11

A metal complex MC1 was synthesized according to a synthesis method described in International Publication WO2002/066552.

A metal complex MC2 was synthesized according to a synthesis method described in JP-A No. 2013-147551.

A monomer CM1 was synthesized according to a synthesis method described in JP-A No. 2011-174062.

A monomer CM2 was synthesized by a method described below.

As the monomer CM3, a commercially available material was used.

A monomer CM4 was synthesized according to a synthesis method described in JP-A No. 2008-106241.

A monomer CM5 and a monomer CM7 were synthesized according to a synthesis method described in JP-A No. 2010-189630.

A monomer CM6 and a monomer CM8 were synthesized according to a synthesis method described in International Publication WO2012/086671.

A monomer CM9 was synthesized according to a synthesis method described in JP-A No. 2004-143419.

A monomer CM10 and a monomer CM11 were synthesized according to a synthesis method described in International Publication WO2013/191088.

MC1

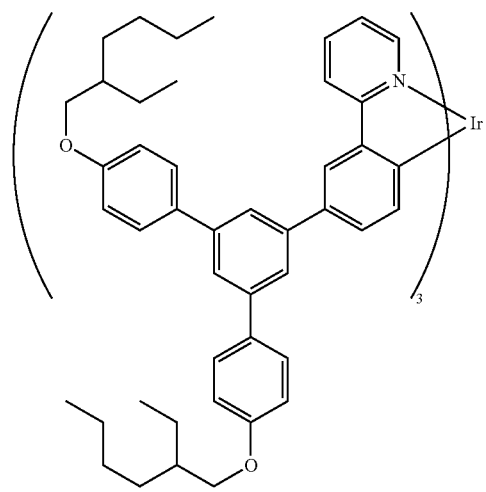

MC2

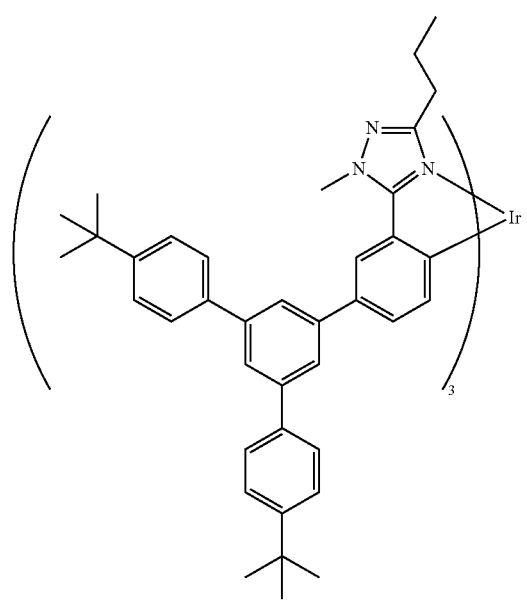

-continued

CM2

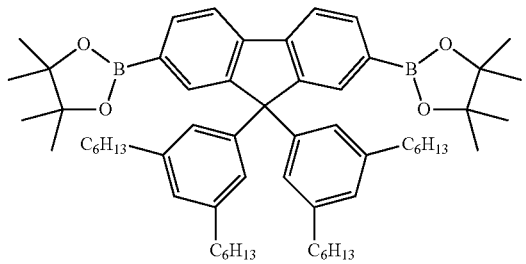

CM3

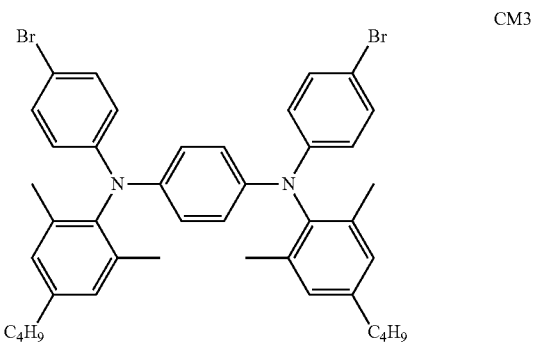

CM3

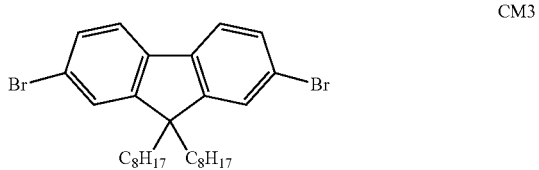

CM4

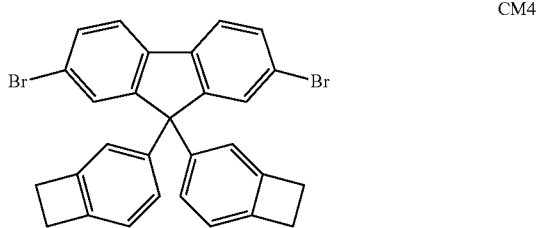

CM5

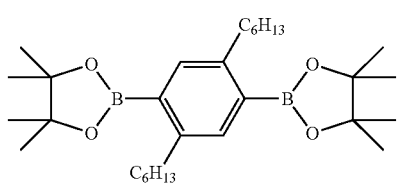

CM6

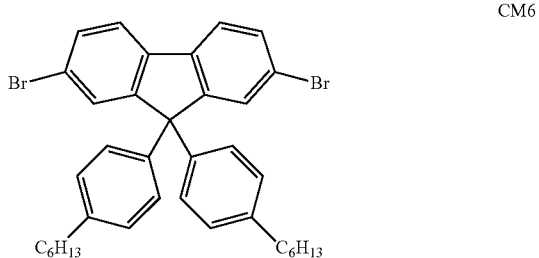

-continued
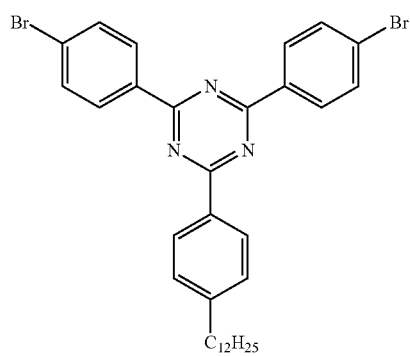
CM7
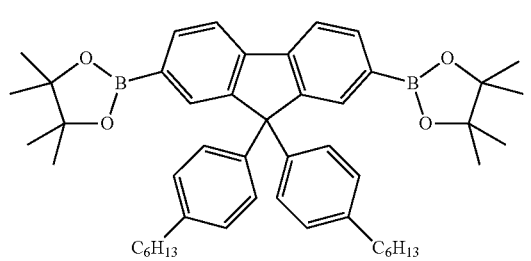
CM8
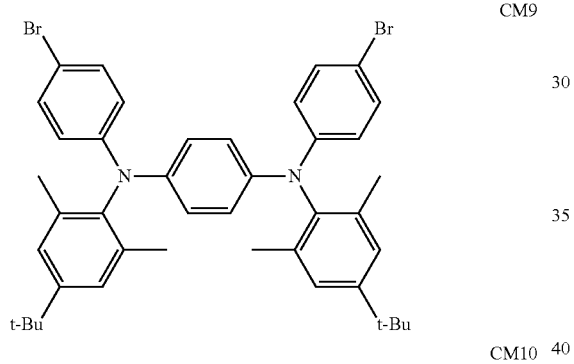
CM9
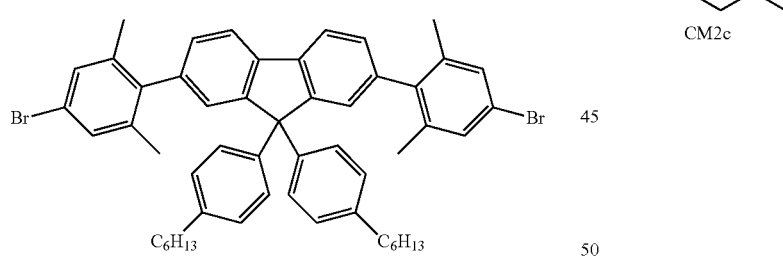
CM10
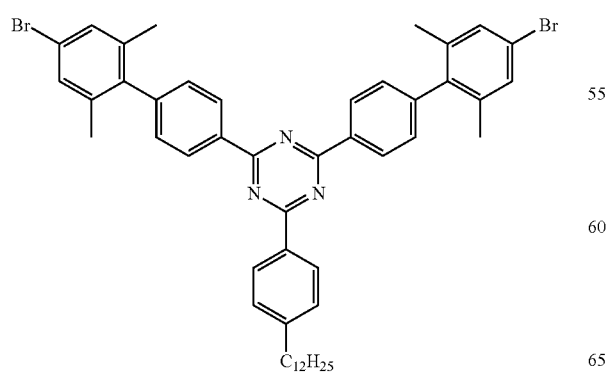
CM11
Synthesis Example 2: Synthesis of Monomer CM2
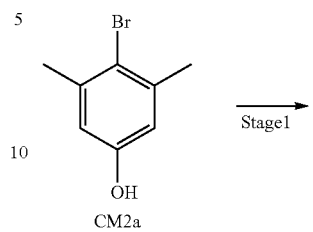
CM2a
→ Stage1
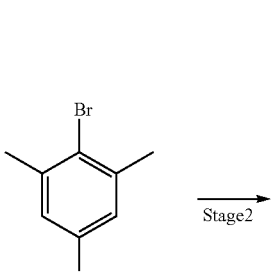
CM2b
→ Stage2
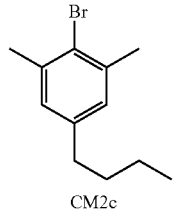
CM2c
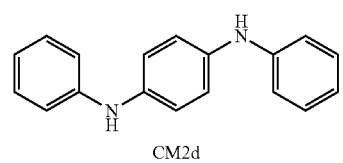
CM2d
→ Stage3
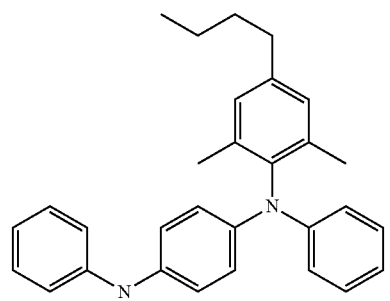
CM2e
→ Stage4

-continued

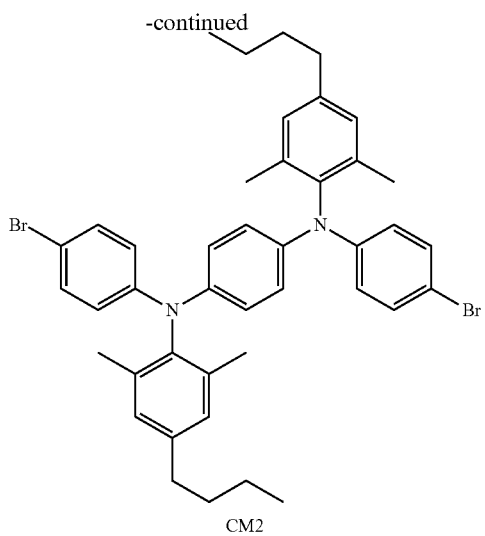

CM2

(Stage 1: Synthesis of Compound CM2b)

A nitrogen gas atmosphere was prepared in a reaction vessel, then, a compound CM2a (117.6 g), N,N-dimethylaminopyridine (107.2 g) and dichloromethane (1170 mL) were added, and the mixture was stirred. The resultant solution was cooled in an ice bath, then, trifluoromethanesulfonic anhydride (198.0 g) was dropped over a period of 1 hour. Thereafter, the ice bath was removed, and the mixture was stirred for 1.5 hours. Thereafter, the resultant solution was cooled again in an ice bath, then, a saturated ammonium chloride aqueous solution was added, and the solution was allowed to separate, thereby obtaining an organic layer (organic layer 1) and an aqueous layer. To the resultant aqueous layer was added hexane and extraction thereof was performed to obtain an organic layer, which was then combined with the organic layer 1, and the combined solution was washed with ion-exchanged water and saturated saline sequentially. The resultant organic layer was purified by a silica gel short column, then, concentrated under reduced pressure, thereby obtaining a brown liquid (200 g) containing a compound CM2b.

(Stage 2: Synthesis of Compound CM2c)

A nitrogen gas atmosphere was prepared in a reaction vessel, then, a brown liquid containing the compound CM2b (100 g), [1,1'-bis(diphenylphosphino) ferrocene]palladium (II) dichloride dichloromethane adduct (PdCl$_2$ (dppf) .CH$_2$Cl$_2$, 1.2 g) and tetrahydrofuran (1000 mL) were added. Thereafter, the mixture was heated up to 55° C. while stirring. Into this, a 2 mol/L n-butylmagnesium chloride tetrahydrofuran solution (41.3 g) was dropped at 55° C., then, the mixture was stirred at 55° C. for 3.5 hours. Thereafter, the mixture was cooled down to room temperature, and a saturated ammonium chloride aqueous solution was added. The resultant organic layer was washed with ion-exchanged water and saturated saline sequentially. Thereafter, the layer was dried over anhydrous magnesium sulfate, filtrated, and the resultant filtrate was concentrated under reduced pressure, thereby obtaining an oil. The resultant oil was purified by distillation under reduced pressure, thereby obtaining a compound CM2c as a colorless liquid (20 g). The yield was 30%. The resultant compound CM2c showed a GC area percentage value of 98%. This operation was repeated, thereby obtaining a necessary amount of the compound CM2c.

(Stage 3: Synthesis of Compound CM2e)

A nitrogen gas atmosphere was prepared in a reaction vessel, then, the compound CM2c (97.3 g), a compound 3d (50.0 g), toluene (1.5 L), tris(dibenzylideneacetone)dipalladium(0) (2.64 g), tri-tert-butylphosphine tetrafluoroborate salt (1.67 g) and sodium-tert-butoxide (55.4 g) were added, and the mixture was stirred for 20 hours under reflux with heating. Thereafter, the mixture was cooled down to room temperature, and ion-exchanged water was added. The resultant organic layer was washed with ion-exchanged water and saturated saline sequentially, and the resultant organic layer was dried over anhydrous magnesium sulfate, filtrated, and the resultant filtrate was concentrated under reduced pressure, thereby obtaining a solid. The resultant solid was dissolved in toluene, then, purified by a silica gel short column (toluene), silica gel column chromatography (toluene/hexane) and recrystallization (toluene/acetonitrile) sequentially, and dried under reduced pressure at 50° C. overnight, thereby obtaining a compound CM2e (85.6 g) as a white solid. The yield was 77%. The compound CM2e showed an HPLC area percentage value of 99.5% or more.

(Stage 4: Synthesis of Compound CM2)

A nitrogen gas atmosphere was prepared in a light-shielded reaction vessel, then, the compound CM2e (45 g) and dichloromethane (750 mL) were added. The resultant solution was cooled down to 5° C. or lower by an ice bath, then, N-bromosuccinimide (28.3 g) was added in divided doses at a temperature not higher than 5° C. Thereafter, the ice bath was removed, and the mixture was stirred overnight. The resultant reaction solution was diluted with dichloromethane, then, washed with a 10 wt % sodium carbonate aqueous solution, saturated saline and ion-exchanged water sequentially, and the solution was allowed to pass through a silica gel short column (dichloromethane), then, concentrated under reduced pressure, thereby obtaining a solid. The resultant solid was purified several times by recrystallization (toluene/isopropanol), thereby obtaining a compound CM2 (19.9 g) as a white solid. The yield was 35%. The compound CM2 showed an HPLC area percentage value of 99.5% or more.

$^1$H-NMR (THF-d$_6$, 300 MHz): δ (ppm)=7.23 (d, 4H), 6.95 (s, 4H), 6.88 (s, 4H), 6.75 (d, 4H), 2.56 (t, 4H), 1.99 (s, 12H), 1.66-1.55 (m, 4H), 1.44-1.32 (m, 4H), 0.94 (t, 6H).

Synthesis Example 2: Synthesis of Polymer Compound P1

A polymer compound P1 was synthesized using monomers shown in Table 3 described below.

(Step 1) An inert gas atmosphere was prepared in a reaction vessel, then, a monomer CM1 (4.34 mmol), a monomer CM2 (2.60 mmol), a monomer CM3 (1.08 mmol), a monomer CM4 (0.65 mmol), palladium acetate (1.0 mg), tris(2-methoxyphenyl)phosphine (6.1 mg) and toluene (118 mL) were added, and the mixture was heated at 105° C.

(Step 2) Into the reaction solution, a 20 wt % tetraethylammonium hydroxide aqueous solution (15.3 g) was dropped, and the solution was refluxed for 11 hours.

(Step 3) After the reaction, to this were added phenylboronic acid (53 mg), palladium acetate (1.0 mg), tris(2-methoxyphenyl)phosphine (6.1 mg) and a 20 wt % tetraethylammonium hydroxide aqueous solution (15.3 g), and the mixture was refluxed overnight.

(Step 4) Thereafter, to this was added a sodium diethyldithiacarbamate aqueous solution, and the mixture was stirred at 80° C. for 2 hours. After cooling, the reaction solution was washed with water twice, with a 3 wt % acetic acid aqueous solution twice, and with water twice, and the resultant solution was dropped into methanol, to observe precipitation. The precipitate was dissolved in toluene, and the solution was purified by passing through an alumina column and a silica gel column in this order. The resultant solution was dropped into methanol, the mixture was stirred, then, the resultant precipitate was isolated by filtration, and dried, thereby obtaining 3.71 g of a polymer compound P1. The polymer compound P1 had a Mn of $6.6 \times 10^4$ and a Mw of $2.3 \times 10^{-5}$.

The polymer compound P1 is a copolymer constituted of constitutional units derived from respective monomers at molar ratios shown in Table 3 described below, according to theoretical values calculated from charged raw materials.

TABLE 3

| | monomer | CM1 | CM2 | CM3 | CM4 |
|---|---|---|---|---|---|
| polymer compound P1 | molar ratio | 50 | 30 | 12.5 | 7.5 |

Synthesis Example 3: Synthesis of Polymer Compound P2

A polymer compound P2 was synthesized according to a synthesis method described in JP-A No. 2012-36388 using monomers shown in Table 4 described below. The polymer compound P2 had a Mn of $9.2 \times 10^4$ and a Mw of $2.3 \times 10^5$. The polymer compound P2 is a copolymer constituted of constitutional units derived from respective monomers at molar ratios shown in Table 4 described below, according to theoretical values calculated from charged raw materials.

TABLE 4

| | monomer | CM5 | CM6 | CM7 |
|---|---|---|---|---|
| polymer compound P2 | molar ratio | 50 | 40 | 10 |

Synthesis Example 4: Synthesis of Polymer Compound P3

A polymer compound P3 was synthesized according to a synthesis method described in JP-A No. 2012-216815 using monomers shown in Table 5 described below. The polymer compound P3 had a Mn of $1.1 \times 10^5$ and a Mw of $3.1 \times 10^5$. The polymer compound P3 is a copolymer constituted of constitutional units derived from respective monomers at molar ratios shown in Table 5 described below, according to theoretical values calculated from charged raw materials.

TABLE 5

| | monomer | CM8 | CM3 | CM9 |
|---|---|---|---|---|
| polymer compound P3 | molar ratio | 50 | 45 | 5 |

Synthesis Example 5> Synthesis of Polymer Compound P4

A polymer compound P4 was synthesized using monomers shown in Table 6 described below.

(Step 1) An inert gas atmosphere was prepared in a reaction vessel, then, a monomer CM5 (1.9934 g, 4.94 mmol), a monomer CM10 (1.7739 g, 2.60 mmol), a monomer CM11 (1.6200 g, 2.40 mmol), dichlorobis(triso-methoxyphenylphosphine)palladium (8.9 mg) and toluene (105 mL) were added, and the mixture was heated at 105° C.

(Step 2) Into the reaction solution, a 20 wt % tetraethylammonium hydroxide aqueous solution (17.6 g) was dropped, and the mixture was refluxed for 4 hours.

(Step 3) After the reaction, to this were added phenylboronic acid (123 mg) and dichlorobis(triso-methoxyphenylphosphine)palladium (4.4 mg), and the mixture was refluxed for 19 hours.

(Step 4) Thereafter, to this was added a sodium diethyldithiacarbamate aqueous solution, and the mixture was stirred at 80° C. for 2 hours. After cooling, the reaction solution was washed with water twice, with a 3 wt % acetic acid aqueous solution twice, and with water twice, and the resultant solution was dropped into methanol, to observe precipitation. The precipitate was dissolved in toluene, and the solution was purified by passing through an alumina column and a silica gel column in this order. The resultant solution was dropped into methanol, the mixture was stirred, then, the resultant precipitate was isolated by filtration, and dried, thereby obtaining 3.21 g of a polymer compound P4. The polymer compound P4 had a Mn of $8.8 \times 10^4$ and a Mw of $2.3 \times 10^5$.

The polymer compound P4 is a copolymer constituted of constitutional units derived from respective monomers at molar ratios shown in Table 6 described below, according to theoretical values calculated from charged raw materials.

TABLE 6

| | monomer | CM5 | CM10 | CM11 |
|---|---|---|---|---|
| polymer compound P4 | molar ratio | 50 | 26 | 24 |

Comparative Example CD1: Fabrication and Evaluation of Light Emitting Device CD 1

On glass substrate carrying thereon an ITO film having a thickness of 45 nm formed by a sputtering method, a polythiophene.sulfonic acid type hole injecting agent AQ-1200 (manufactured by Plectronics) was spin-coated as a hole injection material to form a film with a thickness of 35 nm, and this was heated on a hot plate at 170° C. for 15 minutes in an air atmosphere.

Next, a xylene solution of a hole transportable polymer compound P1 was spin-coated to form a hole transporting layer with a thickness of 20 nm, and this was heated on a hot plate at 180° C. for 60 minutes in a nitrogen gas atmosphere.

Next, a xylene solution containing a polymer compound P2 and a metal complex MC1 dissolved therein (2.2 wt %, polymer compound P2/metal complex MC1=60 wt %/40 wt %) was spin-coated to form a light emitting layer with a thickness of 80 nm, and this was heated on a hot plate at 150° C. for 10 minutes in a nitrogen gas atmosphere.

Next, as an electron injection layer, sodium fluoride was vapor-deposited with a thickness of about 7 nm, then, as a cathode, aluminum was vapor-deposited with a thickness of about 120 nm. After the degree of vacuum reached $1 \times 10^{-4}$ Pa or lower, vapor-deposition of a metal was initiated.

Next, a sealing layer was formed using a glass substrate under a nitrogen gas atmosphere, to fabricate a light emitting device CD1.

When voltage was applied to the light emitting device CD 1, green EL emission having a maximum peak at 520 nm was obtained. The driving voltage at a current density of 10 mA/cm² was 8.0 V, and the external quantum yield was 11.2%.

Example D1: Fabrication and Evaluation of Light Emitting Device D1

A light emitting device D1 was fabricated in the same manner as in Comparative Example CD1 excepting that a xylene solution containing a polymer compound P2 and a metal complex M1 dissolved therein (1.8 wt %, polymer compound P2/metal complex M1=60 wt %/40 wt %) was used instead of the xylene solution containing a polymer compound P2 and a metal complex MC1 dissolved therein (2.2 wt %, polymer compound P2/metal complex MC1=60 wt %/40 wt %) in Comparative Example CD1.

When voltage was applied to the light emitting device D1, green EL emission having a maximum peak at 520 nm was obtained. The driving voltage at a current density of 10 mA/cm was 7.4 V, and the external quantum yield was 10.6%.

Example D2: Fabrication and Evaluation of Light Emitting Device D2

A light emitting device D2 was fabricated in the same manner as in Comparative Example CD1 excepting that a xylene solution containing a polymer compound P2 and a metal complex M2 dissolved therein (1.8 wt %, polymer compound P2/metal complex M2=60 wt %/40 wt %) was used instead of the xylene solution containing a polymer compound P2 and a metal complex MC1 dissolved therein (2.2 wt %, polymer compound P2/metal complex MC1=60 wt %/40 wt %) in Comparative Example CD1.

When voltage was applied to the light emitting device D2, green EL emission having a maximum peak at 520 nm was obtained. The driving voltage at a current density of 10 mA/cm² was 7.1 V, and the external quantum yield was 11.6%.

Example D3: Fabrication and Evaluation of Light Emitting Device D3

A light emitting device D3 was fabricated in the same manner as in Comparative Example CD1 excepting that a xylene solution containing a polymer compound P2 and a metal complex M3 dissolved therein (2.2 wt %, polymer compound P2/metal complex M3=60 wt %/40 wt %) was used instead of the xylene solution containing a polymer compound P2 and a metal complex MC1 dissolved therein (2.2 wt %, polymer compound P2/metal complex MC1=60 wt %/40 wt %) in Comparative Example CD1.

When voltage was applied to the light emitting device D3, green EL emission having a maximum peak at 515 nm was obtained. The driving voltage at a current density of 10 mA/cm² was 6.9 V, and the external quantum yield was 11.4%.

Example D4: Fabrication and Evaluation of Light Emitting Device D4

A light emitting device D4 was fabricated in the same manner as in Comparative Example CD1 excepting that a xylene solution containing a polymer compound P2 and a metal complex M4 dissolved therein (2.2 wt %, polymer compound P2/metal complex M4=60 wt %/40 wt %) was used instead of the xylene solution containing a polymer compound P2 and a metal complex MC1 dissolved therein (2.2 wt %, polymer compound P2/metal complex MC1=60 wt %/40 wt %) in Comparative Example CD1.

When voltage was applied to the light emitting device D4, green EL emission having a maximum peak at 520 nm was obtained. The driving voltage at a current density of 10 mA/cm² was 6.5 V, and the external quantum yield was 4.9%.

Example D5: Fabrication and Evaluation of Light Emitting Device D5

A light emitting device D5 was fabricated in the same manner as in Comparative Example CD1 excepting that a xylene solution containing a polymer compound P3 and a metal complex M5 dissolved therein (1.6 wt %, polymer compound P3/metal complex MS=60 wt %/40 wt %) was used instead of the xylene solution containing a polymer compound P2 and a metal complex MC1 dissolved therein (2.2 wt %, polymer compound P2/metal complex MC1=60 wt %/40 wt %) in Comparative Example CD1.

When voltage was applied to the light emitting device D5, red EL emission having a maximum peak at 620 nm was obtained. The driving voltage at a current density of 10 mA/cm² was 8.7 V, and the external quantum yield was 7.8%.

Comparative Example CD2: Fabrication and Evaluation of Light Emitting Device CD 2

A light emitting device CD2 was fabricated in the same manner as in Comparative Example CD1 excepting that a xylene solution containing a polymer compound P4 and a metal complex MC2 dissolved therein (1.8 wt %, polymer compound P4/metal complex MC2=60 wt %/40 wt %) was used instead of the xylene solution containing a polymer compound P2 and a metal complex MC1 dissolved therein (2.2 wt %, polymer compound P2/metal complex MC1=60 wt %/40 wt %) in Comparative Example CD1.

When voltage was applied to the light emitting device CD2, blue EL emission having a maximum peak at 475 nm was obtained. The driving voltage at a current density of 10 mA/cm² was 6.1 V, and the external quantum yield was 6.0%.

Example D6: Fabrication and Evaluation of Light Emitting Device D6

A light emitting device D6 was fabricated in the same manner as in Comparative Example CD1 excepting that a xylene solution containing a polymer compound P4 and a metal complex M6 dissolved therein (1.6 wt %, polymer compound P4/metal complex M6=60 wt %/40 wt %) was used instead of the xylene solution containing a polymer compound P2 and a metal complex MC1 dissolved therein (2.2 wt %, polymer compound P2/metal complex MC1=60 wt %/40 wt %) in Comparative Example CD1.

When voltage was applied to the light emitting device D6, blue EL emission having a maximum peak at 475 nm was obtained. The driving voltage at a current density of 10 mA/cm² was 5.1 V, and the external quantum yield was 3.7%.

TABLE 7

| light emitting device | light emitting layer | emission color | driving voltage (V) (10 mA/cm$^2$) |
|---|---|---|---|
| CD1 (comparative example) | polymer compound P2 (60 wt %) + metal complex MC1 (40 wt %) | green | 8.0 |
| D1 (example) | polymer compound P2 (60 wt %) + metal complex M1 (40 wt %) | green | 7.4 |
| D2 (example) | polymer compound P2 (60 wt %) + metal complex M2 (40 wt %) | green | 7.1 |
| D3 (example) | polymer compound P2 (60 wt %) + metal complex M3 (40 wt %) | green | 6.9 |
| D4 (example) | polymer compound P2 (60 wt %) + metal complex M4 (40 wt %) | green | 6.5 |
| D5 (example) | polymer compound P3 (60 wt %) + metal complex M5 (40 wt %) | red | 8.7 |
| CD2 (comparative example) | polymer compound P4 (60 wt %) + metal complex MC2 (40 wt %) | blue | 6.1 |
| D6 (example) | polymer compound P4 (60 wt %) + metal complex M6 (40 wt %) | blue | 5.1 |

INDUSTRIAL APPLICABILITY

The metal complex of the present invention is useful for production of a light emitting device excellent in driving voltage and the like.

The invention claimed is:

1. A metal complex represented by the following formula (1-b):

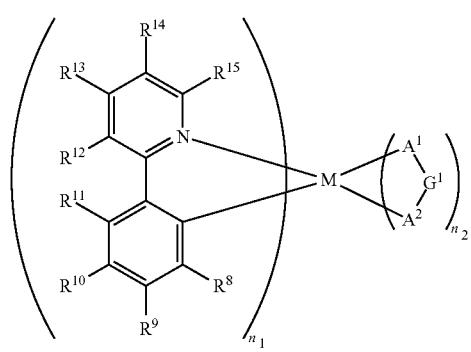

in the formula (1-b),

M represents an iridium atom, $n_1$ represents 3, $n_2$ represents 0, $A^1$-$G^1$-$A^2$ is not present, $R^8$, $R^9$, $R^{10}$ and $R^{11}$ each independently represent a hydrogen atom, an alkyl group, an aryl group or a monovalent heterocyclic group and these groups each optionally have a substituent, and the plurality of $R^8$, $R^9$, $R^{10}$ and $R^{11}$ may be the same or different at each occurrence, $R^{11}$ and $R^{10}$ may be combined to form a ring together with the carbon atoms to which they are attached, $R^{10}$ and $R^9$ may be combined to form a ring together with the carbon atoms to which they are attached, and $R^9$ and $R^8$ may be combined to form a ring together with the carbon atoms to which they are attached, $R^{12}$, $R^{13}$, $R^{14}$ and $R^{15}$ each independently represent a hydrogen atom, an alkyl group, an aryl group or a monovalent heterocyclic group and these groups each optionally have a substituent, and the plurality of $R^{12}$, $R^{13}$, $R^{14}$ and $R^{15}$ may be the same or different at each occurrence, and $R^{11}$ and $R^{12}$ may be combined to form a ring together with the carbon atoms to which they are attached, $R^{12}$ and $R^{13}$ may be combined to form a ring together with the carbon atoms to which they are attached, $R^{13}$ and $R^{14}$ may be combined to form a ring together with the carbon atoms to which they are attached, and $R^{14}$ and $R^{15}$ may be combined to form a ring together with the carbon atoms to which they are attached, and at least one of $R^{10}$ and $R^{14}$ is a group represented by the formula (2-1):

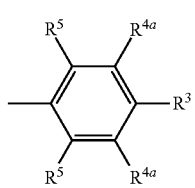

(2-1)

in the formula (2-1), $R^3$ represents an alkyl group and this group optionally has a substituent, $R^5$ represents a hydrogen atom or an alkyl group and this alkyl group optionally has a substituent, and the plurality of $R^5$ may be the same or different, and $R^{4a}$ represents an aryl group having no substituent or an aryl group having an alkyl group or a cycloalkyl group as a substituent and the alkyl group and the cycloalkyl group each optionally further have a substituent, and the plurality of $R^{4a}$ may be the same or different.

2. The metal complex according to claim 1, wherein the group represented by the formula (2-1) is a group represented by the following formula (2-3):

(2-3)

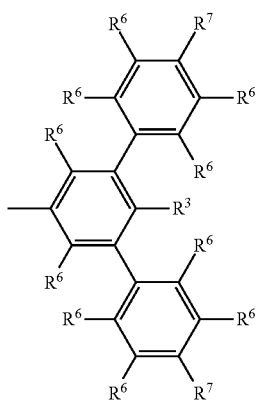

in the formula (2-3), $R^3$ represents the same meaning as described above, $R^5$ represents a hydrogen atom or an alkyl group and this alkyl group optionally has a substituent, and the plurality of $R^5$ may be the same or different, $R^6$ represents a hydrogen atom, an alkyl group or a cycloalkyl group and these groups each optionally have a substituent, and the plurality of $R^6$ may be the same or different, and $R^7$ represents a hydrogen atom, an alkyl group or a cycloalkyl group and these groups each optionally have a substituent, and the plurality of $R^7$ may be the same or different.

3. A metal complex represented by the following formula (1-c):

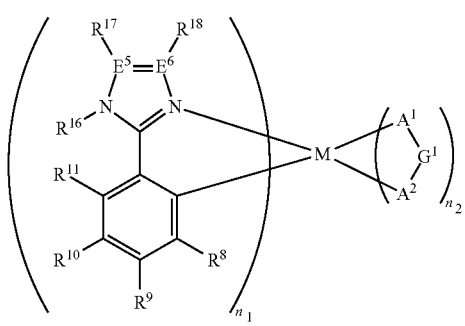

(1-c)

in the formula (1-c),

M represents an iridium atom or a platinum atom, $n_1$ represents 1, 2 or 3, $n_2$ represents 0, 1 or 2, and $n_1+n_2=3$ when M is an iridium atom, while $n_1+n_2=2$ when M is a platinum atom, $A^1$-$G^1$-$A^2$ represents an anionic bidentate ligand, $G^1$ represents an atomic group constituting a bidentate ligand together with $A^1$ and $A^2$, $A^1$ and $A^2$ each independently represent a carbon atom, an oxygen atom or a nitrogen atom and these atoms each may be an atom constituting a ring, and a plurality of $A^1$-$G^1$-$A^2$ which are present when $n_2$ is 2 may be the same or different, $R^8$, $R^9$ and $R^{11}$ each independently represent a hydrogen atom, an alkyl group, a cycloalkyl group, an alkoxy group, a cycloalkoxy group, an aryl group, an aryloxy group, a monovalent heterocyclic group or a halogen atom and these groups each optionally have a substituent, and a plurality of $R^8$, $R^9$ and $R^{11}$ which are present when $n_1$ is 2 or 3 may be the same or different at each occurrence, and $R^9$ and $R^8$ may be combined to form a ring together with the carbon atoms to which they are attached, $R^{10}$ represents a group represented by the formula (2-1), and a plurality of $R^{10}$ which are present when $n_1$ is 2 or 3 may be the same or different, $E^5$ and $E^6$ each independently represent a nitrogen atom or a carbon atom, and a plurality of $E^5$ and $E^6$ which are present when $n_1$ is 2 or 3 may be the same or different at each occurrence, and $R^{17}$ is not present when $E^5$ is a nitrogen atom, and $R^{18}$ is not present when $E^6$ is a nitrogen atom, $R^{16}$, $R^{17}$ and $R^{18}$ each independently represent a hydrogen atom, an alkyl group, a cycloalkyl group, an alkoxy group, a cycloalkoxy group, an aryl group, an aryloxy group, a monovalent heterocyclic group or a halogen atom and these groups each optionally have a substituent, and a plurality of $R^{16}$, $R^{17}$ and $R^{18}$ which are present when $n_1$ is 2 or 3 may be the same or different at each occurrence, and $R^{11}$ and $R^{16}$ may be combined to form a ring together with the carbon atom to which $R^{11}$ is attached and the nitrogen atom to which $R^{16}$ is attached, $R^{16}$ and $R^{17}$ may be combined to form a ring together with the nitrogen atom to which $R^{16}$ is attached and the carbon atom to which $R^{17}$ is attached, and $R^{17}$ and $R^{18}$ may be combined to form a ring together with the carbon atoms to which they are attached:

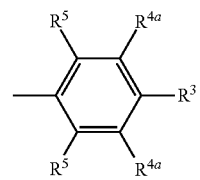

(2-1)

in the formula (2-1), $R^3$ represents an alkyl group and this group optionally has a substituent, $R^5$ represents a hydrogen atom, an alkyl group, a cycloalkyl group, an aryl group or a monovalent heterocyclic group and these groups each optionally have a substituent, and the plurality of $R^5$ may be the same or different, and $R^{4a}$ represents an aryl group having no substituent or an aryl group having an alkyl group or a cycloalkyl group as a substituent and the alkyl group and the cycloalkyl group each optionally further have a substituent, and the plurality of $R^{4a}$ may be the same or different.

4. A composition comprising
the metal complex according to claim 1, and
a polymer compound comprising a constitutional unit represented by the following formula (Y):

$$+Ar^{Y1}+ \quad (Y)$$

in the formula (Y), $Ar^{Y1}$ represents an arylene group, a divalent heterocyclic group or a divalent group in which at least one arylene group and at least one divalent heterocyclic group are bonded directly to each other, and these groups each optionally have a substituent.

5. A composition comprising the metal complex according to claim 1, and at least one material selected from the group consisting of a hole transporting material, a hole injection material, an electron transporting material, an electron injection material, a light emitting material, an antioxidant and a solvent.

6. A light emitting device comprising the metal complex according to claim 1.

* * * * *